(12) United States Patent
Chen et al.

(10) Patent No.: US 11,088,131 B2
(45) Date of Patent: Aug. 10, 2021

(54) SEMICONDUCTOR DEVICE THAT USES BONDING LAYER TO JOIN SEMICONDUCTOR SUBSTRATES TOGETHER

(71) Applicant: Taiwan Semiconductor Manufacturing Co., Ltd., Hsinchu (TW)

(72) Inventors: Ming-Fa Chen, Taichung (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/915,064

(22) Filed: Jun. 29, 2020

(65) Prior Publication Data

US 2020/0328200 A1 Oct. 15, 2020

Related U.S. Application Data

(63) Continuation of application No. 16/025,331, filed on Jul. 2, 2018, now Pat. No. 10,727,217.

(Continued)

(51) Int. Cl.
*H01L 25/07* (2006.01)
*H01L 25/00* (2006.01)
(Continued)

(52) U.S. Cl.
CPC .......... *H01L 25/50* (2013.01); *H01L 21/4857* (2013.01); *H01L 21/76898* (2013.01); *H01L 23/522* (2013.01); *H01L 23/5389* (2013.01); *H01L 24/19* (2013.01); *H01L 24/20* (2013.01); *H01L 24/27* (2013.01); *H01L 24/83* (2013.01); *H01L 24/94* (2013.01); *H01L 25/074* (2013.01); *H01L 23/3128* (2013.01); *H01L 2021/60015* (2013.01); *H01L 2224/04105* (2013.01); *H01L 2224/12105* (2013.01); *H01L 2224/16145* (2013.01); *H01L 2224/16265* (2013.01);
(Continued)

(58) Field of Classification Search
CPC ....... H01L 21/4857; H01L 2021/60015; H01L 23/522; H01L 24/27; H01L 24/83; H01L 25/074; H01L 25/50; H01L 2224/27848; H01L 2224/83191; H01L 2224/83498; H01L 2225/06524
See application file for complete search history.

(56) References Cited

U.S. PATENT DOCUMENTS 8,361,842 B2 1/2013 Yu et al.
8,680,647 B2 3/2014 Yu et al.
(Continued)

FOREIGN PATENT DOCUMENTS

CN 102971851 A 3/2013
JP 2012216776 A 11/2012
(Continued)

*Primary Examiner* — Stephen W Smoot
(74) *Attorney, Agent, or Firm* — Slater Matsil, LLP

(57) ABSTRACT

Semiconductor devices are provided in which a first semiconductor device is bonded to a second semiconductor device. The bonding may occur at a gate level, a gate contact level, a first metallization layer, a middle metallization layer, or a top metallization layer of either the first semiconductor device or the second semiconductor device.

20 Claims, 61 Drawing Sheets

Related U.S. Application Data

(60) Provisional application No. 62/565,557, filed on Sep. 29, 2017.

(51) Int. Cl.
*H01L 21/48* (2006.01)
*H01L 23/00* (2006.01)
*H01L 21/768* (2006.01)
*H01L 23/538* (2006.01)
*H01L 23/522* (2006.01)
*H01L 23/31* (2006.01)
*H01L 21/60* (2006.01)

(52) U.S. Cl.
CPC .............. *H01L 2224/214* (2013.01); *H01L 2224/27848* (2013.01); *H01L 2224/73209* (2013.01); *H01L 2224/73259* (2013.01); *H01L 2224/83191* (2013.01); *H01L 2224/92124* (2013.01); *H01L 2224/92224* (2013.01); *H01L 2224/94* (2013.01); *H01L 2225/06513* (2013.01); *H01L 2225/06517* (2013.01); *H01L 2225/06524* (2013.01); *H01L 2225/06541* (2013.01); *H01L 2924/1032* (2013.01); *H01L 2924/19104* (2013.01)

(56) References Cited

U.S. PATENT DOCUMENTS

| | | | |
|---|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,166,090 B2 | 10/2015 | Shimotsusa |
| 9,524,959 B1 | 12/2016 | Yeh et al. |
| 2007/0207592 A1 | 9/2007 | Lu et al. |
| 2010/0038802 A1 | 2/2010 | Chen et al. |
| 2010/0238331 A1 | 9/2010 | Umebayashi et al. |
| 2011/0157445 A1 | 6/2011 | Itonaga et al. |
| 2011/0193197 A1 | 8/2011 | Farooq et al. |
| 2011/0291288 A1 | 12/2011 | Wu et al. |
| 2012/0056288 A1 | 3/2012 | Yoshihara et al. |
| 2012/0248544 A1 | 10/2012 | Yokoyama |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0270711 A1 | 10/2013 | Hebding et al. |
| 2013/0307140 A1 | 11/2013 | Huang et al. |
| 2014/0042299 A1 | 2/2014 | Wan et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0021789 A1 | 1/2015 | Lin |
| 2015/0318263 A1 | 11/2015 | Yu et al. |
| 2016/0197055 A1 | 7/2016 | Yu et al. |
| 2017/0092626 A1* | 3/2017 | Yuan ............... H01L 21/768 |

FOREIGN PATENT DOCUMENTS

| | | |
|---|---|---|
| KR | 20100105380 A | 9/2010 |
| KR | 20150125582 A | 11/2015 |

\* cited by examiner

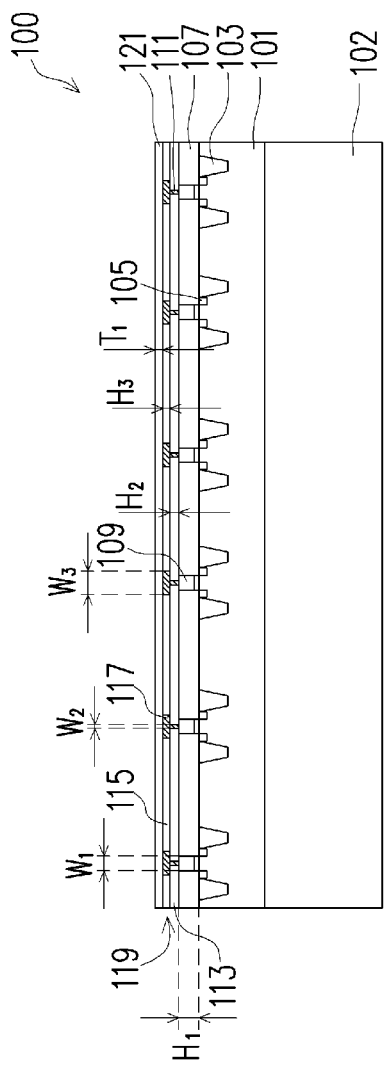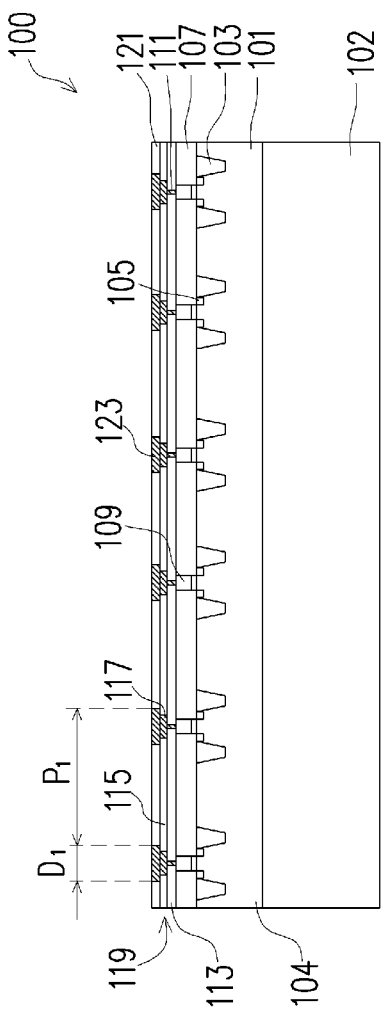
FIG. 1A
FIG. 1B

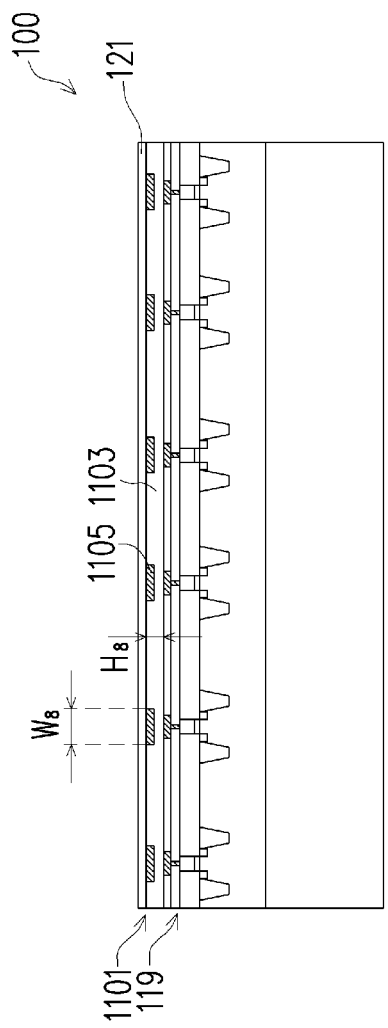
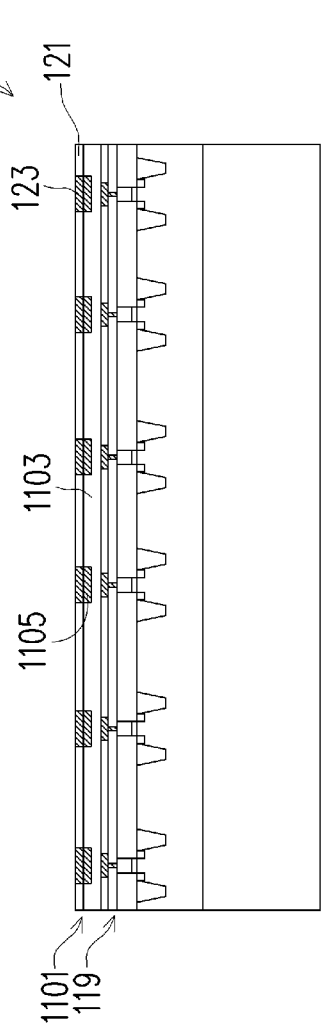
FIG. 11A
FIG. 11B

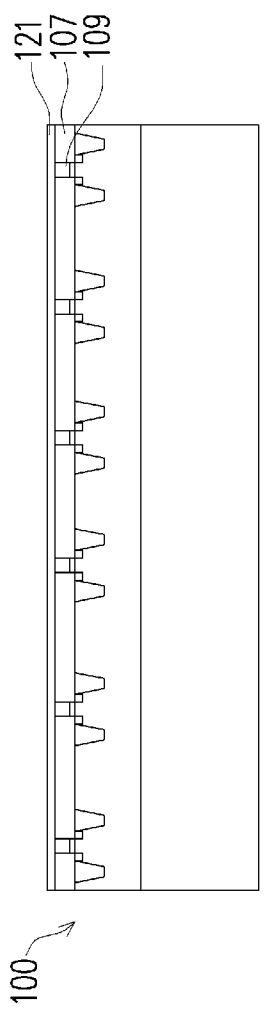
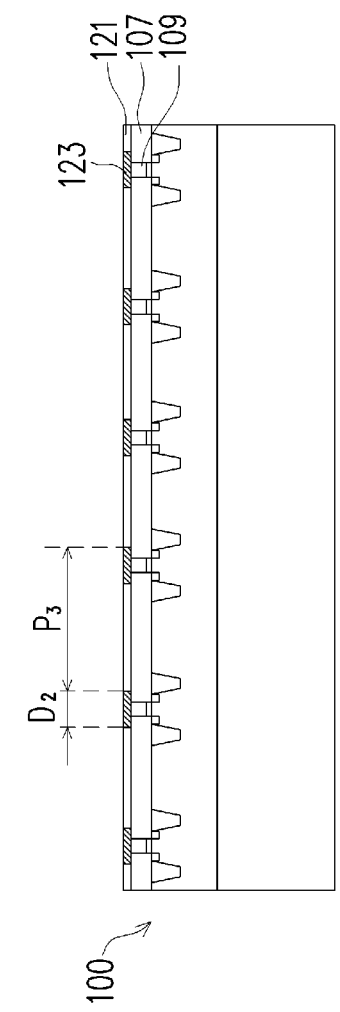
FIG. 14A
FIG. 14B

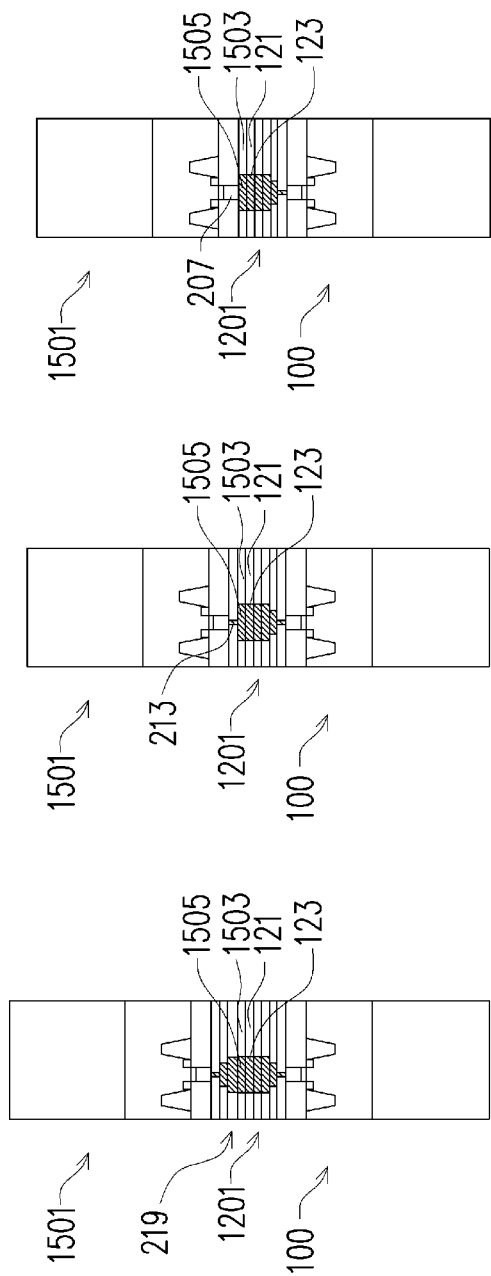

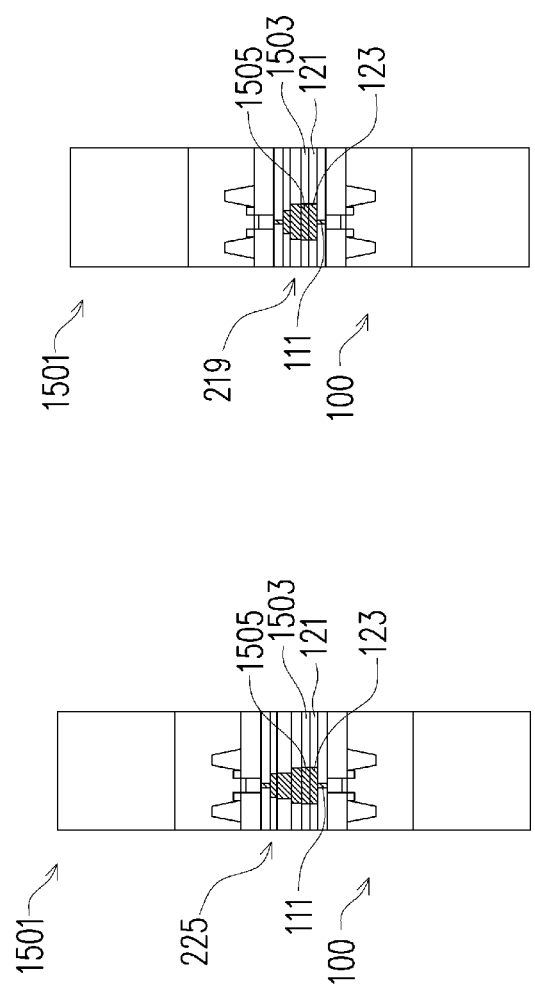

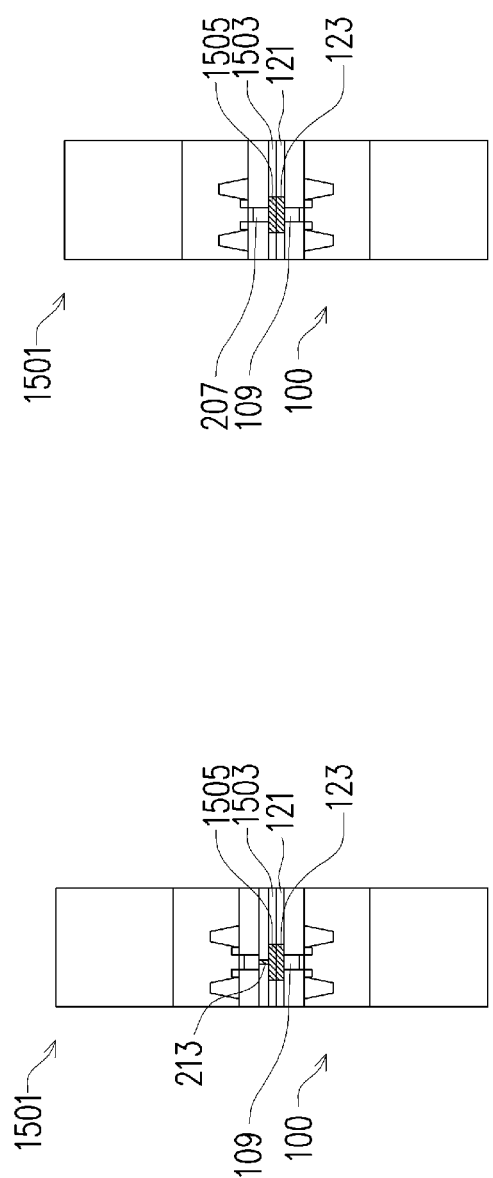

SEMICONDUCTOR DEVICE THAT USES BONDING LAYER TO JOIN SEMICONDUCTOR SUBSTRATES TOGETHER

PRIORITY CLAIM AND CROSS-REFERENCE

This application is a continuation of U.S. patent application Ser. No. 16/025,331, filed on Jul. 2, 2018, entitled "Method of Manufacturing Semiconductor Device That Uses Bonding Layer to Join Semiconductor Substrates Together," which issued as U.S. Pat. No. 10,727,217, which claims the benefit of U.S. Provisional Application Serial No. 62/565,557, filed on Sep. 29, 2017, entitled "Semiconductor Device with Stacked Semiconductor Dies and Method of Manufacture," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1B illustrate a formation of a first bonding layer in accordance with some embodiments.

FIGS. 11A-11H illustrate bonding locations of a middle wafer metallization layer in accordance with some embodiments.

FIGS. 14A-14H illustrate bonding locations of a first wafer gate stack in accordance with some embodiments.

FIGS. 17A-17G illustrate wafer to wafer bonding locations of a top wafer metallization layer in accordance with some embodiments.

FIGS. 18A-18H illustrate wafer to wafer bonding locations of a first wafer gate contact in accordance with some embodiments.

FIGS. 19A-19H illustrate wafer to wafer bonding locations of a first wafer gate stack in accordance with some embodiments.

DETAILED DESCRIPTION

Figure 2:
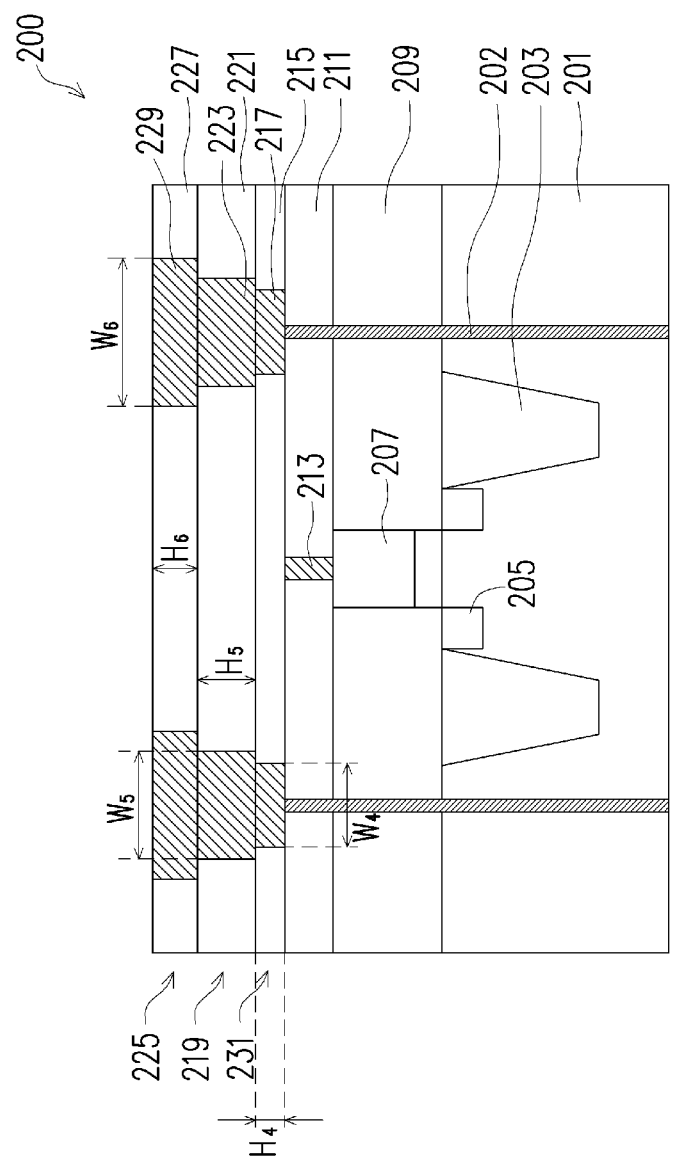
FIG. 2 illustrates a second semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to bonding semiconductor devices to other semiconductor devices to form a system on chip in a system on chip configuration. However, embodiments can be utilized in a wide variety of devices and methods of manufacture.

With respect now to FIG. 1A, there is illustrated a first semiconductor device 100, which may be an un-finished wafer, with a first wafer substrate 101 and active devices located at least partially within the first wafer substrate 101. In an embodiment the first wafer substrate 101 may be a silicon substrate, although other substrates, such as semiconductor-on-insulator (SOI), strained SOI, and silicon germanium on insulator, could be used. The first wafer substrate 101 may be a p-type semiconductor, although in other embodiments, it could be an n-type semiconductor.

The first wafer substrate 101 may comprise a bulk region 102 which provides physical and structural support for the manufacturing process. Additionally, the first wafer substrate 101 also comprises an active region 104 which will be utilized to form active and passive devices. However, any suitable regions may also be utilized.

First trenches may be formed as an initial step in the eventual formation of first wafer isolation regions 103 (not separately illustrated in the view of FIG. 1A). The first trenches may be formed using a masking layer along with a suitable etching process. Once the masking layer has been formed and patterned, the first trenches are formed in the first wafer substrate 101. The exposed first wafer substrate 101 may be removed through a suitable process such as reactive ion etching (RIE) in order to form the first trenches in the first wafer substrate 101, although any suitable process may be used. In an embodiment, the first trenches may be formed to have a first depth of less than about 5,000 Å from the surface of the first wafer substrate 101, such as about 2,500 Å.

In addition to forming the first trenches, the masking and etching process additionally forms fins (not illustrated as being separate from the first wafer substrate 101) from those portions of the first wafer substrate 101 that remain unremoved. These fins may be used, as discussed below, to form the channel region of multiple-gate FinFET transistors.

Once the first trenches and the fins have been formed, some or all of the first trenches may be filled with a dielectric material and the dielectric material may be recessed within the first trenches to form the first isolation regions (although the recessing is not seen in the cross-sectional view of FIG. 1A). The dielectric material may be an oxide material, a high-density plasma (HDP) oxide, or the like. The dielectric material may be formed, after an optional cleaning and lining of the first trenches, using either a chemical vapor deposition (CVD) method (e.g., the HARP process), a high density plasma CVD method, or other suitable method of formation as is known in the art.

The first trenches may be filled by overfilling the first trenches and the first wafer substrate 101 with the dielectric material and then removing the excess material outside of the first trenches and the fins through a suitable process such as chemical mechanical polishing (CMP), an etch, a combination of these, or the like. In an embodiment, the removal process removes any dielectric material that is located over the fins as well, so that the removal of the dielectric material will expose the surface of the fins to further processing steps.

Once the first trenches have been filled with the dielectric material, the dielectric material may then be recessed away from the surface of the fins to form the first wafer isolation regions 103. The recessing may be performed to expose at least a portion of the sidewalls of the fins adjacent to the top surface of the fins. The dielectric material may be recessed using a wet etch by dipping the top surface of the fins into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins of between about 50 Å and about 500 Å, such as about 400 Å. Additionally, the recessing may also remove any leftover dielectric material located over the fins to ensure that the fins are exposed for further processing.

After the first isolation regions have been formed, a dummy gate dielectric, a dummy gate electrode over the dummy gate dielectric (both of which are not illustrated in FIG. 1A due to further processing), and first spacers (also not illustrated for clarity) may be formed over each of the fins. In an embodiment the dummy gate dielectric may be formed by thermal oxidation, chemical vapor deposition, sputtering, or any other methods known and used in the art for forming a gate dielectric and may be formed of a material such as silicon dioxide or silicon oxynitride.

The dummy gate electrode may comprise a conductive material and may be selected from a group comprising of polysilicon, W, Al, Cu, AlCu, W, Ti, TiAlN, TaC, TaCN, TaSiN, Mn, Zr, TiN, Ta, TaN, Co, Ni, combinations of these, or the like, and may be formed using a process such as chemical vapor deposition (CVD), sputter deposition, or other techniques known and used in the art for depositing conductive materials. The top surface of the dummy gate electrode may have a non-planar top surface, and may be planarized prior to patterning of the dummy gate electrode or gate etch.

Once formed, the dummy gate dielectric and the dummy gate electrode may be patterned to form a series of stacks over the fins. The stacks define multiple channel regions located on each side of the fins beneath the dummy gate dielectric. The stacks may be formed by depositing and patterning a gate mask (not separately illustrated in FIG. 1A) on the dummy gate electrode using, for example, deposition and photolithography techniques known in the art. The dummy gate electrode and the dummy gate dielectric may be etched using a dry etching process to form the patterned stacks.

Once the stacks have been patterned, the first spacers may be formed. The first spacers may be formed on opposing sides of the stacks. The first spacers are typically formed by blanket depositing a spacer layer on the previously formed structure. The spacer layer may comprise SiN, oxynitride, SiC, SiON, SiOCN, SiOC, oxide, SiOCN (KN1), SiOCN (RP1), SiOCN (RP2), SiOC (HA2), SiOC (HA3), combinations of these, or the like. The first spacers may be deposited using a deposition process such as plasma enhanced atomic layer deposition (PEALD), thermal atomic layer deposition (thermal ALD), plasma enhanced chemical vapor deposition (PECVD), and formation may be followed by a curing process. However, any suitable deposition and process conditions may be utilized. The first spacers may then be patterned, such as by one or more etches to remove the spacer layer from the horizontal surfaces of the structure, to form the first spacers.

Once the first spacers have been formed, portions of the fins not protected by the dummy gate dielectric, the dummy gate electrode and the first spacers are removed and first wafer source/drain regions 105 are regrown. The removal of the fins from those areas not protected by the dummy gate dielectric, the dummy gate electrode and the first spacers may be performed by a reactive ion etch (RIE) using the stacks and the first spacers as hardmasks, or by any other suitable removal process.

Once these portions of the fins have been removed, a hard mask (not separately illustrated), is placed and patterned to cover the dummy gate electrode to prevent growth and the first wafer source/drain regions 105 may be regrown in contact with each of the fins. In an embodiment the first wafer source/drain regions 105 may be regrown and, in some embodiments the first wafer source/drain regions 105 may be regrown to form a stressor that will impart a stress to the channel regions of the fins located underneath the stacks. In an embodiment wherein the fins comprise silicon and the FinFET is a p-type device, the first wafer source/drain regions 105 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

Once the first wafer source/drain regions 105 are formed, dopants may be implanted into the first wafer source/drain regions 105 by implanting appropriate dopants to complement the dopants in the fins. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks and the first spacers as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Once the first wafer source/drain regions 105 have been formed, a first wafer inter-layer dielectric (ILD) layer 107 is formed over the stacks and the first wafer source/drain regions 105. The first wafer ILD layer 107 may comprise a material such as boron phosphorous silicate glass (BPSG), although any suitable dielectrics may be used. The first wafer ILD layer 107 may be formed using a process such as PECVD, although other processes, such as LPCVD, may alternatively be used. The first wafer ILD layer 107 may be formed to a thickness of between about 100 Å and about 3,000 Å. Once formed, the first wafer ILD layer 107 may be planarized using, e.g., a chemical mechanical polishing process or patterned using, e.g., a masking and etching process in order to expose the material of the dummy gate electrode.

Once the first wafer ILD layer 107 is formed, a removal and replacement of the material of the dummy gate electrode and the dummy gate dielectric is performed. In an embodiment the dummy gate electrode and the dummy gate dielectric may be removed using, e.g., a wet or dry etching process that utilizes etchants that are selective to the material of the dummy gate electrode and the dummy gate dielectric. However, any suitable removal process may be utilized.

After the first wafer ILD layer 107 is formed, a plurality of layers for a gate stack (collectively labeled as first wafer gate stack 109 in FIG. 1A) are deposited in their stead, including a first dielectric material, a first conductive layer, a first metal material, a work function layer, and a first barrier layer. In an embodiment the first dielectric material is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material may be deposited to a thickness of between about 5 Å and about 200 Å, although any suitable material and thickness may be utilized.

The first conductive layer may be a metal silicide material such as titanium silicon nitride (TSN). In an embodiment the first conductive layer may be formed using a deposition process such as chemical vapor deposition, although any suitable method of deposition, such as a deposition and subsequent silicidation, may be utilized to a thickness of between about 5 Å and about 30 Å. However, any suitable thickness may be utilized.

The first metal material may be formed adjacent to the first dielectric material as a barrier layer and may be formed from a metallic material such as TaN, Ti, TiAlN, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material may be deposited using a deposition process such as atomic layer deposition, chemical vapor deposition, sputtering, or the like, to a thickness of between about 5 Å and about 200 Å, although any suitable deposition process or thickness may be used.

The work function layer is formed over the first metal material, and the material for the work function layer may be chosen based upon the type of device desired. Exemplary p-type work function metals that may be included include Al, TiAlC, TiN, TaN, Ru, Mo, WN, $ZrSi_2$, $MoSi_2$, $TaSi_2$, $NiSi_2$, WN, other suitable p-type work function materials, or combinations thereof. Exemplary n-type work function metals that may be included include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a desired threshold voltage Vt is achieved in the device that is to be formed in the respective region. The work function layer(s) may be deposited by CVD, PVD, and/or other suitable process to a thickness of between about 5 Å and about 50 Å.

The first barrier layer may be formed adjacent to the work function layer and, in a particular embodiment, may be similar to the first metal material. For example, the first barrier layer may be formed from a metallic material such as TiN, Ti, TiAlN, TaC, TaCN, TaSiN, Mn, Zr, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the first barrier layer may be deposited using a deposition process such as atomic layer deposition, chemical vapor deposition, sputtering, or the like, to a thickness of between about 5 Å and about 200 Å, although any suitable deposition process or thickness may be used.

A metal layer may be deposited on the work function layer and may be a material that is both suitable for use as a seed layer to help a subsequent filling process as well as a material that can be used to help block or reduce the transport of fluorine atoms into the work function layer. In a particular embodiment, the metal layer may be crystalline tungsten (W) that is formed free from the presence of fluorine atoms using, e.g., an atomic layer deposition process, although any suitable deposition process may be utilized. The metal layer may be formed to a thickness of between about 20 Å and about 50 Å, such as between about 30 Å and about 40 Å.

Once the metal layer has been formed, a fill material is deposited to fill a remainder of the opening. In an embodiment the fill material may be a material such as Al, Cu, AlCu, W, Ti, TiAlN, TaC, TaCN, TaSiN, Mn, Zr, TiN, Ta, TaN, Co, Ni, combinations of these, or the like, to a thickness of between about 1000 Å and about 2000 Å, such as about 1500 Å. However, any suitable material may be utilized.

FIG. 1A additionally illustrates that, after the fill material has been deposited to fill and overfill the opening, the materials of the first dielectric material, first conductive layer, first metal material, work function layer, first barrier layer, metal layer, and fill material may be planarized to form the first wafer gate stack 109. In an embodiment the materials may be planarized with the first wafer ILD layer 107 using, e.g., a chemical mechanical polishing process, although any suitable process, such as grinding or etching, may be utilized.

In an embodiment the first wafer gate stack 109 may be formed to have a first width $W_1$ of between about 1 nm and about 180 nm, such as about 7 nm. Additionally, the first wafer gate stack 109 may also be formed to have a first height $H_1$ of between about 20 nm and about 100 nm, such as about 30 nm. However, any suitable dimensions may be utilized.

FIG. 1A additionally illustrates the formation of a first wafer gate contact 111 to make electrical contact to the first wafer gate stack 109 (and one or more of the individual elements within the first wafer gate stack 109) through a first wafer dielectric layer 113. In an embodiment the first wafer dielectric layer 113 may be formed, for example, of low-k dielectric materials with dielectric constants (k value) between about 2.9 and 3.8, ultra low-k (ULK) dielectric materials with k values less than about 2.5, extra low-k (ELK) dielectric materials with k values between about 2.5 and about 2.9, some combination of low-k dielectric materials, or the like. The first wafer dielectric layer 113 may be formed using a process such as spin-on, CVD, ALD, combinations of these, or the like. However, any suitable material or method of manufacture may be utilized.

Once the first wafer dielectric layer 113 has been formed over the first wafer gate stack 109, the first wafer dielectric layer 113 may be patterned to expose at least a portion of one or more layers of the first wafer gate stack 109. In an embodiment the first wafer dielectric layer 113 may be patterned using, e.g., a photolithographic masking and etching process, whereby a photosensitive material is deposited, exposed to a patterned energy source (e.g., light), and developed to form a mask. Once the mask is ready, an anisotropic etch such as a reactive ion etch is utilized to transfer the pattern of the mask to the underlying first wafer dielectric layer 113 and expose portions of the one or more layers of the first wafer gate stack 109. However, any suitable method may be utilized to pattern the first wafer dielectric layer 113.

Once an opening has been formed through the first wafer dielectric layer 113, the opening may be filled with a conductive material to form the first wafer gate contact 111. In an embodiment the first wafer gate contact 111 may be a conductive material such as Ti, W, TiAlN, TaC, TaCN, TaSiN, Mn, Zr, TiN, TaN, Ru, Mo, or WN, although any suitable material, such as aluminum, copper, alloys of these, combinations of these, or the like, may be used and may be deposited into the opening using a deposition process such as sputtering, chemical vapor deposition, electroplating, electroless plating, or the like, to fill and/or overfill the opening formed by the patterning of the first wafer dielectric layer 113. Once filled or overfilled, any deposited material outside of the opening formed by the patterning of the first wafer dielectric layer 113 may be removed using a planarization process such as chemical mechanical polishing (CMP). However, any suitable material and process of formation may be utilized.

In an embodiment the first wafer gate contact 111 may be formed to have a second width $W_2$ of between about 1 nm and about 180 nm, such as about 5 nm. Additionally, the first wafer gate contact 111 may be formed to have a second height $H_2$ of between about 1 nm and about 1000 nm, such as about 5 nm. However, any suitable dimensions may be utilized.

After the first wafer gate contact 111 has been formed, a second wafer dielectric layer 115 and a first wafer metal line 117 within the second wafer dielectric layer 115 may be formed to collectively create a first wafer interconnection structure 119 (also known as an $M_1$ metal layer). In an embodiment the second wafer dielectric layer 115 may be formed, for example, of low-k dielectric materials with dielectric constants (k value) between about 2.9 and 3.8, ultra low-k (ULK) dielectric materials with k values less than about 2.5, extra low-k (ELK) dielectric materials with k values between about 2.5 and about 2.9, some combination of low-k dielectric materials, or the like. The second wafer dielectric layer 115 may be formed using a process such as spin-on, CVD, ALD, combinations of these, or the like. However, any suitable material or method of manufacture may be utilized.

Once the second wafer dielectric layer 115 has been formed over the first wafer dielectric layer 113 and the first wafer gate contact 111, the second wafer dielectric layer 115 may be patterned to form the desired pattern for the first wafer metal lines 117. In an embodiment the second wafer dielectric layer 115 may be patterned using, e.g., a photolithographic masking and etching process, whereby a photosensitive material is deposited, exposed to a patterned energy source (e.g., light), and developed to form a mask. Once the mask is ready, an anisotropic etch such as a reactive ion etch is utilized to transfer the pattern of the mask to the underlying second wafer dielectric layer 115. However, any suitable method may be utilized to pattern the second wafer dielectric layer 115.

Once an opening has been formed through the second wafer dielectric layer 115, the opening may be filled with a conductive material to form the first wafer metal lines 117. In an embodiment the first wafer metal lines 117 may be a conductive material such as copper deposited by first depositing a seed layer and then using an electroplating or electroless plating process to fill and/or overfill the opening through the second wafer dielectric layer 115. Once the openings have been filled and/or overfilled, any deposited material outside of the opening formed by the patterning of the second wafer dielectric layer 115 may be removed using a planarization process such as chemical mechanical polishing (CMP). However, any suitable material and process of formation may be utilized.

In an embodiment the first wafer metal lines 117 may be formed to have a third width $W_3$ of between about 1 nm and about 1000 nm, such as about 7 nm. Additionally, the first wafer interconnection structure 119 may be formed to have a third height $H_3$ of between about 1 nm and about 1000 nm, such as about 5 nm. However, any suitable dimensions may be utilized.

Additionally, while the first wafer gate contact 111 and the first wafer metal lines 117 are described as being a series of separate individual steps (e.g., a series of single damascene processes), this is intended to be illustrative and is not intended to be limiting. Rather, in other embodiments the first wafer gate contact 111 and the first wafer metal lines 117 may be formed through both the first wafer dielectric layer 113 and the second wafer dielectric layer 115 in a single series of steps, such as a dual damascene process. Any suitable number of steps may be utilized.

FIG. 1A additionally illustrates a formation of a first wafer bond layer 121 over the second wafer dielectric layer 115. The first wafer bond layer 121 may be used for hybrid bonding or fusion bonding (also referred to as oxide-to-oxide bonding). In accordance with some embodiments, the first wafer bond layer 121 is formed of a silicon-containing dielectric material such as silicon oxide, silicon nitride, or the like. The first wafer bond layer 121 may be deposited using any suitable method, such as, atomic layer deposition (ALD), CVD, high-density plasma chemical vapor deposition (HDPCVD), PVD, or the like to a first thickness $T_1$ of between about 1 nm and about 1000 nm, such as about 5 nm. However, any suitable material, process, and thickness may be utilized.

FIG. 1B illustrates a formation of bond openings within the first wafer bond layer 121 and a formation of a first conductive wafer bond material 123 within the bond openings. In an embodiment the bond openings may be formed by first applying and patterning a photoresist (not separately illustrated in FIG. 1B) over the top surface of the first wafer bond layer 121. The photoresist is then used to etch the first wafer bond layer 121 in order to form the openings. The first wafer bond layer 121 may be etched by dry etching (e.g., reactive ion etching (RIE) or neutral beam etching (NBE)), wet etching, or the like. In accordance with some embodiments of the present disclosure, the etching stops on the first wafer metal lines 117 within the first wafer interconnection structure 119 such that the first wafer metal lines 117 are exposed through the openings in the first wafer bond layer 121.

Once the first wafer metal lines 117 have been exposed, the first conductive wafer bond material 123 may be formed in physical and electrical contact with the first wafer metal lines 117 within the first wafer interconnection structure 119. In an embodiment the first conductive wafer bond material 123 may comprise a barrier layer, a seed layer, a fill metal, or combinations thereof (not separately illustrated). For example, the barrier layer may be blanket deposited over the first wafer metal lines 117. The barrier layer may comprise titanium, titanium nitride, tantalum, tantalum nitride, or the like. The seed layer may be a conductive material such as copper and may be blanket deposited over the barrier layer using processes such as sputtering, evaporation, or plasma-enhanced chemical vapor deposition (PECVD), or the like, depending upon the desired materials. The fill metal may be a conductor such as copper or a copper alloy and may be deposited over the seed layer to fill or overfill the openings through a plating process such as electrical or electroless plating. Once the fill metal has been deposited, excess material of the fill metal, the seed layer, and the barrier layer may be removed from outside of the openings through a planarization process such as chemical mechanical polishing. However, while a single damascene process has been described, any suitable method, such as a dual damascene process, may also be utilized.

In an embodiment the first conductive wafer bond material 123 may be formed to have a first dimension $D_1$ of between about 1 nm and about 180 nm, such as about 7 nm. Additionally, the first conductive wafer bond material 123 may be formed with a first pitch $P_1$ of between about 2 nm and about 2000 nm, such as about 36 nm. However, any suitable dimensions may be utilized.

FIG. 2 illustrates a second semiconductor device 200 that will be bonded to the first wafer interconnection structure 119 through the first conductive wafer bond material 123. In an embodiment the second semiconductor device 200 may be a known finished good chip stack which has been tested or may be a known non-finished good chip stack on which separate external connections (such as aluminum contact pads, external copper pillars, or solder balls) have not been formed. In other particular embodiments the second semiconductor device 200 may be a system on chip device, a III-V device, a sensor device, or a passive device. Any suitable configuration or functionality may be utilized.

In an embodiment the second semiconductor device 200 may comprise a first die substrate 201, first die isolation regions 203, first die fins (not separately illustrated outside of the first die substrate 201), first die source/drain regions 205, a first die gate stack 207, a first die ILD layer 209, a first die gate contact dielectric layer 211, and a first die gate contact 213. In an embodiment the first die substrate 201, the first die isolation regions 203, the first die fins, the first die source/drain regions 205, the first die gate stack 207, the first die ILD layer 209, the first die gate contact dielectric layer 211, and the first die gate contact 213 may be similar to the first wafer substrate 101, the first wafer isolation regions 103, the first fins, the first wafer source/drain regions 105, the first wafer gate stack 109, the first wafer ILD layer 107, the first wafer dielectric layer 113, and the first wafer gate contact 111 as described above with respect to FIG. 1A. However, in other embodiments the first die substrate 201, the first die isolation regions 203, the first die fins, the first die source/drain regions 205, the first die gate stack 207, the first die ILD layer 209, the first die gate contact dielectric layer 211, and the first die gate contact 213 may be different.

The second semiconductor device 200 may also comprise a first die dielectric layer 215 and a first die metal line 217 within the first die dielectric layer 215 may be formed to collectively create a first die interconnection structure 231 (also known as an M1 metal layer). In an embodiment the first die dielectric layer 215 and the first die metal lines 217 may be formed similar to the first wafer dielectric layer 113 and the first wafer metal lines 117 as described above with respect to FIG. 1A. For example, the first die dielectric layer 215 may be a low-k dielectric material that is patterned and filled with a conductive material to form the first die metal lines 217. However, any suitable materials and processes may be utilized.

In an embodiment the first die metal line 217 may be formed to have a fourth width $W_4$ of between about 1 nm and about 1000 nm, such as about 5 nm. Additionally, the first die interconnection structure 231 may be formed to have a fourth height $H_4$ of between about 1 nm and about 1000 nm, such as about 5 nm. However, any suitable dimensions may be utilized.

Optionally, through substrate vias 202 may be formed to provide an electrical connection from a first side of the first die substrate 201 to, e.g., the first die interconnection structure 231. In an embodiment the through substrate vias 202 may be formed by initially forming an opening into the first die substrate 201 (and, in some embodiments, through the first die ILD layer 209 and the first die gate contact dielectric layer 211) to a depth deeper than the eventual height of the second semiconductor device 200. The opening may then be lined with a barrier layer and a seed layer, at which point a conductive material such as copper is plated onto the seed layer to fill and/or overfill the opening. Excess material that is outside of the opening is then removed using, e.g., a planarization process, and a backside of the first die substrate 201 is thinned in order to expose the conductive material and form the through substrate vias 202.

FIG. 2 additionally illustrates the formation of middle die interconnection structure 219 (also described as Mx die metallization layers) over the first die interconnection structure 231 in order to provide additional routing options. In an embodiment the middle die interconnection structure 219 may comprise a third die dielectric layer 221 with second die metal lines 223 formed within the third die dielectric layer 221. In an embodiment the third die dielectric layer 221 and the second die metal lines 223 may be formed similar to the first wafer dielectric layer 113 and the first wafer metal lines 117, as described above with respect to FIG. 1A. For example, a single or dual damascene process may be utilized to form and fill openings through the third die dielectric layer 221.

Additionally, the process of forming the third die dielectric layer 221 and the second die metal lines 223 may be repeated to form another layer of the third die dielectric layer 221 and another one of the second die metal lines 223 such that there are two layers within the middle die interconnection structure 219. Further, any suitable number of layers, such as between about 1 layer and about 10 layers, may be formed as part of the middle die interconnection structure 219, and all such numbers of layers are fully intended to be included within the scope of the embodiments.

In an embodiment the second die metal lines 223 may be formed with a fifth width $W_5$ of between about 1 nm and about 1000 nm, such as about 6 nm. Additionally, the third die dielectric layer 221 may be formed to a fifth height $H_5$ of between about 1 nm and about 1000 nm, such as about 5 nm. Additionally, the middle die interconnection structure 219 may have an overall height of the fifth height $H_5$ times the number of layers. However, any suitable dimensions may be utilized.

Finally, once the middle die interconnection structure 219 have been formed, a top die interconnection structure 225 may be formed over the middle die interconnection structure 219 in order to provide a suitable top layer for the second semiconductor device 200. In an embodiment the top die interconnection structure 225 may comprise a fourth die dielectric layer 227 with third die metal lines 229 formed within the fourth die dielectric layer 227. In an embodiment the fourth die dielectric layer 227 and the third die metal lines 229 may be formed similar to the first wafer dielectric layer 113 and the first wafer metal lines 117, as described above with respect to FIG. 1A.

In an embodiment the third die metal lines 229 may be formed with a sixth width $W_6$ of between about 1 nm and about 1000 nm, such as about 7 nm. Additionally, the top die interconnection structure 225 may be formed to have a sixth height $H_6$ of between about 1 nm and about 1000 nm, such as about 5 nm. However, any suitable dimensions may be utilized.

Once the top die interconnection structure 225 has been formed, the second semiconductor device 200 may be singulated from its wafer and prepared for bonding to the first wafer interconnection structure 119 through the first wafer bonding layer 121. In an embodiment the singulation may be performed by using a saw blade (not shown) to slice through the first die substrate 201, thereby separating one section from another. However, as one of ordinary skill in the art will recognize, utilizing a saw blade for the singulation process is merely one illustrative embodiment and is not intended to be limiting. Alternative methods for singulation, such as utilizing one or more etches to separate the second semiconductor device 200, may be utilized. These methods and any other suitable methods may be utilized to singulate the second semiconductor device 200.

Figure 3:
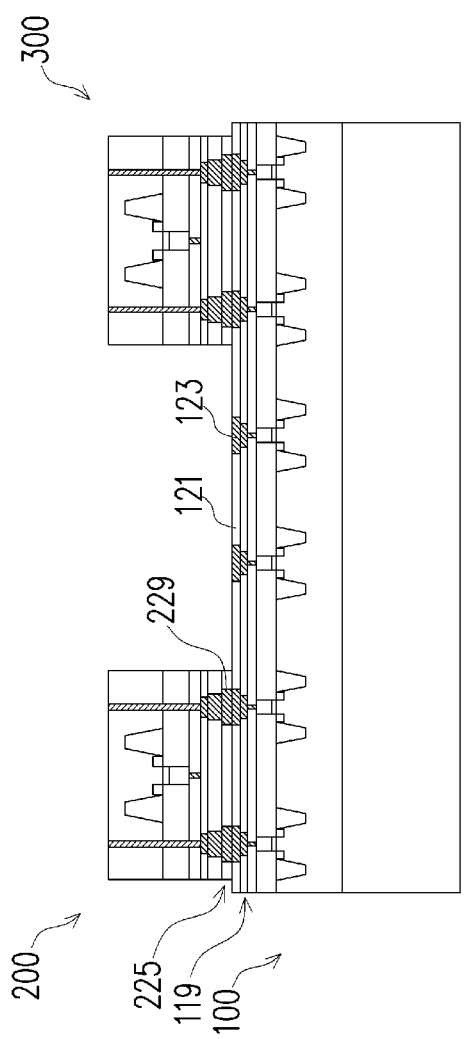
FIG. 3 illustrates a bonding of the first semiconductor device and the second semiconductor device in accordance with some embodiments.

FIG. 3 illustrates a heterogeneous, die-to-wafer bonding of the second semiconductor device 200 to the first wafer interconnection structure 119 through the first wafer bonding layer 121. In an embodiment the combination of the first semiconductor device 100 and the second semiconductor device 200 can be utilized to form a chip stack using the same or different manufacturing technologies. For example, this stack could utilize the second semiconductor device 200 to bond a PMOS stack onto an NMOS wafer. However, any suitable combination, such as the use of different processing nodes, may be utilized.

In an embodiment the second semiconductor device 200 may be bonded to the first wafer interconnection structure 119 using a hybrid bond which may be initiated by activating the top die interconnection structure 225 and the first wafer bonding layer 121. Such an activation may be performed using, e.g., a dry treatment, a wet treatment, a plasma treatment, exposure to H2, exposure to N2, exposure to O2, combinations of these, or the like. In embodiments where a wet treatment is used, an RCA cleaning may be used, for example. The activation process assists in the hybrid bonding of the top die interconnection structure 225 and the first wafer bonding layer 121 by, e.g., allowing the use of lower pressures and temperatures in subsequent hybrid bonding processes.

After the activation process, the top die interconnection structure 225 and the first wafer bonding layer 121 may be cleaned using a chemical rinse. Once cleaned, the second semiconductor device 200 is flipped and aligned with the first semiconductor device 100. Once aligned, the first semiconductor device 100 and the second semiconductor device 200 are brought together such that the top die interconnection structure 225 is in physical contact with the first wafer bonding layer 121.

Once in physical contact, the first semiconductor device 100 and the second semiconductor device 200 are subjected to a thermal treatment and contact pressure to assist in the bonding process. For example, the first semiconductor device 100 and the second semiconductor device 200 may be subjected to a pressure of about 200 kPa or less, and a temperature between about 200° C. and about 400° C. to fuse the first wafer bond layer 121 and the top die interconnection structure 225. The first semiconductor device 100 and the second semiconductor device 200 may then be subjected to a temperature at or above the eutectic point for the material of the third die metal lines 229 and the first conductive wafer bond material 123, e.g., between about 150° C. and about 650° C., to fuse the third die metal lines 229 and the first conductive wafer bond material 123. In this manner, fusion of the first semiconductor device 100 and the second semiconductor device 200 forms a hybrid bonded device with multiple bond types (e.g., metal to metal bonds as well as dielectric to dielectric bonds).

However, while a hybrid bonding process is one such bonding process that may be utilized, this is intended to be illustrative and is not intended to be limiting upon the embodiments. Rather, any suitable type of bonding, such as oxide-to-oxide bonding or metal-to-metal bonding, may also be utilized. Any suitable type of bonding process may be utilized.

FIG. 3 additionally illustrates a bonding of a third semiconductor device 300 to the first wafer interconnection structure 119. In an embodiment the third semiconductor device 300 is similar to the second semiconductor device 200 and may have similar or different functionalities as the first semiconductor device 100. For example, the third semiconductor device 300 may have similar structures (e.g., a semiconductor substrate, active devices, overlying metallization layers, etc.). However, any suitable structures may be utilized.

Figure 4:
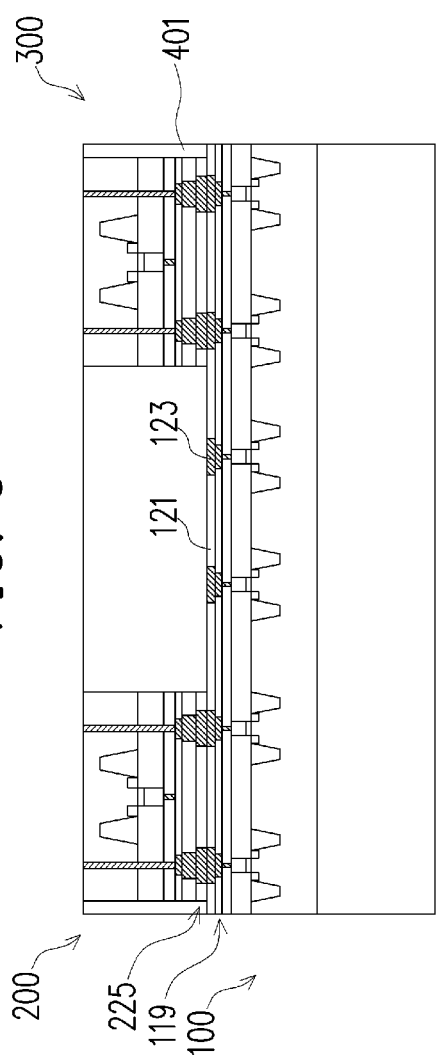
FIG. 4 illustrates a placement of a fill material in accordance with some embodiments.

FIG. 4 illustrates a formation of a first fill material 401 between the second semiconductor device 200 and the third semiconductor device 300. In an embodiment the first fill material 401 may comprise a non-polymer like silicon dioxide, silicon nitride, or the like, such as another oxide or nitride, which is deposited using any suitable process. For example, the first fill material 401 may be formed by CVD, PECVD or ALD deposition process, FCVD, or a spin-on-glass process. In other embodiments, the first fill material 401 may comprise a molding compound such as an epoxy, a resin, a moldable polymer, polyimide, or the like. The molding compound may be applied while substantially liquid, and then may be cured through a chemical reaction, such as in an epoxy or resin. In some embodiments, the molding compound may be an ultraviolet (UV) or thermally cured polymer applied as a gel or malleable solid.

Once the first fill material 401 is in place, the first fill material 401 may be planarized to provide a planar surface for further processing. In an embodiment the first fill material may be planarized using a planarization process such as a chemical mechanical polish, whereby abrasives and etchants are placed into contact with the first fill material 401 while a platen grinds the material of the first fill material 401 until the first fill material 401 is planar with the second semiconductor device 200 and the third semiconductor device 300.

Figure 5:
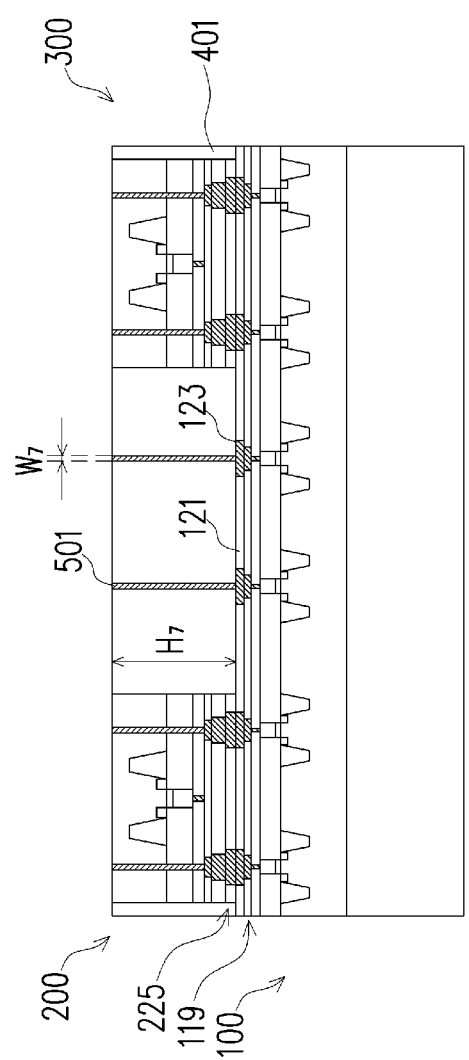
FIG. 5 illustrates a planarization of the fill material in accordance with some embodiments.

FIG. 5 illustrates a formation of through fill vias 501. In an embodiment a photoresist (not separately illustrated) may be applied over the top surfaces of the first fill material 401, the second semiconductor device 200 and the third semiconductor device 300 and patterned. The photoresist is then used as a mask to etch the first fill material 401 in order to form openings (not separately illustrated). The first fill material 401 may be etched by dry etching (e.g., reactive ion etching (RIE) or neutral beam etching (NBE)), wet etching, or the like. The photoresist may be removed by using suitable photoresist stripping techniques such as chemical solvent cleaning, plasma ashing, dry stripping and/or the like.

The openings may then be filled with a conductive material. The conductive material may comprise a barrier layer, a seed layer, a plate metal, or combinations thereof and may be deposited using, e.g., sputtering, CVD, electroplating, electroless plating, combinations of these, or the like. The conductive material may then be planarized to form the through fill vias 501. For example, a planarization process, such as CMP, may be performed to planarize the conductive material such that top surfaces of the fill material 401, the second semiconductor device 200, the third semiconductor device 300, and the through fill vias 501 are co-planar.

In an embodiment the through fill vias 501 may be formed to have a seventh width $W_7$ of between about 1 nm and about 1000 nm, such as about 100 nm. Additionally, the through fill vias 501 may have a seventh height $H_7$ of between about 500 nm and about 5000 nm, such as about 1000 nm. However, any suitable dimensions may be utilized.

Figure 6:
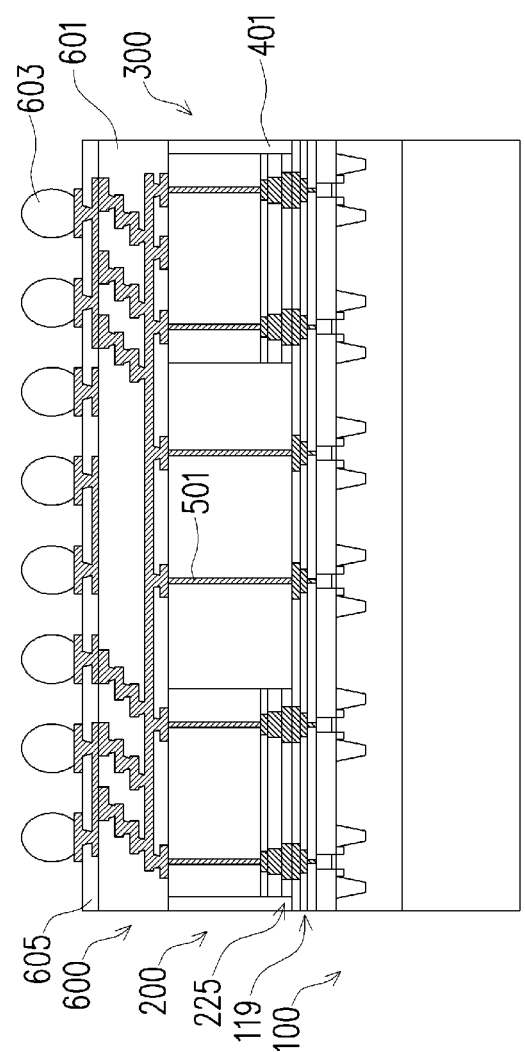
FIG. 6 illustrates a formation of a first interconnect layer in accordance with some embodiments.

FIG. 6 illustrates that, once the fill material 401 has been planarized, a first interconnect layer 600 comprising a middle interconnect interconnection structure 601 may be formed over the second semiconductor device 200, the third semiconductor device 300, and the fill material 401 in order to interconnect each device to overlying first external connections 603. In an embodiment the first interconnect layer 600 may be similar to the middle die interconnection structure 219 as described above with respect to FIG. 2. For example, the first interconnect layer 600 may comprise one or more metallization layers stacked on top of each other, wherein each metallization layer comprises a dielectric layer and a metal line formed using either a damascene or dual damascene manufacturing process. However, any suitable manufacturing process may be utilized.

FIG. 6 additionally illustrates the formation of a top interconnect interconnection structure 605. In an embodiment the top interconnect interconnection structure 605 may be similar to the top die interconnection structure 225 described above with respect to FIG. 2. For example, the top die interconnection structure 225 may comprise a top die dielectric layer and a top die metal line formed using either a damascene or dual damascene deposition process. However, any suitable manufacturing process may be utilized.

Once the top interconnect interconnection structure 605 has been formed, the first external connections 603 may be utilized to provide an external connection point for electrical connection to the top interconnect interconnection structure 605 and may be, for example, a contact bump as part of a ball grid array (BGA), although any suitable connection may be utilized. In an embodiment in which the first external connections 603 are contact bumps, the first external connections 603 may comprise a material such as tin, or other suitable materials, such as silver, lead-free tin, or copper. In an embodiment in which the first external connections 603 are tin solder bumps, the first external connections 603 may be formed by initially forming a layer of tin through such commonly used methods such as evaporation, electroplating, printing, solder transfer, ball placement, etc, to a thickness of, e.g., about 250 μm. Once a layer of tin has been formed on the structure, a reflow may be performed in order to shape the material into the desired bump shape.

Figure 7:
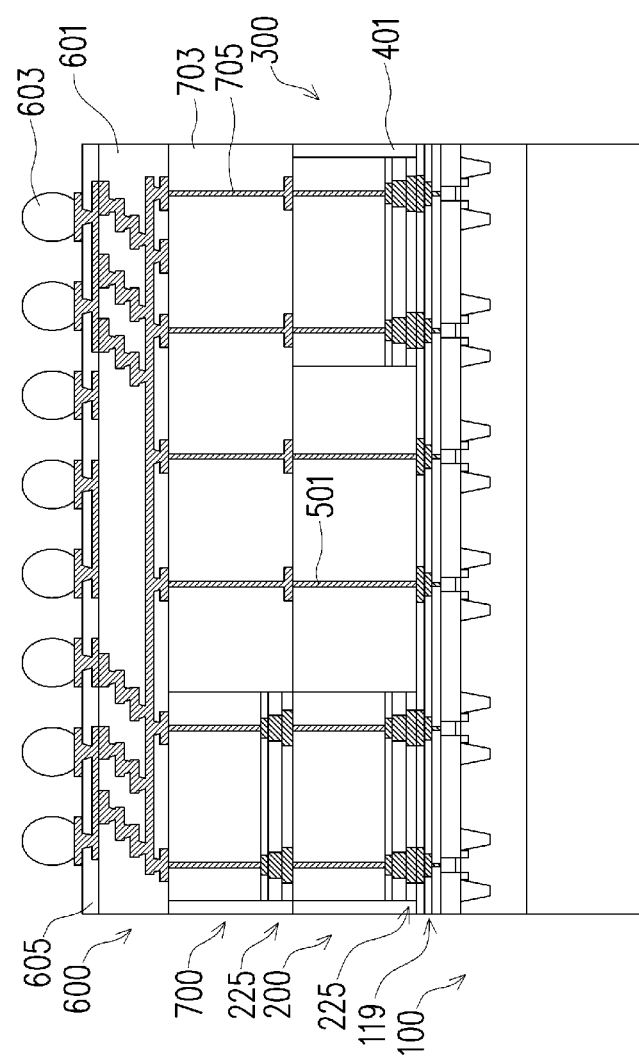
FIG. 7 illustrates a bonding of a fourth semiconductor device in accordance with some embodiments.

FIG. 7 illustrates another embodiment in which a fourth semiconductor device 700 is stacked and bonded to the second semiconductor device 200 prior to the formation of the first interconnect layer 600. In an embodiment the fourth semiconductor device 700 may be similar to the second semiconductor device 200 and may be designed to work in conjunction with the second semiconductor device 200. For example, the fourth semiconductor device 700 may comprise a semiconductor substrate, active devices, metallization layers (including a top die interconnection structure 225). However, in other embodiments the fourth semiconductor device 700 may be different from the second semiconductor device 200.

In an embodiment the fourth semiconductor device 700 is bonded to the second semiconductor device 200 using, for example, a hybrid bonding process as described above with respect to FIG. 3. For example, surfaces of both the fourth semiconductor device 700 (e.g., the top die interconnection structure 225) and the second semiconductor device 200 are activated and then placed in physical contact with each other. Heat and pressure are then applied in order to strengthen the bond.

FIG. 7 additionally illustrates a formation of a second fill material 703 adjacent to the fourth semiconductor device 700. In an embodiment the second fill material 703 may be similar to the fill material 401 as described above with respect to FIG. 4. For example, the fill material 703 may be a dielectric material such as silicon oxide formed through a deposition process such as CVD, PECVD or ALD and then planarized with the fourth semiconductor device 700. However, any suitable material or process may be utilized.

Once the second fill material 703 has been planarized, second through fill vias 705 may optionally be formed through the second fill material 703 to make contact with the first through fill vias 501 and the third semiconductor device 300. In an embodiment the second through fill vias 705 may be formed in a manner similar to the first through fill vias 501 (described above with respect to FIG. 5), although any suitable method of manufacture may be utilized. Additionally, once the second through fill vias 705 have been formed, the top interconnect interconnection structure 605 may be formed in electrical connection with both the second through fill vias 705 and the fourth semiconductor device 700, and the first external connections 603 may be placed or formed. In an embodiment the second through fill vias 705 may be similar to the through fill vias 501 as described above with respect to FIG. 5.

Figure 8:
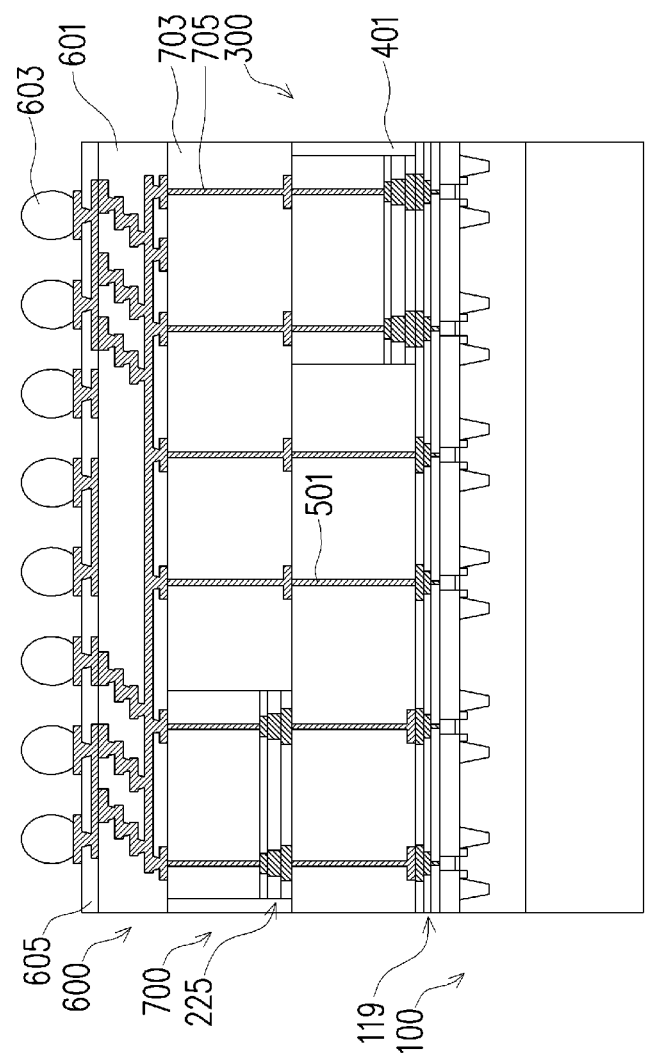
FIG. 8 illustrates a bonding of a fourth semiconductor device to a through fill via in accordance with some embodiments.

FIG. 8 illustrates another embodiment in which the fourth semiconductor device 700 is not bonded to the second semiconductor device 200 (which is not present in this embodiment) but is instead electrically connected to the first wafer interconnection structure 119 through, e.g., the through fill vias 501. In this embodiment the fourth semiconductor device 700 is bonded directly to both the through fill vias 501 as well as the first fill material 401 using, e.g., a hybrid bond. For example, the first fill material 401 may be bonded to a dielectric material within the fourth semiconductor device 700 (e.g., the dielectric material within the top die interconnection structure 225, the middle die interconnection structure 219, or the first die interconnection structure 231), while the through fill vias 501 are bonded to the metal lines within the fourth semiconductor device 700 (e.g., the first die metal lines 217, the second die metal lines 223, or the third die metal lines 229). Once the fourth semiconductor device 700 has been bonded to the first through fill vias 501, the second fill material 703 may be deposited, the second through fill vias 705 may be formed, the first interconnect layer 600 and the top interconnect interconnection structure 605 may be formed in electrical connection with both the second through fill vias 705 and the fourth semiconductor device 700, and the first external connections 603 may be placed or formed.

Figure 9:
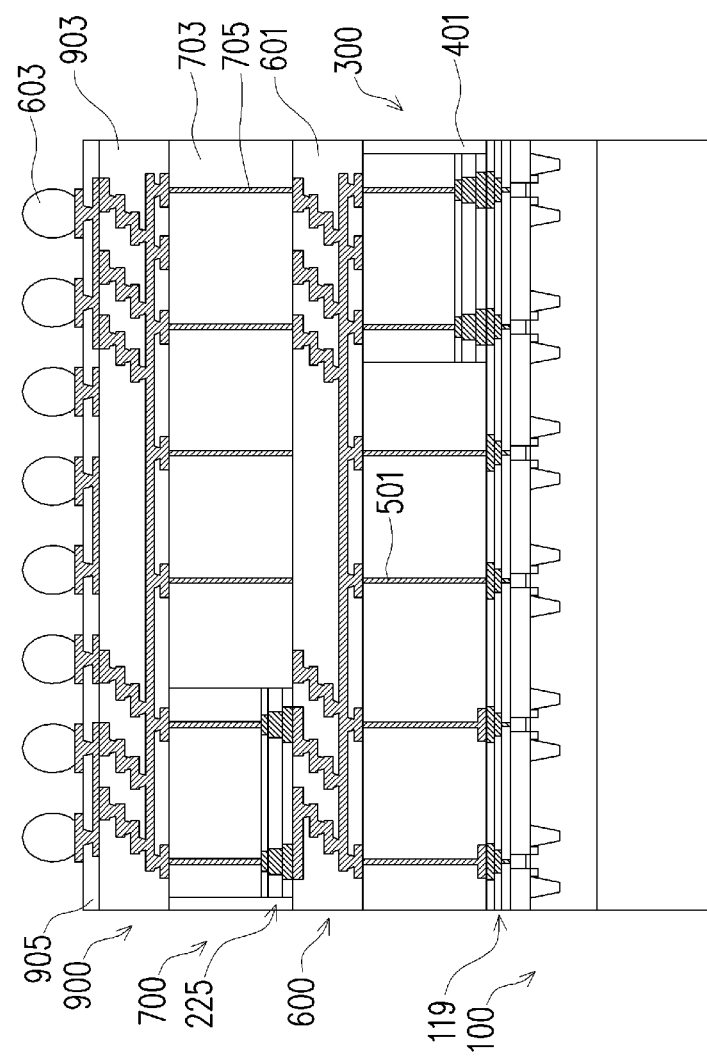
FIG. 9 illustrates a formation of a second interconnect layer in accordance with some embodiments.

FIG. 9 illustrates yet another embodiment in which the fourth semiconductor device 700 is bonded after the formation of the first interconnect layer 600. In this embodiment the first interconnect layer 600 is formed as described above with respect to FIG. 6 (with or without the second semiconductor device 200) but, instead of placing the first external connections 603 on the first interconnect layer 600, the fourth semiconductor device 700 is bonded to the first interconnect layer 600 using, e.g., a hybrid bond. For example, the first interconnect layer 600 may be bonded to a dielectric material within the fourth semiconductor device 700 (e.g., the dielectric material within the top die interconnection structure 225, the middle die interconnection structure 219, or the first die interconnection structure 231), while the metal lines in the first interconnect layer 600 are bonded to the metal lines within the fourth semiconductor device 700 (e.g., the first die metal lines 217, the second die metal lines 223, or the third die metal lines 229). Once the fourth semiconductor device 700 has been bonded to the first interconnect layer 600, the second fill material 703 may be deposited and the second through fill vias 705 may be formed.

Additionally, once the second fill material 703 has been formed, a second interconnect layer 900 may be formed over the fourth semiconductor device 700. In an embodiment the second interconnect layer 900 may be similar to the first interconnect layer 600 such as by having a second middle interconnect interconnection structure 903 (similar to the middle interconnect interconnection structure 601) and a second top interconnect interconnection structure 905 (similar to the top interconnect interconnection structure 605). Additionally, once the second interconnect layer 900 has been formed, the first external connections 603 are placed in connection with the second interconnect layer 900.

Figure 10B:
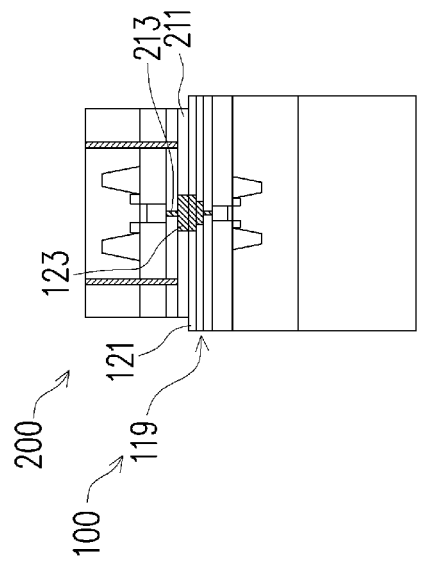
FIGS. 10A-10D illustrate bonding locations of a first wafer metallization layer in accordance with some embodiments.
Figure 10A:
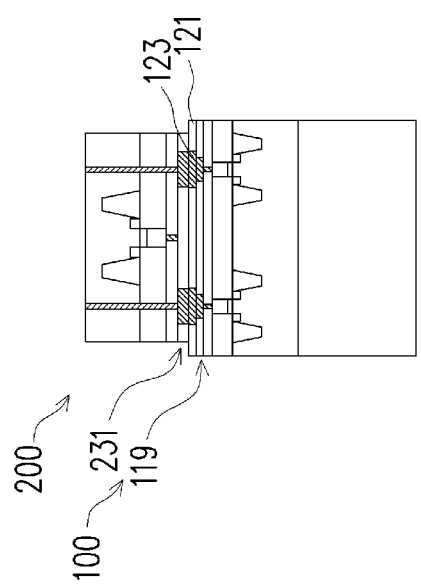

FIG. 10A illustrates another embodiment in which the first wafer interconnection structure 119 is bonded to the second semiconductor device 200. In this embodiment, however, instead of the first wafer interconnection structure 119 being bonded to the top die interconnection structure 225, the first wafer interconnection structure 119 is bonded to the first die interconnection structure 231. In this embodiment the top die interconnection structure 225 and the middle die interconnection structure 219 are not formed, and the first die interconnection structure 231 is bonded directly to the first wafer bond layer 121 using, e.g., a hybrid bond. For example, the first die interconnection structure 231 and the first wafer bond layer 121 are both activated as described above and then placed in physical contact with each other. Heat and pressure are then applied to strengthen the bond.

Additionally, although not explicitly illustrated in FIG. 10A, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 10A may also be utilized in any of the embodiments as described above with respect to FIGS. 7-9, wherein the fourth semiconductor device 700, a second fill material 703, and/or a second interconnect layer 900 are utilized. Any suitable combination may be utilized.

FIG. 10B illustrates another embodiment in which the first wafer interconnection structure 119 is bonded to the second semiconductor device 200 through the first wafer bonding layer 121 and the first conductive wafer bond material 123. In this embodiment, however, instead of the first wafer interconnection structure 119 being bonded to the top die interconnection structure 225, the middle die interconnection structure 219, or the first die interconnection structure 231, the first wafer interconnection structure 119 is bonded to the first die gate contact 213. In this embodiment the top die interconnection structure 225, the middle die interconnection structure 219, and the first die interconnection structure 231 are not formed, and the first die gate contact 213 and first die gate contact dielectric layer 211 are bonded directly to the first wafer bond layer 121 and the first conductive wafer bond material 123 using, e.g., a hybrid bond. For example, the first die gate contact dielectric layer 211 and the first wafer bond layer 121 are both activated as described above and then placed in physical contact with each other. Heat and pressure are then applied to strengthen the bond.

Additionally, although not explicitly illustrated in FIG. 10B, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 10B may also be utilized in any of the embodiments as described above with respect to FIGS. 7-9, wherein the fourth semiconductor device 700, a second fill material 703, and/or a second interconnect layer 900 are utilized. Any suitable combination may be utilized.

Figure 10C:
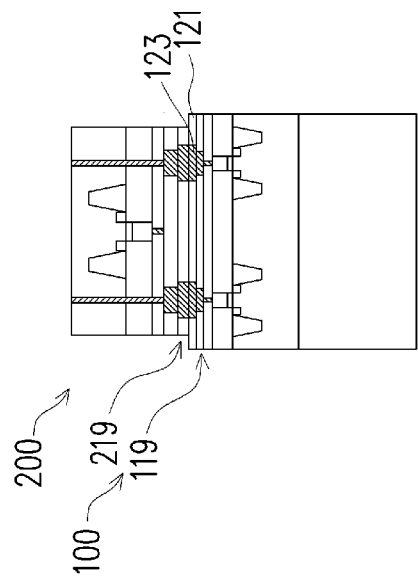

FIG. 10C illustrates another embodiment in which the first wafer interconnection structure 119 is bonded to the second semiconductor device 200 through the first wafer bonding layer 121 and the first conductive wafer bond material 123. In this embodiment, however, instead of the first wafer interconnection structure 119 being bonded to either the top die interconnection structure 225, the middle die interconnection structure 219, the first die interconnection structure 231, or the first die gate contact 213, the first wafer interconnection structure 119 is bonded to the first die gate stack 207. In this embodiment the top die interconnection structure 225, the middle die interconnection structure 219, the first die interconnection structure 231, and the first die gate contact 213 are not formed, and the first die gate stack 207 and first die ILD layer 209 are bonded directly to the first wafer bond layer 121 using, e.g., a hybrid bond. For example, the first die ILD layer 209 and the first wafer bond layer 121 are both activated as described above and then placed in physical contact with each other. Heat and pressure are then applied to strengthen the bond.

Additionally, although not explicitly illustrated in FIG. 10C, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 10C may also be utilized in any of the embodiments as described above with respect to FIGS. 7-9, wherein the fourth semiconductor device 700, a second fill material 703, and/or a second interconnect layer 900 are utilized. Any suitable combination of elements may be utilized.

Figure 10D:
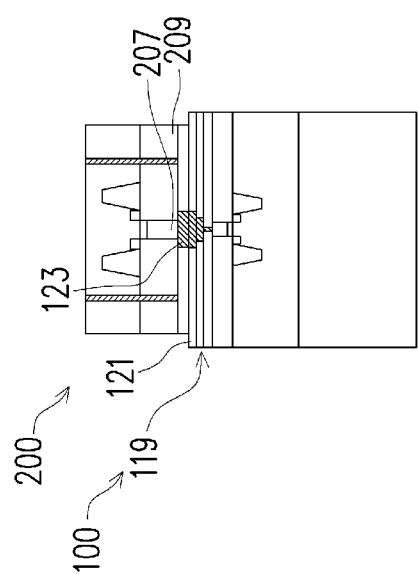

FIG. 10D illustrates another embodiment in which the first wafer interconnection structure 119 is bonded to the second semiconductor device 200 through the first wafer bonding layer 121 and the first conductive wafer bond material 123. In this embodiment, however, instead of the first wafer interconnection structure 119 being bonded to the top die interconnection structure 225, the first die interconnection structure 231, or the first die gate contact 213, the first wafer interconnection structure 119 is bonded to the middle die interconnection structure 219. In this embodiment the top die interconnection structure 225 and the first die interconnection structure 231 are not formed, and the middle die interconnection structure 219 is bonded directly to the first wafer bond layer 121 using, e.g., a hybrid bond. For example, the middle die interconnection structure 219 and the first wafer bonding layer 121 are activated as described above and then placed in physical contact with each other. Heat and pressure are then applied to strengthen the bond.

Additionally, although not explicitly illustrated in FIG. 10D, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 10D may also be utilized in any of the embodiments as described above with respect to FIGS. 7-9, wherein the fourth semiconductor device 700, a second fill material 703, and/or a second interconnect layer 900 are utilized. Any suitable combination of elements may be utilized.

FIG. 11A illustrates another embodiment in which the top die interconnection structure 225 of the second semiconductor device 200 is bonded to the first semiconductor device 100. In this embodiment, however, instead of the top die interconnection structure 225 being bonded to the first wafer bond layer 121 over the first wafer interconnection structure 119 (as described above), a middle wafer interconnection structure 1101 (also known as Mx layers) is formed over the first wafer interconnection structure 119. In an embodiment the middle wafer interconnection structure 1101 may comprise a third wafer dielectric layer 1103 and second wafer metal lines 1105, which may be formed of similar materials and using similar processes as the third die dielectric layer 221 and the second die metal lines 223 (described above with respect to FIG. 2). For example, the third wafer dielectric layer 1103 may be deposited and patterned to form openings, and the openings may be filled with conductive materials in a damascene or dual damascene process. Additionally, these processes may be repeated in order to form any desired number of layers within the middle wafer interconnection structure 1101.

In an embodiment the middle wafer interconnection structure 1101 may be formed with an eighth height $H_8$ of between about 1 nm and about 1000 nm, such as about 10 nm. Additionally, the second wafer metal lines 1105 may be formed to have an eighth width $W_8$ of between about 1 nm and about 1000 nm, such as about 7 nm. However, any suitable dimensions may be utilized.

Once the middle wafer interconnection structure 1101 has been formed, the first wafer bond layer 121 may be formed over the middle wafer interconnection structure 1101 as described above with respect to FIG. 1A. For example, the first wafer bond layer 121 may be a dielectric such as silicon oxide deposited using a method such as CVD. However, any suitable material and method of manufacturing may be utilized.

FIG. 11B illustrates a formation of the first conductive wafer bond material 123 within the first wafer bond layer 121 as described above with respect to FIG. 1B. For example, the first wafer bond layer 121 may be patterned utilizing, e.g., a photolithographic masking and etching process to form openings that expose at least a portion of the second wafer metal lines 1105, and the openings are then filled with the first conductive wafer bond material 123 in either a damascene or dual damascene process. However, any suitable method of manufacture may be utilized.

Figure 11C:
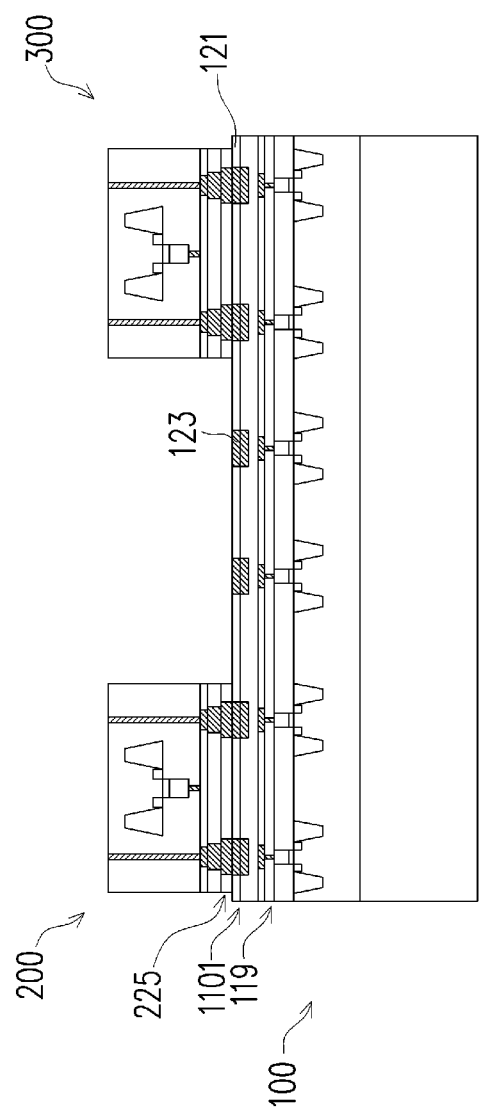

FIG. 11C illustrates that once the first wafer bond layer 121 is formed over the middle wafer interconnection structure 1101, the second semiconductor device 200 and the third semiconductor device 300 may be bonded to the first semiconductor device 100 using, e.g. a hybrid bond. In the embodiment illustrated in FIG. 11C, the second semiconductor device 200 and the third semiconductor device 300 both have a top die interconnection structure 225 and the top die interconnection structure 225 is bonded to the first wafer bond layer 121 as described above with respect to FIG. 3. For example, the top die interconnection structure 225 and the first wafer bond layer 121 are both activated and then placed in physical contact with each other. Heat and pressure are then applied to strengthen the bond. However, any suitable bonding process may be utilized.

Figure 11D:
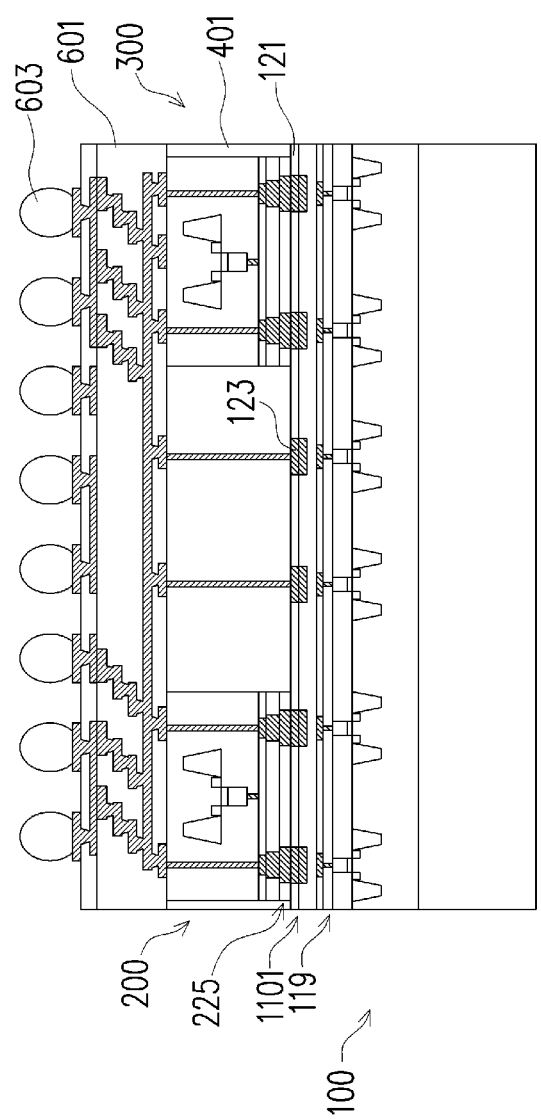

FIG. 11D illustrates that, once the second semiconductor device 200 and the third semiconductor device 300 are bonded, the first fill material 401 may be deposited and optional first through fill vias 501 may be formed as described above. Additionally, the first interconnect layer 600 may be formed, and the first external connections 603 may be placed in order to provide external connections. However, any other suitable processes may be utilized.

Additionally, although not explicitly illustrated in FIG. 11D, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 11D may also be utilized in any of the embodiments as described above with respect to FIGS. 7-9, wherein the fourth semiconductor device 700, a second fill material 703, and/or a second interconnect layer 900 are utilized. Any suitable combination of elements may be utilized.

Figure 11E:
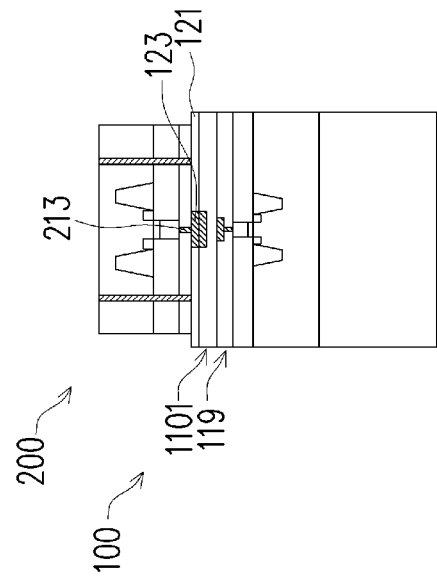

FIG. 11E illustrates another embodiment in which the middle wafer interconnection structure 1101 is bonded to the second semiconductor device 200 through the first wafer bonding layer 121. In this embodiment, however, instead of the middle wafer interconnection structure 1101 being bonded to the top die interconnection structure 225, the middle wafer interconnection structure 1101 is bonded to the first die interconnection structure 231. In this embodiment the top die interconnection structure 225 and the middle die interconnection structure 219 are not formed, and the first die interconnection structure 231 is bonded directly to the first wafer bond layer 121 using, e.g., a hybrid bond. For example, the first die interconnection structure 231 and the first wafer bond layer 121 are both activated as described above and then placed in physical contact with each other. Heat and pressure are then applied to strengthen the bond.

Additionally, although not explicitly illustrated in FIG. 11E, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 11E may also be utilized in any of the embodiments as described above with respect to FIGS. 7-9, wherein the fourth semiconductor device 700, a second fill material 703, and/or a second interconnect layer 900 are utilized. Any suitable combination may be utilized.

Figure 11F:
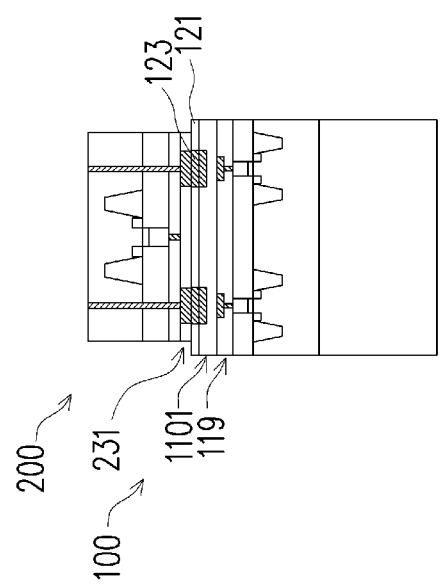

FIG. 11F illustrates another embodiment in which the first wafer interconnection structure 119 is bonded to the second semiconductor device 200 through the first wafer bonding layer 121. In this embodiment, however, instead of the middle wafer interconnection structure 1101 being bonded to either the top die interconnection structure 225, the middle die interconnection structure 219, or the first die interconnection structure 231, the middle wafer interconnection structure 1101 is bonded to the first die gate contact 213. In this embodiment the top die interconnection structure 225, the middle die interconnection structure 219, and the first die interconnection structure 231 are not formed, and the first die gate contact 213 and first die gate contact dielectric layer 211 are bonded directly to the first wafer bond layer 121 and first conductive wafer bond material 123 using, e.g., a hybrid bond. For example, the first die gate contact 213 and the first wafer bond layer 121 are both activated as described above and then placed in physical contact with each other. Heat and pressure are then applied to strengthen the bond.

Additionally, although not explicitly illustrated in FIG. 11F, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 11F may also be utilized in any of the embodiments as described above with respect to FIGS. 7-9, wherein the fourth semiconductor device 700, a second fill material 703, and/or a second interconnect layer 900 are utilized. Any suitable combination may be utilized.

Figure 11G:
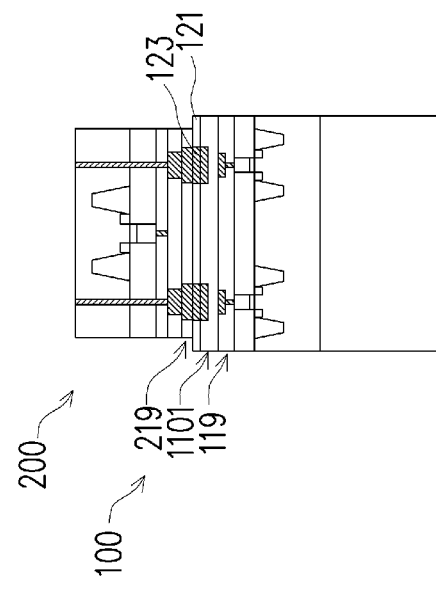

FIG. 11G illustrates another embodiment in which the first wafer interconnection structure 119 is bonded to the second semiconductor device 200 through the first wafer bonding layer 121. In this embodiment, however, instead of the middle wafer interconnection structure 1101 being bonded to either the top die interconnection structure 225, the middle die interconnection structure 219, the first die interconnection structure 231, or the first die gate contact 213, the middle wafer interconnection structure 1101 is bonded to the first die gate stack 207. In this embodiment the top die interconnection structure 225, the middle die interconnection structure 219, the first die interconnection structure 231, and the first die gate contact 213 are not formed, and the first die gate stack 207 and first die ILD layer 209 are bonded directly to the first wafer bond layer 121 and first conductive wafer bond material 123 using, e.g., a hybrid bond. For example, the first die ILD layer 209 and the first wafer bond layer 121 are both activated as described above and then placed in physical contact with each other. Heat and pressure are then applied to strengthen the bond.

Additionally, although not explicitly illustrated in FIG. 11G, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 11G may also be utilized in any of the embodiments as described above with respect to FIGS. 7-9, wherein the fourth semiconductor device 700, a second fill material 703, and/or a second interconnect layer 900 are utilized. Any suitable combination may be utilized.

Figure 11H:
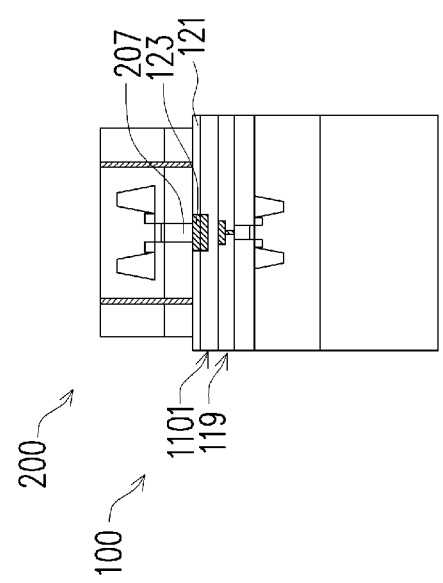

FIG. 11H illustrates another embodiment in which the middle wafer interconnection structure 1101 is bonded to the second semiconductor device 200 through the first wafer bonding layer 121. In this embodiment, however, instead of the middle wafer interconnection structure 1101 being bonded to the top die interconnection structure 225, the middle wafer interconnection structure 1101 is bonded to the middle die interconnection structure 219. In this embodiment the top die interconnection structure 225 is not formed, and the middle die interconnection structure 219 is bonded directly to the first wafer bond layer 121 using, e.g., a hybrid bond. For example, the middle die interconnection structure 219 and the first wafer bond layer 121 are both activated as described above and then placed in physical contact with each other. Heat and pressure are then applied to strengthen the bond.

Additionally, although not explicitly illustrated in FIG. 11H, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 11H may also be utilized in any of the embodiments as described above with respect to FIGS. 7-9, wherein the fourth semiconductor device 700, a second fill material 703, and/or a second interconnect layer 900 are utilized. Any suitable combination may be utilized.

Figure 12A:
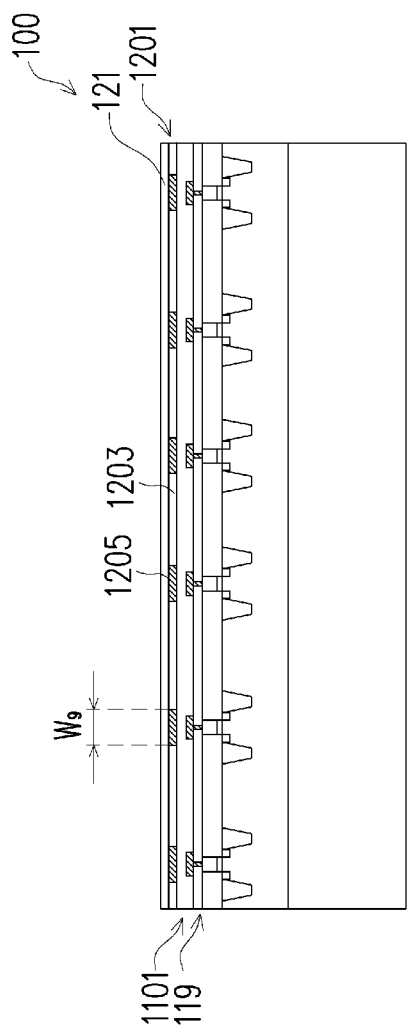
FIGS. 12A-12H illustrate bonding locations of a top wafer metallization layer in accordance with some embodiments.

FIG. 12A illustrates another embodiment in which the top die interconnection structure 225 of the second semiconductor device 200 is bonded to the first semiconductor device 100. In this embodiment, however, instead of the top die interconnection structure 225 being bonded to the first wafer bond layer 121 over the first wafer interconnection structure 119 (as described above), a top wafer interconnection structure 1201 is formed over the middle wafer interconnection structure 1101. In an embodiment the top wafer interconnection structure 1201 may comprise a fourth wafer dielectric layer 1203 and third wafer metal lines 1205, which may be formed of similar materials and using similar processes as the fourth die dielectric layer 227 and the third die metal lines 229 (described above with respect to FIG. 2). For example, the fourth wafer dielectric layer 1203 may be deposited and patterned to form openings, and the openings may be filled with conductive materials in a damascene or dual damascene process. Additionally, these processes may be repeated in order to form any desired number of layers within the top wafer interconnection structure 1201.

In an embodiment the top die interconnection structure 225 may be formed with a ninth height $H_9$ of between about 1 nm and about 1000 nm, such as about 5 nm. Additionally, the third wafer metal lines 1205 may be formed with a thickness of between about 1 nm and about 1000 nm, such as about 5 nm and may have a ninth width $W_9$ of between about 1 nm and about 1000 nm. Such as about 7 nm. However, any suitable dimensions may be utilized.

Once the top wafer interconnection structure 1201 has been formed, the first wafer bond layer 121 may be formed over the top wafer interconnection structure 1201 as described above with respect to FIG. 1A. For example, the first wafer bond layer 121 may be a dielectric such as silicon oxide deposited using a method such as CVD. However, any suitable material and method of manufacturing may be utilized.

Figure 12B:
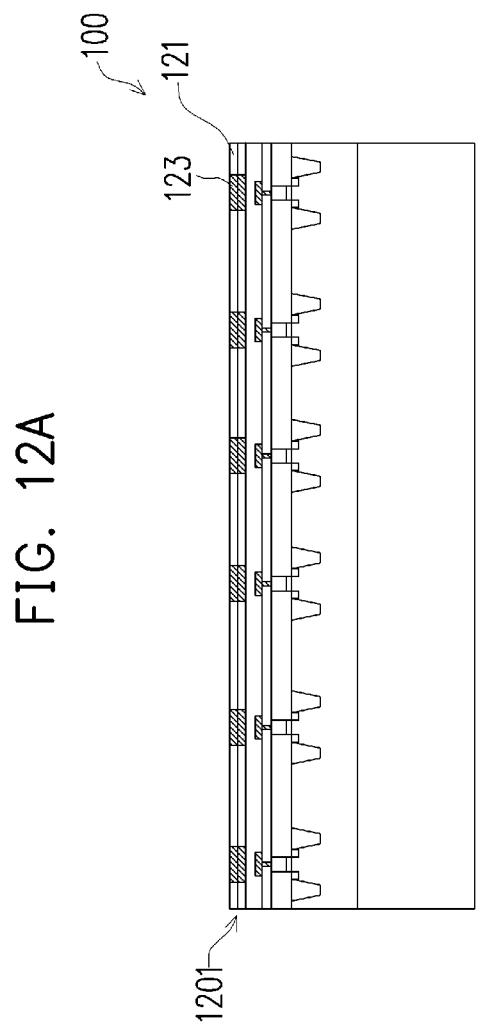

FIG. 12B illustrates a formation of the first conductive wafer bond material 123 within the first wafer bond layer 121 as described above with respect to FIG. 1B. For example, the first wafer bond layer 121 may be patterned utilizing, e.g., a photolithographic masking and etching process to form openings that expose at least a portion of the third wafer metal lines 1205, and the openings are then filled with the first conductive wafer bond material 123. However, any suitable method of manufacture may be utilized.

Figure 12C:
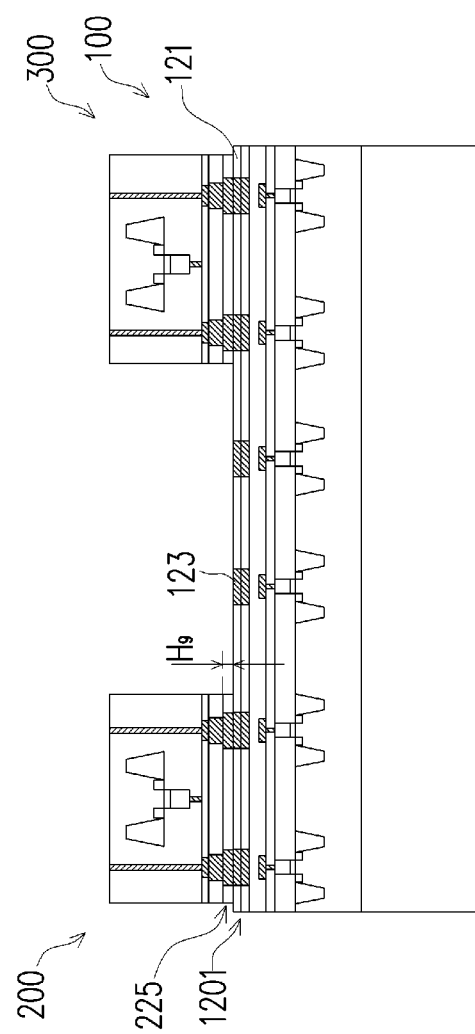

FIG. 12C illustrates that once the first wafer bond layer 121 is formed over the top wafer interconnection structure 1201, the second semiconductor device 200 and the third semiconductor device 300 may be bonded to the first semiconductor device 100 using, e.g. a hybrid bond. In the embodiment illustrated in FIG. 12C, the second semiconductor device 200 and the third semiconductor device 300 both have a top die interconnection structure 225 and the top die interconnection structure 225 is bonded to the first wafer bond layer 121 as described above with respect to FIG. 3. For example, the top die interconnection structure 225 and the first wafer bond layer 121 are both activated and then placed in physical contact with each other. Heat and pressure are then applied to strengthen the bond. However, any suitable bonding process may be utilized.

Figure 12D:
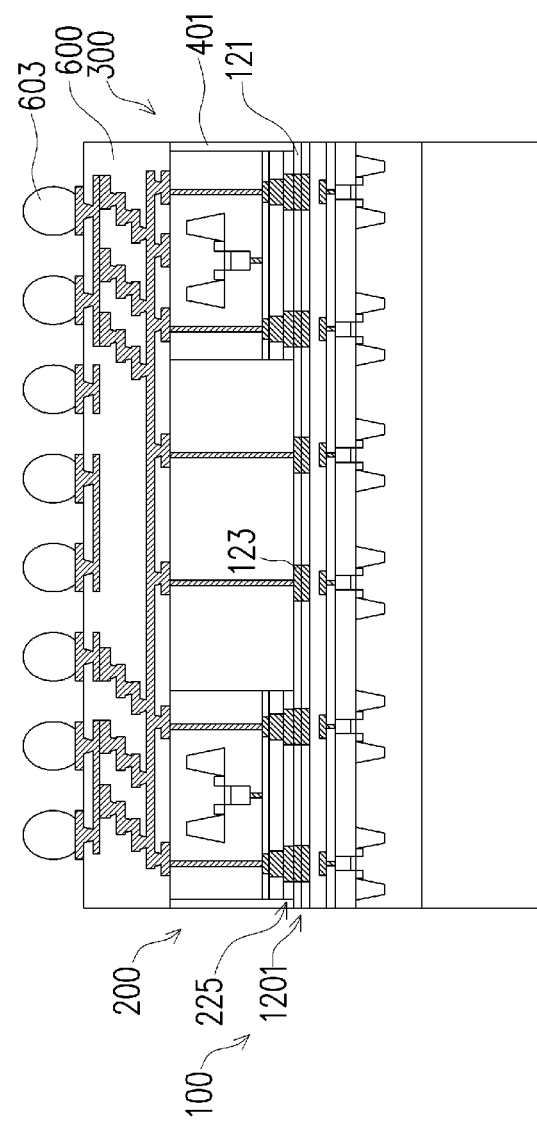

FIG. 12D illustrates that, once the second semiconductor device 200 and the third semiconductor device 300 are bonded to the first semiconductor device 100, the first fill material 401 may be deposited and optional first through fill vias 501 may be formed as described above. Additionally, the first interconnect layer 600 may be formed, and the first external connections 603 may be placed in order to provide external connections. However, any other suitable processes may be utilized.

Additionally, although not explicitly illustrated in FIG. 12D, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 12D may also be utilized in any of the embodiments as described above with respect to FIGS. 7-9, wherein the fourth semiconductor device 700, a second fill material 703, and/or a second interconnect layer 900 are utilized. Any suitable combination of elements may be utilized.

Figure 12F:
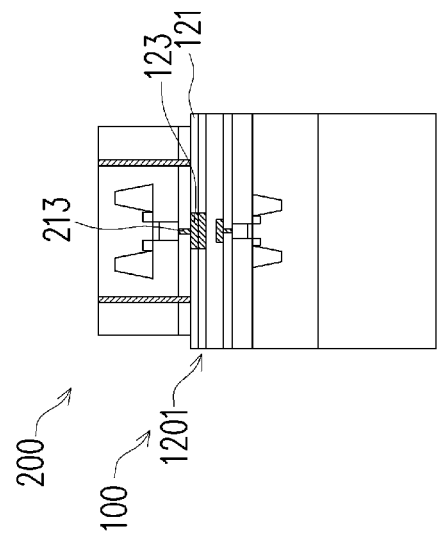
Figure 12E:
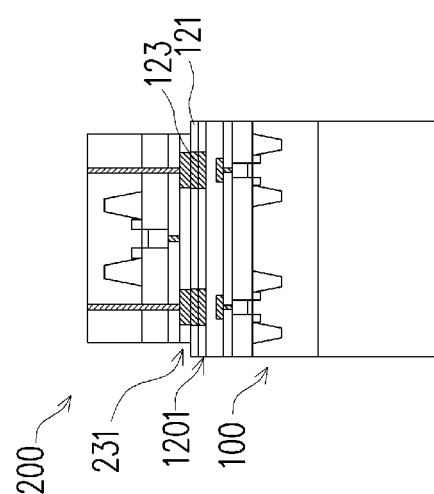

FIG. 12E illustrates another embodiment in which the top wafer interconnection structure 1201 is bonded to the second semiconductor device 200 through the first wafer bonding layer 121. In this embodiment, however, instead of the top wafer interconnection structure 1201 being bonded to the top die interconnection structure 225, the top wafer interconnection structure 1201 is bonded to the first die interconnection structure 231. In this embodiment the top die interconnection structure 225 and the middle die interconnection structure 219 are not formed, and the first die interconnection structure 231 is bonded directly to the first wafer bond layer 121 using, e.g., a hybrid bond. For example, the first die interconnection structure 231 and the first wafer bond layer 121 are both activated as described above and then placed in physical contact with each other. Heat and pressure are then applied to strengthen the bond.

Additionally, although not explicitly illustrated in FIG. 12E, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 12E may also be utilized in any of the embodiments as described above with respect to FIGS. 7-9, wherein the fourth semiconductor device 700, a second fill material 703, and/or a second interconnect layer 900 are utilized. Any suitable combination may be utilized.

FIG. 12F illustrates another embodiment in which the top wafer interconnection structure 1201 is bonded to the second semiconductor device 200 through the first wafer bonding layer 121. In this embodiment, however, instead of the top wafer interconnection structure 1201 being bonded to either the top die interconnection structure 225, the middle die interconnection structure 219, or the first die interconnection structure 231, the top wafer interconnection structure 1201 is bonded to the first die gate contact 213. In this embodiment the top die interconnection structure 225, the middle die interconnection structure 219, and the first die interconnection structure 231 are not formed, and the first die gate contact 213 and the first die gate contact dielectric layer 211 is bonded directly to the first wafer bond layer 121 and the first conductive wafer bond material 123 using, e.g., a hybrid bond. For example, the first die gate contact 213 and the first wafer bond layer 121 are both activated as described above and then placed in physical contact with each other. Heat and pressure are then applied to strengthen the bond.

Additionally, although not explicitly illustrated in FIG. 12F, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 12F may also be utilized in any of the embodiments as described above with respect to FIGS. 7-9, wherein the fourth semiconductor device 700, a second fill material 703, and/or a second interconnect layer 900 are utilized. Any suitable combination may be utilized.

Figure 12H:
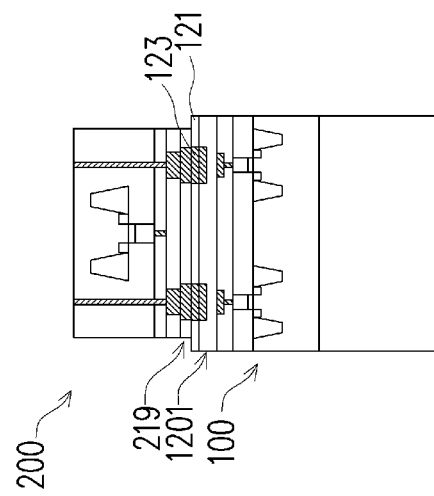
Figure 12G:
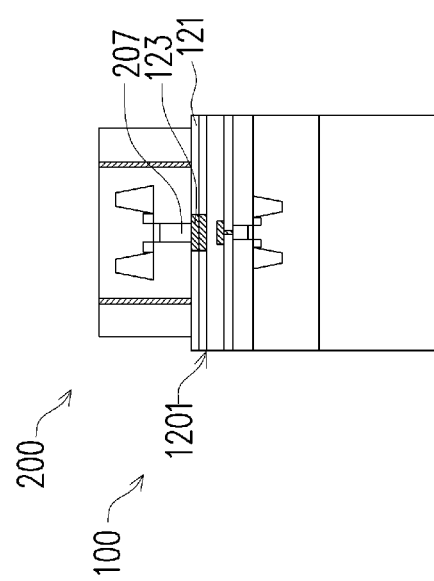

FIG. 12G illustrates another embodiment in which the top wafer interconnection structure 1201 is bonded to the second semiconductor device 200. In this embodiment, however, instead of the top wafer interconnection structure 1201 being bonded to either the top die interconnection structure 225, the middle die interconnection structure 219, the first die interconnection structure 231, or the first die gate contact 213, the top wafer interconnection structure 1201 is bonded to the first die gate stack 207. In this embodiment the top die interconnection structure 225, the middle die interconnection structure 219, the first die interconnection structure 231, and the first die gate contact 213 are not formed, and the first die gate stack 207 and first die ILD layer 209 are bonded directly to the first wafer bond layer 121 and the first conductive wafer bond material 123 using, e.g., a hybrid bond. For example, the first die ILD layer 209 and the first wafer bond layer 121 are both activated as described above and then placed in physical contact with each other. Heat and pressure are then applied to strengthen the bond.

Additionally, although not explicitly illustrated in FIG. 12G, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 12G may also be utilized in any of the embodiments as described above with respect to FIGS. 7-9, wherein the fourth semiconductor device 700, a second fill material 703, and/or a second interconnect layer 900 are utilized. Any suitable combination of elements may be utilized.

FIG. 12H illustrates another embodiment in which the top wafer interconnection structure 1201 is bonded to the second semiconductor device 200 through the first wafer bonding layer 121. In this embodiment, however, instead of the top wafer interconnection structure 1201 being bonded to the top die interconnection structure 225, the top wafer interconnection structure 1201 is bonded to the middle die interconnection structure 219. In this embodiment the top die interconnection structure 225 is not formed, and the middle die interconnection structure 219 is bonded directly to the first wafer bond layer 121 using, e.g., a hybrid bond. For example, the middle die interconnection structure 219 and the first wafer bond layer 121 are both activated as described above and then placed in physical contact with each other. Heat and pressure are then applied to strengthen the bond.

Additionally, although not explicitly illustrated in FIG. 12H, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 12H may also be utilized in any of the embodiments as described above with respect to FIGS. 7-9, wherein the fourth semiconductor device 700, a second fill material 703, and/or a second interconnect layer 900 are utilized. Any suitable combination may be utilized.

Figure 13A:
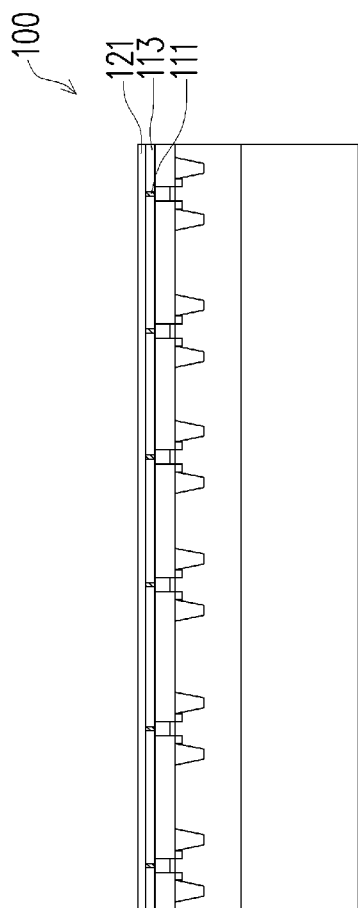
FIGS. 13A-13H illustrates bonding locations of a first wafer gate contact in accordance with some embodiments.

FIG. 13A illustrates another embodiment in which the top die interconnection structure 225 of the second semiconductor device 200 is bonded to the first semiconductor device 100. In this embodiment, however, instead of the top die interconnection structure 225 being bonded to the first wafer bond layer 121 over the first wafer interconnection structure 119 (as described above), the first wafer bond layer 121 is formed over the first wafer gate contact 111 while the top wafer interconnection structure 1201, the middle wafer interconnection structure 1101, and the first wafer interconnection structure 119 are not formed. In this embodiment the first wafer bond layer 121 may be formed over the first wafer gate contact 111 as described above with respect to FIG. 1A. For example, the first wafer bond layer 121 may be a dielectric such as silicon oxide deposited using a method such as CVD. However, any suitable material and method of manufacturing may be utilized.

Figure 13B:
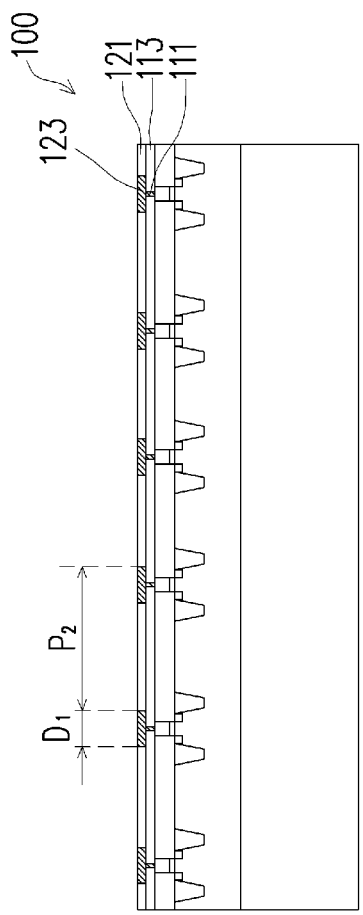

FIG. 13B illustrates a formation of the first conductive wafer bond material 123 within the first wafer bond layer 121 as described above with respect to FIG. 1B. For example, the first wafer bond layer 121 may be patterned utilizing, e.g., a photolithographic masking and etching process to form openings that expose at least a portion of the first wafer gate contact 111, and the openings are then filled with the first conductive wafer bond material 123. However, any suitable method of manufacture may be utilized.

In this embodiment, however, the first conductive wafer bond material 123 may be formed to ensure contact with the underlying first wafer gate contact 111. As such, in an embodiment the first conductive wafer bond material 123 may be formed to have a first distance $D_1$ of between about 1 nm and about 1000 nm, such as about 7 nm. Additionally, the first conductive wafer bond material 123 may be formed to have a second pitch $P_2$ of between about 2 nm and about 2000 nm, such as about 36 nm. However, any suitable dimensions may be utilized.

Figure 13C:
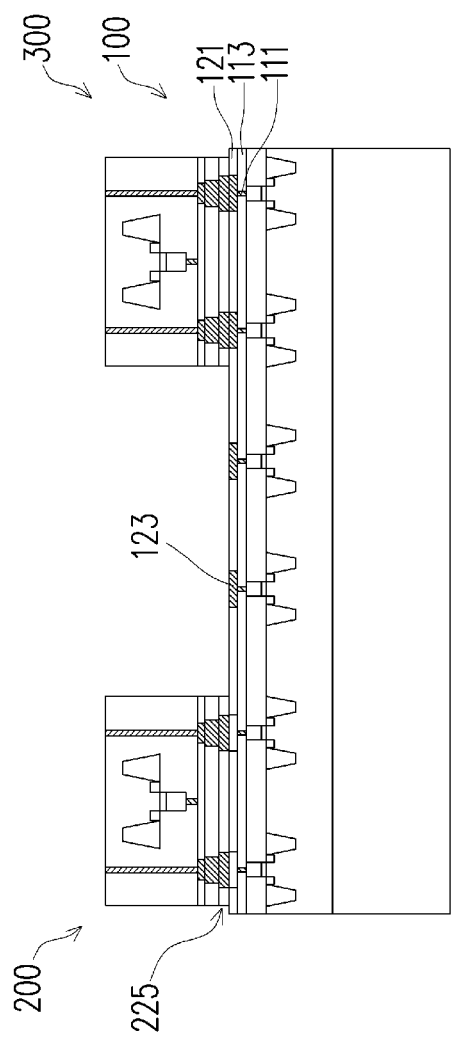

FIG. 13C illustrates that once the first wafer bond layer 121 is formed over the first wafer gate contact 111, the second semiconductor device 200 and the third semiconductor device 300 may be bonded to the first semiconductor device 100 using, e.g. a hybrid bond. In the embodiment illustrated in FIG. 13C, the second semiconductor device 200 and the third semiconductor device 300 both have a top die interconnection structure 225 and the top die interconnection structure 225 is bonded to the first wafer bond layer 121 as described above with respect to FIG. 3. For example, the top die interconnection structure 225 and the first wafer bond layer 121 are both activated and then placed in physical contact with each other. Heat and pressure are then applied to strengthen the bond. However, any suitable bonding process may be utilized.

Figure 13D:
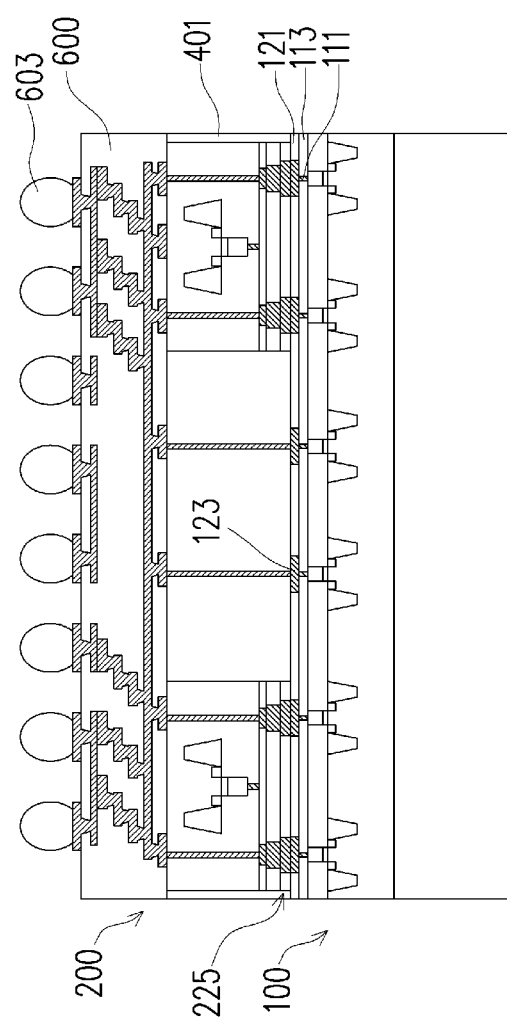

FIG. 13D illustrates that, once the second semiconductor device 200 and the third semiconductor device 300 are bonded to the first semiconductor device 100, the first fill material 401 may be deposited and optional first through fill vias 501 may be formed as described above. Additionally, the first interconnect layer 600 may be formed, and the first external connections 603 may be placed in order to provide external connections. However, any other suitable processes may be utilized.

Additionally, although not explicitly illustrated in FIG. 13D, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 13D may also be utilized in any of the embodiments as described above with respect to FIGS. 7-9, wherein the fourth semiconductor device 700, a second fill material 703, and/or a second interconnect layer 900 are utilized. Any suitable combination of elements may be utilized.

Figure 13E:
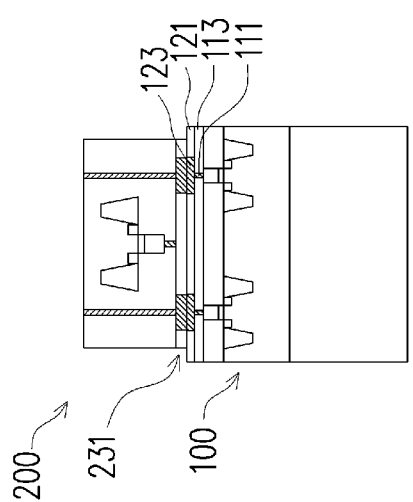

FIG. 13E illustrates another embodiment in which the first wafer gate contact 111 is bonded to the second semiconductor device 200 through the first wafer bonding layer 121. In this embodiment, however, instead of the first wafer gate contact 111 being bonded to the top die interconnection structure 225, the first wafer gate contact 111 is bonded to the first die interconnection structure 231. In this embodiment the top die interconnection structure 225 and the middle die interconnection structure 219 are not formed, and the first die interconnection structure 231 is bonded directly to the first wafer bond layer 121 using, e.g., a hybrid bond. For example, the first die interconnection structure 231 and the first wafer bond layer 121 are both activated as described above and then placed in physical contact with each other. Heat and pressure are then applied to strengthen the bond.

Additionally, although not explicitly illustrated in FIG. 13E, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 13E may also be utilized in any of the embodiments as described above with respect to FIGS. 7-9, wherein the fourth semiconductor device 700, a second fill material 703, and/or a second interconnect layer 900 are utilized. Any suitable combination of elements may be utilized.

Figure 13F:
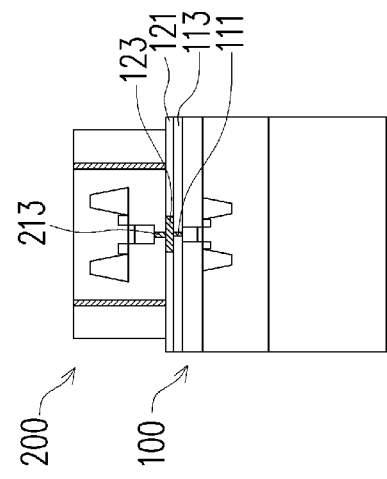

FIG. 13F illustrates another embodiment in which the first wafer gate contact 111 is bonded to the second semiconductor device 200 through the first wafer bonding layer 121. In this embodiment, however, instead of the first wafer gate contact 111 being bonded to either the top die interconnection structure 225, the middle die interconnection structure 219, or the first die interconnection structure 231, the first wafer gate contact 111 is bonded to the first die gate contact 213. In this embodiment the top die interconnection structure 225, the middle die interconnection structure 219, and the first die interconnection structure 231 are not formed, and the first die gate contact 213 and first die gate contact dielectric layer 211 are bonded directly to the first wafer bond layer 121 and first conductive wafer bond material 123 using, e.g., a hybrid bond. For example, the first die gate contact 213 and the first wafer bond layer 121 are both activated as described above and then placed in physical contact with each other. Heat and pressure are then applied to strengthen the bond.

Additionally, although not explicitly illustrated in FIG. 13F, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 13F may also be utilized in any of the embodiments as described above with respect to FIGS. 7-9, wherein the fourth semiconductor device 700, a second fill material 703, and/or a second interconnect layer 900 are utilized. Any suitable combination of elements may be utilized.

Figure 13H:
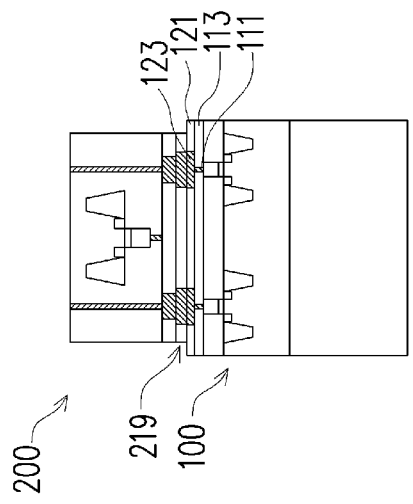
Figure 13G:
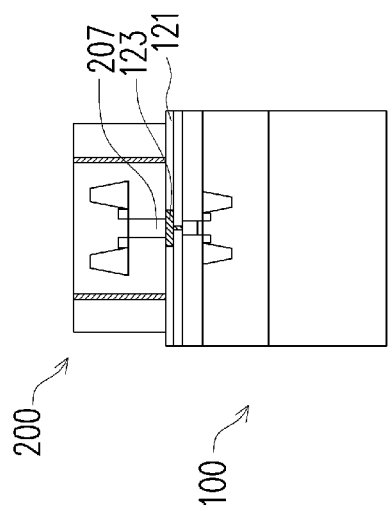

FIG. 13G illustrates another embodiment in which the first wafer gate contact 111 is bonded to the second semiconductor device 200 through the first wafer bonding layer 121. In this embodiment, however, instead of the first wafer gate contact 111 being bonded to either the top die interconnection structure 225, the middle die interconnection structure 219, the first die interconnection structure 231, or the first die gate contact 213, the first wafer gate contact 111 is bonded to the first die gate stack 207. In this embodiment the top die interconnection structure 225, the middle die interconnection structure 219, the first die interconnection structure 231, and the first die gate contact 213 are not formed, and the first die gate stack 207 and first die ILD layer 209 are bonded directly to the first wafer bond layer 121 and the first conductive wafer bond material 123 using, e.g., a hybrid bond. For example, the first die ILD layer 209 and the first wafer bond layer 121 are both activated as described above and then placed in physical contact with each other. Heat and pressure are then applied to strengthen the bond.

Additionally, although not explicitly illustrated in FIG. 13G, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 13G may also be utilized in any of the embodiments as described above with respect to FIGS. 7-9, wherein the fourth semiconductor device 700, a second fill material 703, and/or a second interconnect layer 900 are utilized. Any suitable combination of elements may be utilized.

FIG. 13H illustrates another embodiment in which the first wafer gate contact 111 is bonded to the second semiconductor device 200 through the first wafer bonding layer 121. In this embodiment, however, instead of the first wafer gate contact 111 being bonded to the top die interconnection structure 225, the first wafer gate contact 111 is bonded to the middle die interconnection structure 219. In this embodiment the top die interconnection structure 225 is not formed, and the middle die interconnection structure 219 is bonded directly to the first wafer bond layer 121 using, e.g., a hybrid bond. For example, the middle die interconnection structure 219 and the first wafer bond layer 121 are both activated as described above and then placed in physical contact with each other. Heat and pressure are then applied to strengthen the bond.

Additionally, although not explicitly illustrated in FIG. 13H, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 13H may also be utilized in any of the embodiments as described above with respect to FIGS. 7-9, wherein the fourth semiconductor device 700, a second fill material 703, and/or a second interconnect layer 900 are utilized. Any suitable combination may be utilized.

FIG. 14A illustrates another embodiment in which the top die interconnection structure 225 of the second semiconductor device 200 is bonded to the first semiconductor device 100. In this embodiment, however, instead of the top die interconnection structure 225 being bonded to the first wafer bond layer 121 over the first wafer interconnection structure 119 (as described above), the first wafer bond layer 121 is formed over the first wafer gate stack 109 while the top wafer interconnection structure 1201, the middle wafer interconnection structure 1101, the first wafer interconnection structure 119, and the first wafer gate contact 111 are not formed. In this embodiment the first wafer bond layer 121 may be formed over the first wafer gate stack 109 as described above with respect to FIG. 1A. For example, the first wafer bond layer 121 may be a dielectric such as silicon oxide deposited using a method such as CVD. However, any suitable material and method of manufacturing may be utilized.

FIG. 14B illustrates a formation of the first conductive wafer bond material 123 within the first wafer bond layer 121 as described above with respect to FIG. 1B. For example, the first wafer bond layer 121 may be patterned utilizing, e.g., a photolithographic masking and etching process to form openings that expose at least a portion of the first wafer gate stack 109, and the openings are then filled with the first conductive wafer bond material 123. However, any suitable method of manufacture may be utilized.

In this embodiment, however, the first conductive wafer bond material 123 may be formed to ensure contact with the underlying first wafer gate stack 109. As such, in an embodiment the first conductive wafer bond material 123 may be formed to have a second distance $D_2$ of between about 1 nm and about 1000 nm, such as about 7 nm. Additionally, the first conductive wafer bond material 123 may be formed to have a third pitch $P_3$ of between about 2 nm and about 2000 nm, such as about 36 nm. However, any suitable dimensions may be utilized.

Figure 14C:
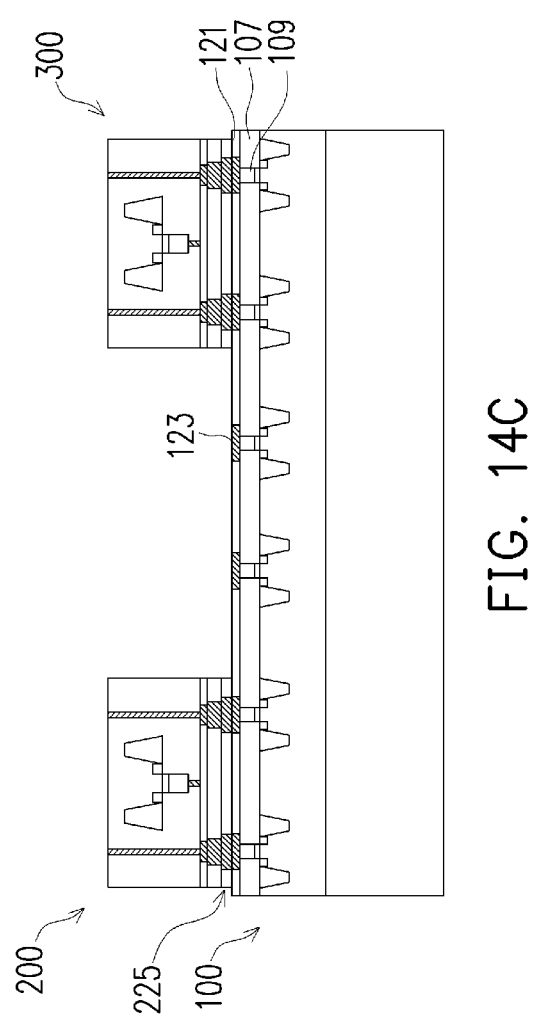

FIG. 14C illustrates that once the first wafer bond layer 121 is formed over the first wafer gate stack 109, the second semiconductor device 200 and the third semiconductor device 300 may be bonded to the first semiconductor device 100 using, e.g. a hybrid bond. In the embodiment illustrated in FIG. 14C, the second semiconductor device 200 and the third semiconductor device 300 both have a top die interconnection structure 225 and the top die interconnection structure 225 is bonded to the first wafer bond layer 121 as described above with respect to FIG. 3. For example, the top die interconnection structure 225 and the first wafer bond layer 121 are both activated and then placed in physical contact with each other. Heat and pressure are then applied to strengthen the bond. However, any suitable bonding process may be utilized.

Figure 14D:
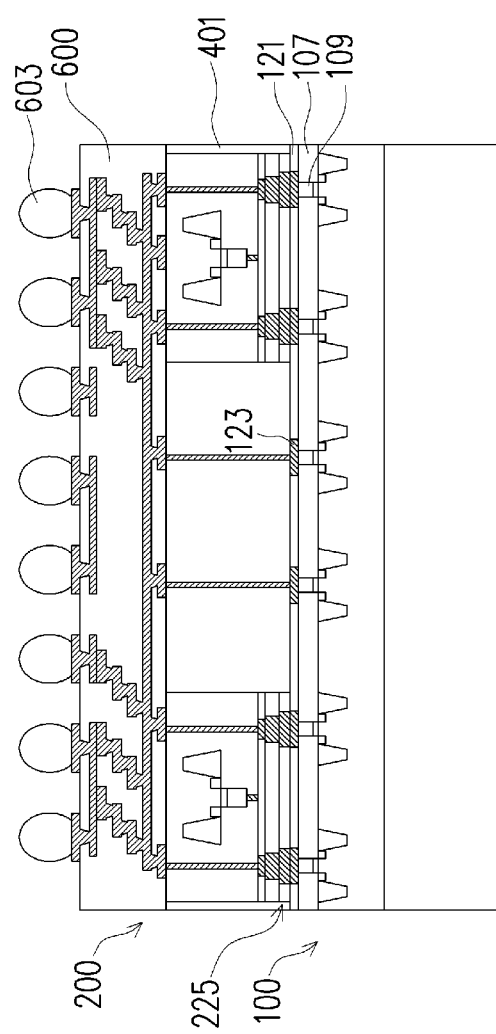

FIG. 14D illustrates that, once the second semiconductor device 200 and the third semiconductor device 300 are bonded, the first fill material 401 may be deposited and optional first through fill vias 501 may be formed as described above. Additionally, the first interconnect layer 600 may be formed, and the first external connections 603 may be placed in order to provide external connections. However, any other suitable processes may be utilized.

Additionally, although not explicitly illustrated in FIG. 14D, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 14D may also be utilized in any of the embodiments as described above with respect to FIGS. 7-9, wherein the fourth semiconductor device 700, a second fill material 703, and/or a second interconnect layer 900 are utilized. Any suitable combination of elements may be utilized.

Figure 14F:
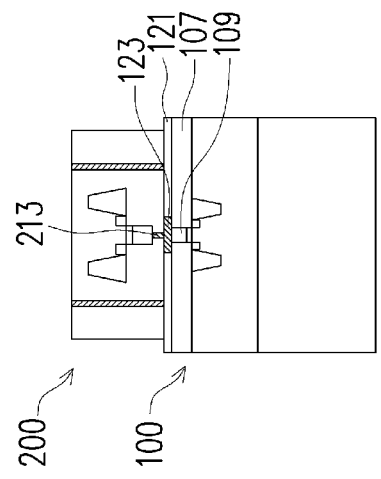
Figure 14E:
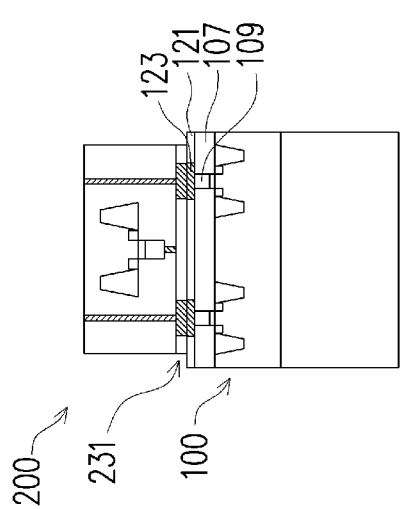

FIG. 14E illustrates another embodiment in which the first wafer gate contact 111 is bonded to the second semiconductor device 200 through the first wafer bonding layer 121. In this embodiment, however, instead of the first wafer gate stack 109 being bonded to the top die interconnection structure 225, the first wafer gate stack 109 is bonded to the first die interconnection structure 231. In this embodiment the top die interconnection structure 225 and the middle die interconnection structure 219 are not formed, and the first die interconnection structure 231 is bonded directly to the first wafer bond layer 121 using, e.g., a hybrid bond. For example, the first die interconnection structure 231 and the first wafer bond layer 121 are both activated as described above and then placed in physical contact with each other. Heat and pressure are then applied to strengthen the bond.

Additionally, although not explicitly illustrated in FIG. 14E, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 14E may also be utilized in any of the embodiments as described above with respect to FIGS. 7-9, wherein the fourth semiconductor device 700, a second fill material 703, and/or a second interconnect layer 900 are utilized. Any suitable combination of elements may be utilized.

FIG. 14F illustrates another embodiment in which the first wafer gate contact 111 is bonded to the second semiconductor device 200 through the first wafer bonding layer 121. In this embodiment, however, instead of the first wafer gate contact 111 being bonded to either the top die interconnection structure 225, the middle die interconnection structure 219, or the first die interconnection structure 231, the first wafer gate stack 109 is bonded to the first die gate contact 213. In this embodiment the top die interconnection structure 225, the middle die interconnection structure 219, and the first die interconnection structure 231 are not formed, and the first die gate contact 213 and the first die gate contact dielectric layer 211 are bonded directly to the first wafer bond layer 121 and the first conductive wafer bond material 123 using, e.g., a hybrid bond. For example, the first die gate contact dielectric layer 211 and the first wafer bond layer 121 are both activated as described above and then placed in physical contact with each other. Heat and pressure are then applied to strengthen the bond.

Additionally, although not explicitly illustrated in FIG. 14F, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 14F may also be utilized in any of the embodiments as described above with respect to FIGS. 7-9, wherein the fourth semiconductor device 700, a second fill material 703, and/or a second interconnect layer 900 are utilized.

Figure 14H:
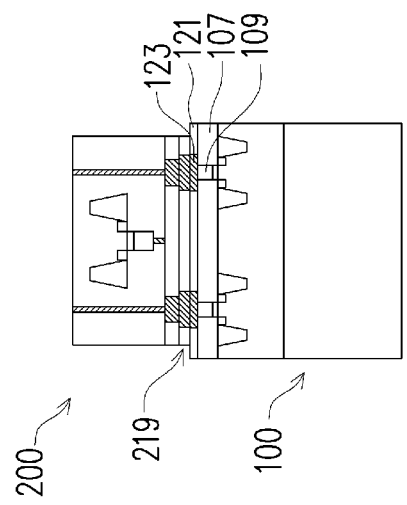
Figure 14G:
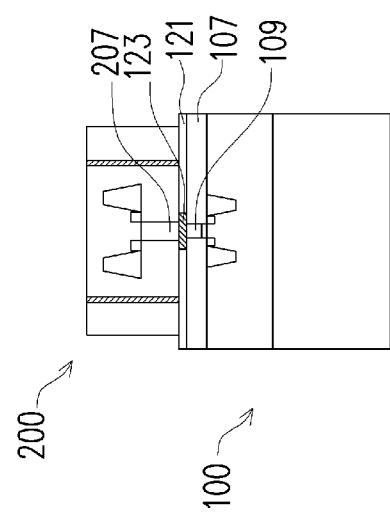

FIG. 14G illustrates another embodiment in which the first wafer gate stack 109 is bonded to the second semiconductor device 200 through the first wafer bonding layer 121. In this embodiment, however, instead of the first wafer gate stack 109 being bonded to either the top die interconnection structure 225, the middle die interconnection structure 219, the first die interconnection structure 231, or the first die gate contact 213, the first wafer gate stack 109 is bonded to the first die gate stack 207. In this embodiment the top die interconnection structure 225, the middle die interconnection structure 219, the first die interconnection structure 231, and the first die gate contact 213 are not formed, and the first die gate stack 207 and first die ILD layer 209 are bonded directly to the first wafer bond layer 121 and the first conductive wafer bond material 123 using, e.g., a hybrid bond. For example, the first die ILD layer 209 and the first wafer bond layer 121 are both activated as described above and then placed in physical contact with each other. Heat and pressure are then applied to strengthen the bond.

Additionally, although not explicitly illustrated in FIG. 14G, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 14G may also be utilized in any of the embodiments as described above with respect to FIGS. 7-9, wherein the fourth semiconductor device 700, a second fill material 703, and/or a second interconnect layer 900 are utilized. Any suitable combination may be utilized.

FIG. 14H illustrates another embodiment in which the first wafer gate stack 109 is bonded to the second semiconductor device 200 through the first wafer bonding layer 121. In this embodiment, however, instead of the first wafer gate stack 109 being bonded to the top die interconnection structure 225, the first wafer gate stack 109 is bonded to the middle die interconnection structure 219. In this embodiment the top die interconnection structure 225, is not formed, and the middle die interconnection structure 219 is bonded directly to the first wafer bond layer 121 using, e.g., a hybrid bond. For example, the middle die interconnection structure 219 and the first wafer bond layer 121 are both activated as described above and then placed in physical contact with each other. Heat and pressure are then applied to strengthen the bond.

Additionally, although not explicitly illustrated in FIG. 14H, once the second semiconductor device 200 is bonded to the first semiconductor device 100, the third semiconductor device 300 may be bonded as well, the first fill material 401 may be deposited, the first through fill vias 501 may be formed, the first interconnect layer 600 may be formed, and the first external connections 603 may be formed as described above with respect to FIGS. 3-6. Similarly, the embodiment in FIG. 14H may also be utilized in any of the embodiments as described above with respect to FIGS. 7-9, wherein the fourth semiconductor device 700, a second fill material 703, and/or a second interconnect layer 900 are utilized. Any suitable combination may be utilized.

Figure 15A:
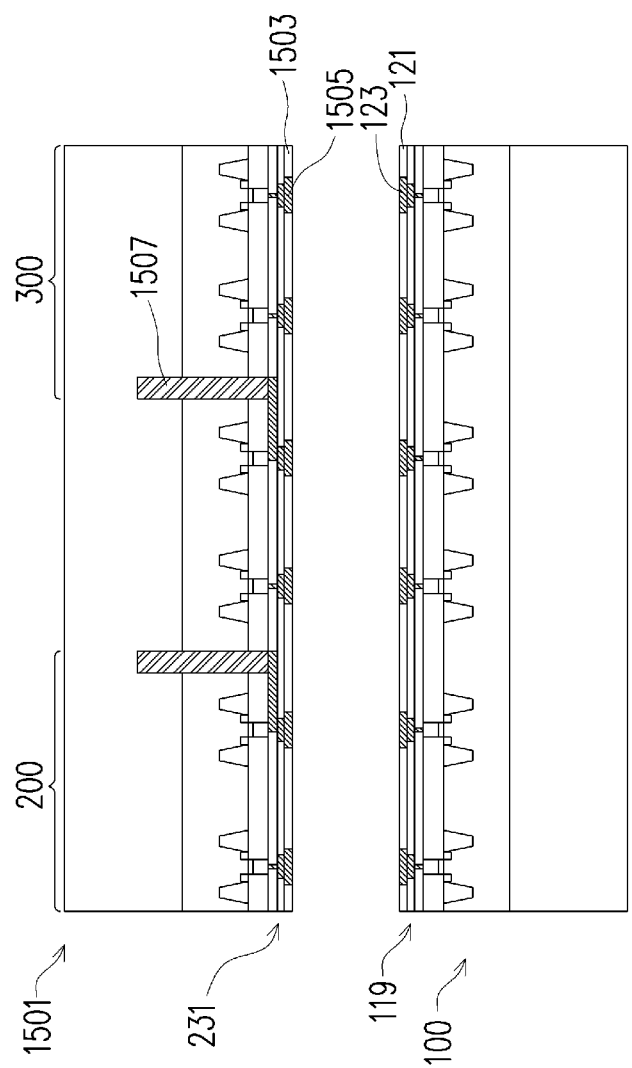
FIGS. 15A-15H illustrate wafer to wafer bonding locations of a first wafer metallization layer in accordance with some embodiments.

FIG. 15A illustrates another embodiment in which the first semiconductor device 100 is a wafer and is homogenously bonded to the second semiconductor device 200 and the third semiconductor device 300 while the second semiconductor device 200 and the third semiconductor device 300 are part of a second wafer 1501 before singulation. In this embodiment the second semiconductor device 200 and the third semiconductor device 300 are formed as described above with respect to FIGS. 2 and 3. For example, each of the second semiconductor device 200 and the third semiconductor device 300 may be formed with the first die gate stacks 207, the first die gate contacts 213, and the first die interconnection structure 231. However, the second wafer 1501 has not been singulated prior to the bonding of the second wafer 1501 to the first wafer of the first semiconductor device 100.

Additionally in this embodiment, second through substrate vias 1507 may be formed in the second wafer 1501. In an embodiment the second through substrate vias 1507 may be formed in a similar fashion and using similar materials as the first through substrate vias 202 (described above with respect to FIG. 2). For example, an opening is formed to extend into the first die substrate 201 and then filled with barrier layers and conductive materials to fill and/or overfill the opening. Excess material is then removed using, e.g., a planarization process such as chemical mechanical polishing.

A second wafer bond layer 1503 may be formed on the first die interconnection structure 231 on the second wafer 1501. In an embodiment the second wafer bond layer 1503 may be formed from similar materials and in a similar fashion as the first wafer bond layer 121 as described above with respect to FIG. 1A. For example, the second wafer bond layer 1503 may be a bonding material such as silicon oxide that is deposited using a deposition process such as CVD. However, any suitable material and method of manufacture may be utilized.

Once the second wafer bond layer 1503 has been formed, a second conductive wafer bond material 1505 may be formed within the second wafer bond layer 1503. In an embodiment the second conductive wafer bond material 1505 may be formed from similar material and in a similar fashion as the first conductive wafer bond material 123 (described above with respect to FIG. 1A). For example, the second conductive wafer bond material 1505 may be formed by initially patterning the second wafer bond layer 1503 to form openings, and then filling and/or overfilling the openings with a material such as copper before removing excess material outside of the openings with a planarization process such as chemical mechanical polishing. However, any suitable material and method of manufacture may be utilized.

Figure 15B:
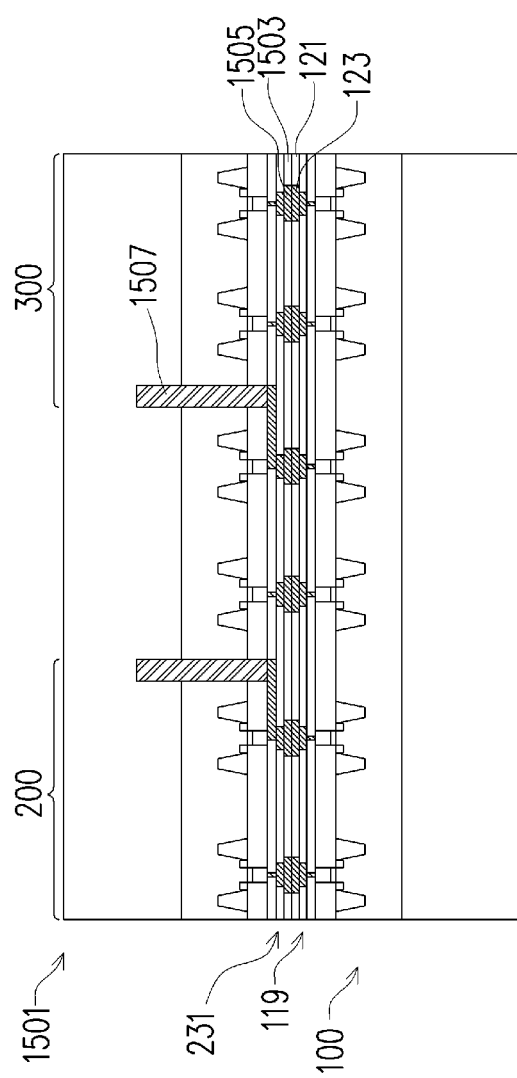

FIG. 15B illustrates that, once the second conductive wafer bond material 1505 has been formed, the second conductive wafer bond material 1505 and the second wafer bond layer 1503 may be bonded to the first conductive wafer bond material 123 and first wafer bond layer 121, respectively using, for example, a hybrid bond as described above with respect to FIG. 3. For example, the surfaces of the second wafer bond layer 1503 and the first wafer bond layer 121 may be activated and aligned together before being placed into physical contact with each other. Then, heat and pressure may be applied in order to strengthen the bonding and ensure that the second conductive wafer bond material 1505 is bonded to the first conductive wafer bond material 123. However, any suitable bonding process may be utilized.

Figure 15C:
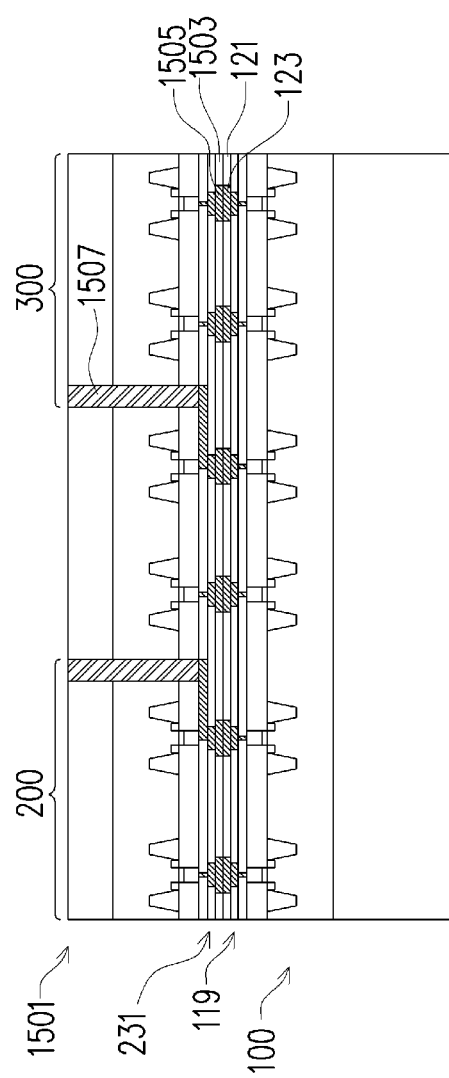

FIG. 15C illustrates a thinning of the first die substrate 201 of the second wafer 1501 in order to expose the second through substrate vias 1507. In an embodiment the second wafer 1501 may be thinned using a planarization process such as chemical mechanical planarization. However, any other suitable planarization process, such as grinding or even a series of one or more etches, may also be utilized.

Figure 15D:
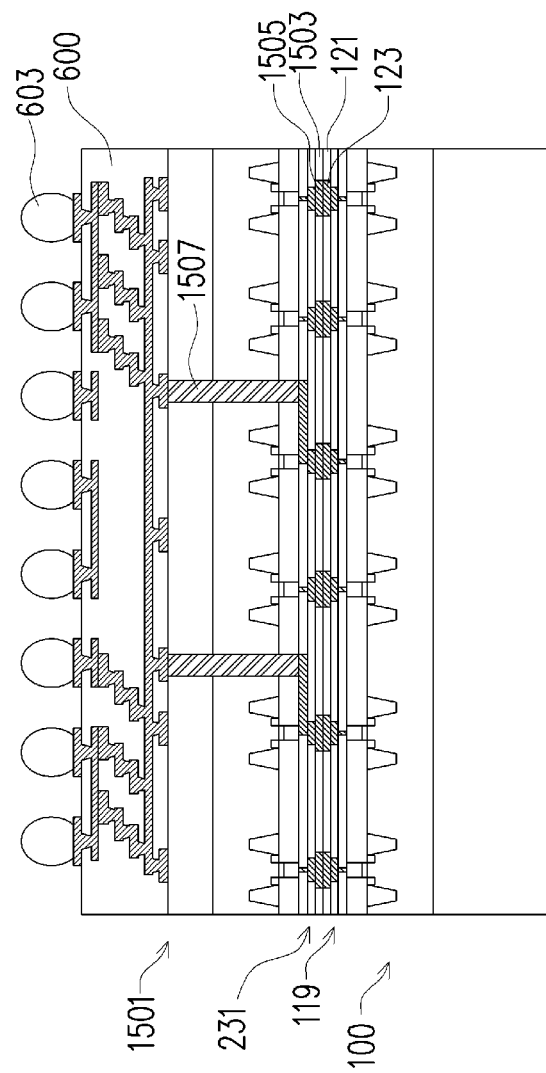

FIG. 15D illustrates that, once the second through substrate vias 1507 have been exposed, the first interconnect layer 600 may be formed over the backside of the second wafer 1501 and in electrical connection with the second through substrate vias 1507. In an embodiment the first interconnect layer 600 may be formed as described above with respect to FIG. 6. For example, dielectric layers may be deposited and patterned, and the resulting openings may be filled with conductive material using either a damascene or dual damascene process. However, the first interconnect layer 600 may be formed using any suitable materials and processes.

FIG. 15D additionally illustrates the formation and/or placement of the first external connections 603 in connection with the first interconnect layer 600. In an embodiment the first external connections 603 may be formed as described above with respect to FIG. 4. However, any suitable material and method of manufacture may be utilized.

Figure 15E:
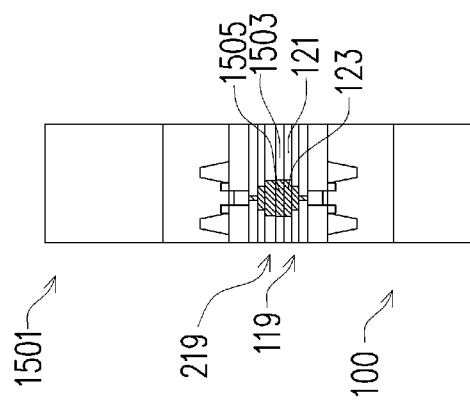

FIG. 15E illustrates another embodiment in which a homogenous, wafer-to-wafer bond is formed between the first semiconductor device 100 and the second wafer 1501. In this embodiment, however, instead of the first wafer interconnection structure 119 being bonded to the first die interconnection structure 231 (as described above with respect to FIGS. 15A-15D), the first wafer interconnection structure 119 is bonded to the top die interconnection structure 225. For example, as illustrated in FIG. 15E, the first wafer interconnection structure 119 (on the first semiconductor device 100) is bonded to the top die interconnection structure 225 (on the second wafer 1501). For example, the first wafer bond layer 121 (and its associated first conductive wafer bond material 123) may be formed on the first wafer interconnection structure 119 and the second wafer bond layer 1503 (and its associated second conductive wafer bond material 1505) may be formed on the top die interconnection structure 225.

Once the first wafer bond layer 121 and the second wafer bond layer 1503 have been formed, the first wafer interconnection structure 119 and the top die interconnection structure 225 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 15E, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

Figure 15F:
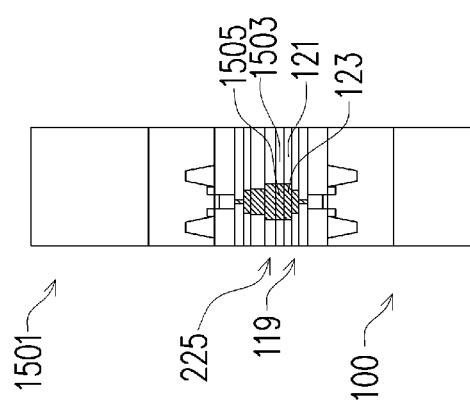

FIG. 15F illustrates another embodiment in which a homogenous, wafer-to-wafer bond is formed between the first semiconductor device 100 and the second wafer 1501. In this embodiment, however, instead of the first semiconductor device 100 being bonded to the first die interconnection structure 231 (as described above with respect to FIGS. 15A-15D), the first semiconductor device 100 is bonded to the middle die interconnection structure 219. For example, as illustrated in FIG. 15F, the middle die interconnection structure 219 (on the second wafer 1501) is bonded to the first wafer interconnection structure 119 (on the first semiconductor device 100). For example, the first wafer bond layer 121 (and its associated first conductive wafer bond material 123) may be formed on the first wafer interconnection structure 119 and the second wafer bond layer 1503 (and its associated second conductive wafer bond material 1505) may be formed on the middle die interconnection structure 219.

Once the first wafer bond layer 121 and the second wafer bond layer 1503 have been formed, the middle die interconnection structure 219 and the first wafer interconnection structure 119 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 15F, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

Figure 15G:
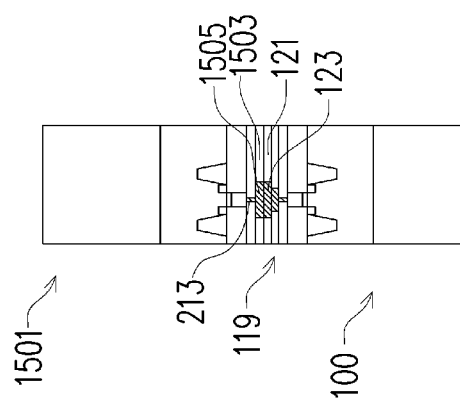

FIG. 15G illustrates another embodiment in which a homogenous, wafer-to-wafer bond is formed between the first semiconductor device 100 and the second wafer 1501. In this embodiment, however, instead of the first semiconductor device 100 being bonded to the first die interconnection structure 231 (as described above with respect to FIGS. 15A-15D), the first semiconductor device 100 is bonded to the first die gate contact 213. For example, as illustrated in FIG. 15G, the first die gate contact 213 (on the second wafer 1501) is bonded to the first wafer interconnection structure 119 (on the first semiconductor device 100). For example, the first wafer bond layer 121 (and its associated first conductive wafer bond material 123) may be formed on the first wafer interconnection structure 119 and the second wafer bond layer 1503 (and its associated second conductive wafer bond material 1505) may be formed on the first die gate contact 213.

Once the first wafer bond layer 121 and the second wafer bond layer 1503 have been formed, the first die gate contact 213 and the first wafer interconnection structure 119 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 15G, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

Figure 15H:
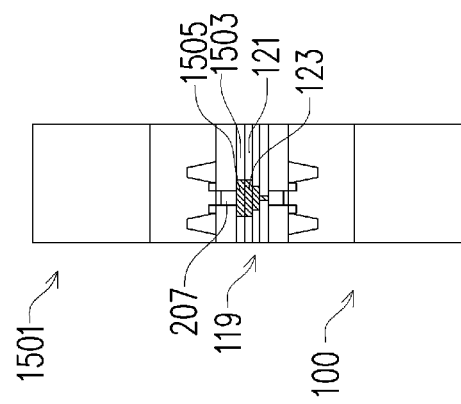

FIG. 15H illustrates another embodiment in which a homogenous, wafer-to-wafer bond is formed between the first semiconductor device 100 and the second wafer 1501. In this embodiment, however, instead of the first semiconductor device 100 being bonded to the first die interconnection structure 231 (as described above with respect to FIGS. 15A-15D), the first semiconductor device 100 is bonded to the first die gate stack 207. For example, as illustrated in FIG. 15H, the first die gate stack 207 (on the second wafer 1501) is bonded to the first wafer interconnection structure 119 (on the first semiconductor device 100). For example, the first wafer bond layer 121 (and its associated first conductive wafer bond material 123) may be formed on the first wafer interconnection structure 119 and the second wafer bond layer 1503 (and its associated second conductive wafer bond material 1505) may be formed on the first die gate stack 207.

Once the first wafer bond layer 121 and the second wafer bond layer 1503 have been formed, the first die gate stack 207 and the first wafer interconnection structure 119 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 15H, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

Figure 16A:
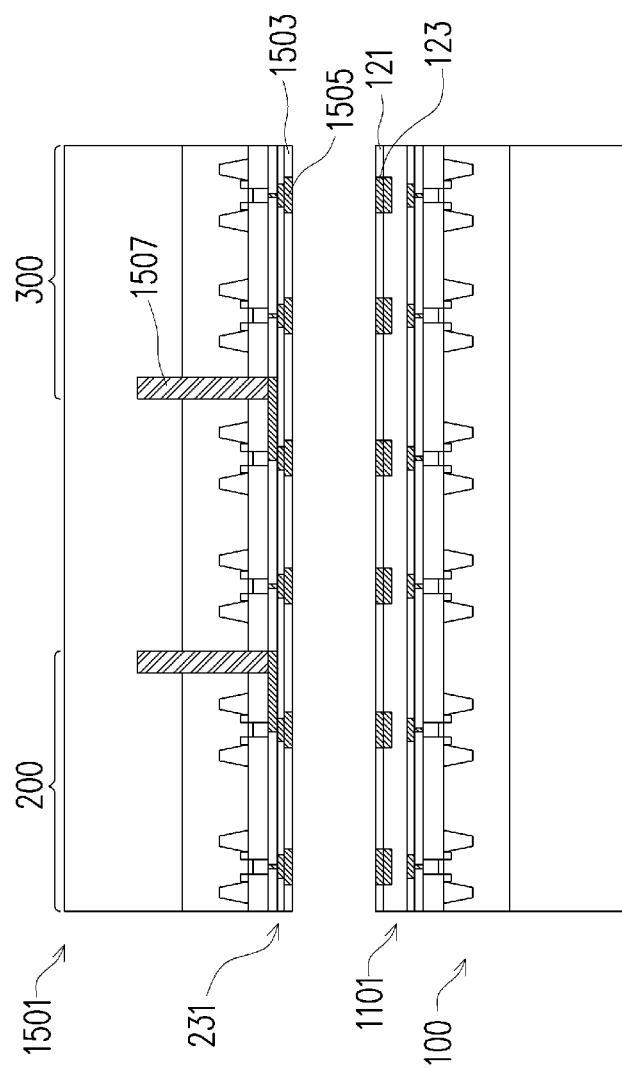
FIGS. 16A-16H illustrate wafer to wafer bonding locations of a middle wafer metallization layer in accordance with some embodiments.

FIG. 16A illustrates another embodiment in which the first semiconductor device 100 is a wafer and is homogenously bonded to the second semiconductor device 200 and the third semiconductor device 300 while the second semiconductor device 200 and the third semiconductor device 300 are part of a second wafer 1501 before singulation. In this embodiment the second wafer bond layer 1503 may be formed on the first die interconnection structure 231 on the second wafer 1501. In an embodiment the second wafer bond layer 1503 may be formed from similar materials and in a similar fashion as the first wafer bond layer 121 as described above with respect to FIG. 1A. For example, the first wafer bond layer 121 may be a bonding material such as silicon oxide that is deposited using a deposition process such as CVD. However, any suitable material and method of manufacture may be utilized.

Once the second wafer bond layer 1503 has been formed, the second conductive wafer bond material 1505 may be formed within the second wafer bond layer 1503. In an embodiment the second conductive wafer bond material 1505 may be formed from similar material and in a similar fashion as the first conductive wafer bond material 123 (described above with respect to FIG. 1A). For example, the second conductive wafer bond material 1505 may be formed by initially patterning the second wafer bond layer 1503 to form openings, and then filling and/or overfilling the openings with a material such as copper before removing excess material outside of the openings with a planarization process such as chemical mechanical polishing. However, any suitable material and method of manufacture may be utilized.

Figure 16B:
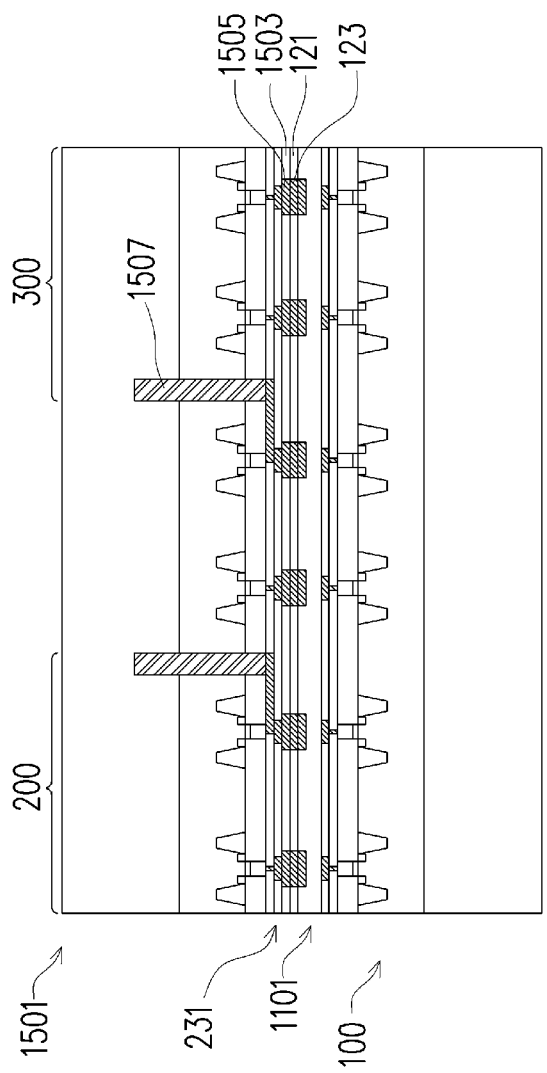

FIG. 16B illustrates that, once the second conductive wafer bond material 1505 has been formed, the second conductive wafer bond material 1505 and the second wafer bond layer 1503 may be bonded to the first conductive wafer bond material 123 and the first wafer bond layer 121, respectively using, for example, a hybrid bond as described above with respect to FIG. 3. For example, the surfaces of the second wafer bond layer 1503 and the first wafer bond layer 121 may be activated and aligned together before being placed into physical contact with each other. Then, heat and pressure may be applied in order to strengthen the bonding and ensure that the second conductive wafer bond material 1505 is bonded to the first conductive wafer bond material 123. However, any suitable bonding process may be utilized.

Figure 16C:
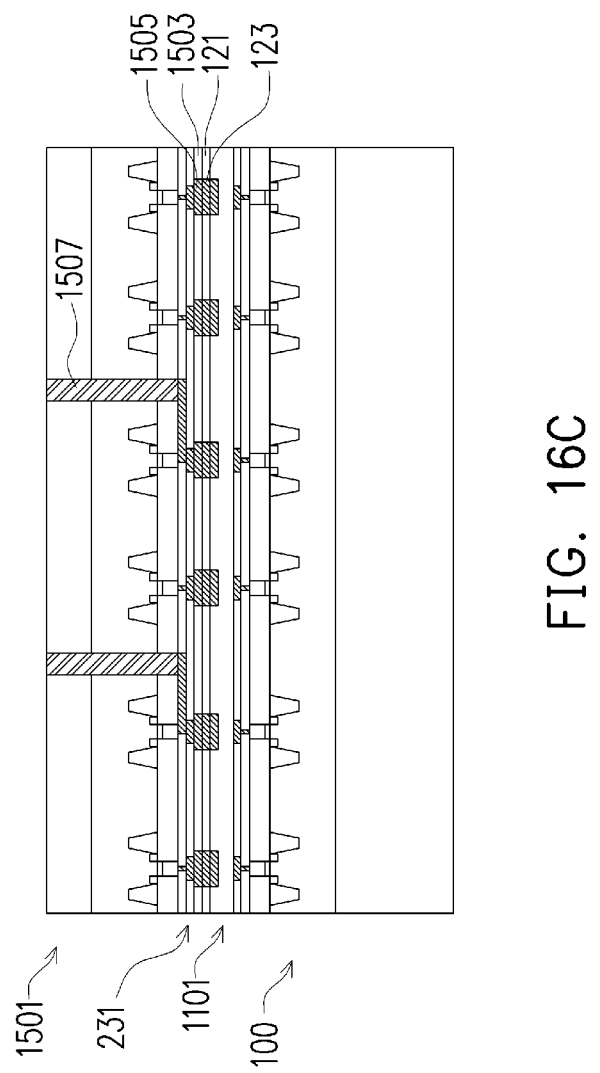

FIG. 16C illustrates a thinning of the second substrate of the second wafer 1501 in order to expose the second through substrate vias 1507. In an embodiment the second wafer 1501 may be thinned using a planarization process such as chemical mechanical planarization. However, any other suitable planarization process, such as grinding or even a series of one or more etches, may also be utilized.

Figure 16D:
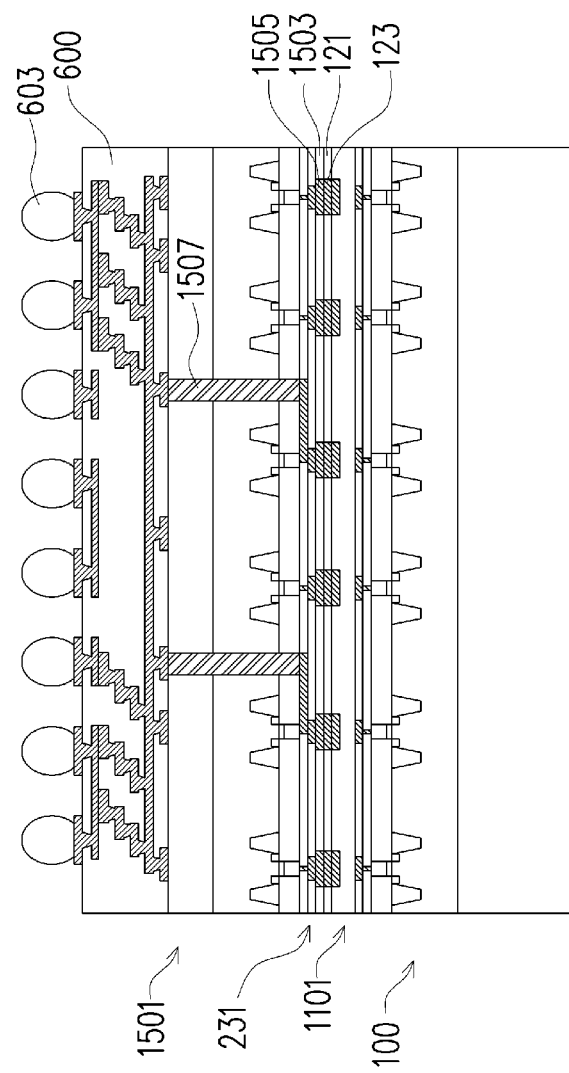

FIG. 16D illustrates that, once the second through substrate vias 1507 have been exposed, the first interconnect layer 600 may be formed over the backside of the second wafer 1501 and in electrical connection with the second through substrate vias 1507. In an embodiment the first interconnect layer 600 may be formed as described above with respect to FIG. 6. However, the first interconnect layer 600 may be formed using any suitable materials and processes.

FIG. 16D additionally illustrates the formation and/or placement of the first external connections 603 in connection with the first interconnect layer 600. In an embodiment the first external connections 603 may be formed as described above with respect to FIG. 6. However, any suitable material and method of manufacture may be utilized.

Figure 16E:
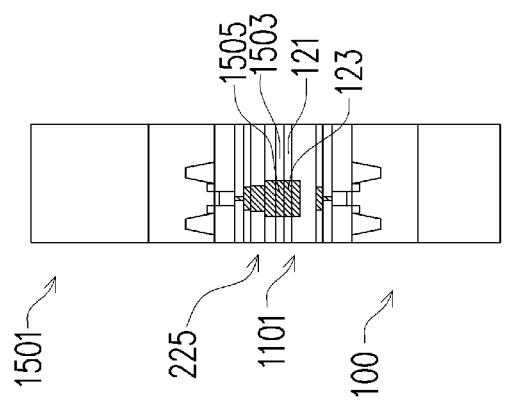
Figure 16F:
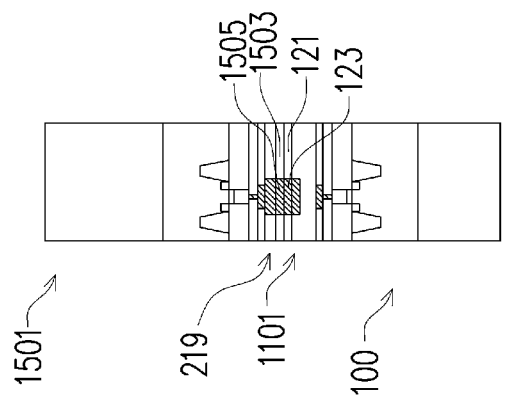

FIG. 16E illustrates another embodiment in which a homogenous, wafer-to-wafer bond is formed between the first semiconductor device 100 and the second wafer 1501. In this embodiment, however, instead of the middle wafer interconnection structure 1101 being bonded to the first die interconnection structure 231 (as described above with respect to FIGS. 16A-16D), the middle wafer interconnection structure 1101 is bonded to the top die interconnection structure 225. For example, as illustrated in FIG. 16F, the middle wafer interconnection structure 1101 (on the first semiconductor device 100) is bonded to the top die interconnection structure 225 (on the second wafer 1501). For example, the first wafer bond layer 121 (and its associated first conductive wafer bond material 123) may be formed on the middle wafer interconnection structure 1101 and the second wafer bond layer 1503 (and its associated second conductive wafer bond material 1505) may be formed on the top die interconnection structure 225.

Once the first wafer bond layer 121 and the second wafer bond layer 1503 have been formed, the middle wafer interconnection structure 1101 and the top die interconnection structure 225 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 16F, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

FIG. 16F illustrates another embodiment in which a homogenous, wafer-to-wafer bond is formed between the first semiconductor device 100 and the second wafer 1501. In this embodiment, however, instead of the first semiconductor device 100 being bonded to the first die interconnection structure 231 (as described above with respect to FIGS. 16A-16D), the first semiconductor device 100 is bonded to the middle die interconnection structure 219. For example, as illustrated in FIG. 16F, the middle die interconnection structure 219 (on the second wafer 1501) is bonded to the middle wafer interconnection structure 1101 (on the first semiconductor device 100). For example, the first wafer bond layer 121 (and its associated first conductive wafer bond material 123) may be formed on the middle wafer interconnection structure 1101 and the second wafer bond layer 1503 (and its associated second conductive wafer bond material 1505) may be formed on the middle die interconnection structure 219.

Once the first wafer bond layer 121 and the second wafer bond layer 1503 have been formed, the middle die interconnection structure 219 and the middle wafer interconnection structure 1101 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 16F, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

Figure 16H:
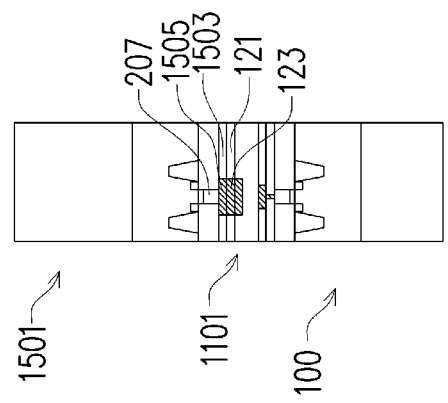
Figure 16G:
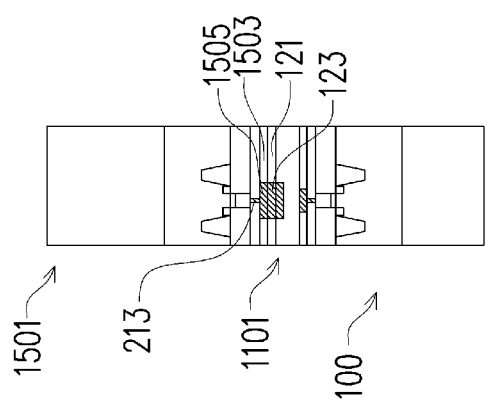

FIG. 16G illustrates another embodiment in which a homogenous, wafer-to-wafer bond is formed between the first semiconductor device 100 and the second wafer 1501. In this embodiment, however, instead of the first semiconductor device 100 being bonded to the first die interconnection structure 231 (as described above with respect to FIGS. 16A-16D), the first semiconductor device 100 is bonded to the first die gate contact 213. For example, as illustrated in FIG. 16G, the first die gate contact 213 (on the second wafer 1501) is bonded to the middle wafer interconnection structure 1101 (on the first semiconductor device 100). For example, the first wafer bond layer 121 (and its associated first conductive wafer bond material 123) may be formed on the middle wafer interconnection structure 1101 and the second wafer bond layer 1503 (and its associated second conductive wafer bond material 1505) may be formed on the first die gate contact 213.

Once the first wafer bond layer 121 and the second wafer bond layer 1503 have been formed, the first die gate contact 213 and the middle wafer interconnection structure 1101 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 16G, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

FIG. 16H illustrates another embodiment in which a homogenous, wafer-to-wafer bond is formed between the first semiconductor device 100 and the second wafer 1501. In this embodiment, however, instead of the first semiconductor device 100 being bonded to the first die interconnection structure 231 (as described above with respect to FIGS. 16A-16D), the first semiconductor device 100 is bonded to the first die gate stack 207. For example, as illustrated in FIG. 16H, the first die gate stack 207 (on the second wafer 1501) is bonded to the middle wafer interconnection structure 1101 (on the first semiconductor device 100). For example, the first wafer bond layer 121 (and its associated first conductive wafer bond material 123) may be formed on the middle wafer interconnection structure 1101 and the second wafer bond layer 1503 (and its associated second conductive wafer bond material 1505) may be formed on the first die gate stack 207.

Once the first wafer bond layer 121 and the second wafer bond layer 1503 have been formed, the first die gate stack 207 and the middle wafer interconnection structure 1101 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 16G, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

Figure 17A:
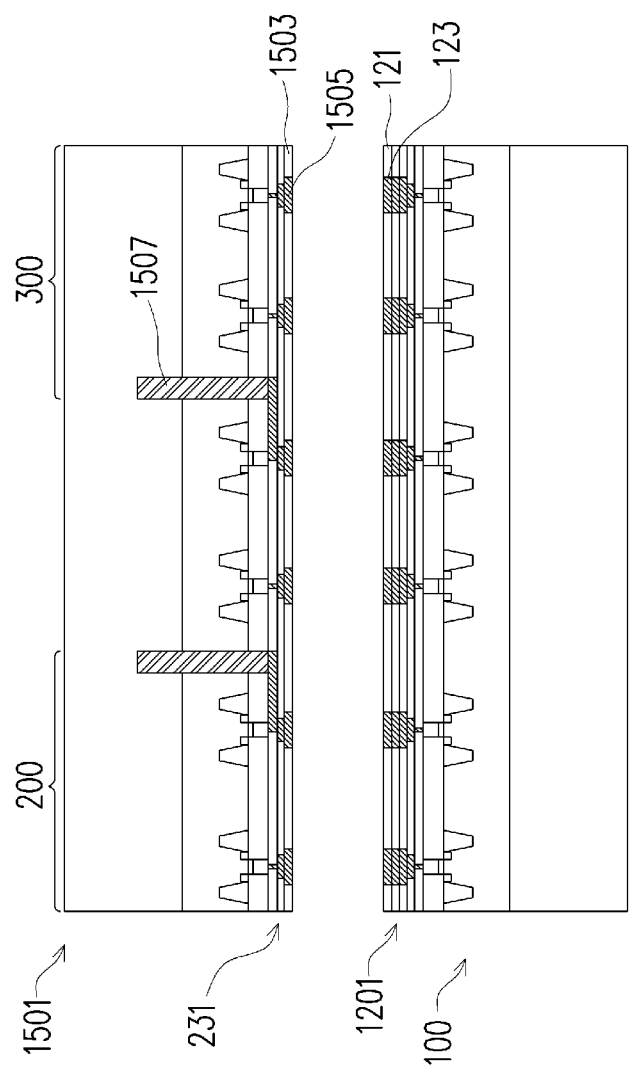

FIG. 17A illustrates another embodiment in which the first semiconductor device 100 is a wafer and is homogenously bonded to the second semiconductor device 200 and the third semiconductor device 300 while the second semiconductor device 200 and the third semiconductor device 300 are part of the second wafer 1501 before singulation. In this embodiment the second wafer bond layer 1503 may be formed on the first die interconnection structure 231 on the second wafer 1501. In an embodiment the second wafer bond layer 1503 may be formed from similar materials and in a similar fashion as the first wafer bond layer 121 as described above with respect to FIG. 1A. For example, the first wafer bond layer 121 may be a bonding material such as silicon oxide that is deposited using a deposition process such as CVD. However, any suitable material and method of manufacture may be utilized.

Once the second wafer bond layer 1503 has been formed, the second conductive wafer bond material 1505 may be formed within the second wafer bond layer 1503. In an embodiment the second conductive wafer bond material 1505 may be formed from similar material and in a similar fashion as the first conductive wafer bond material 123 (described above with respect to FIG. 1A). For example, the second conductive wafer bond material 1505 may be formed by initially patterning the second wafer bond layer 1503 to form openings, and then filling and/or overfilling the openings with a material such as copper before removing excess material outside of the openings with a planarization process such as chemical mechanical polishing. However, any suitable material and method of manufacture may be utilized.

Figure 17B:
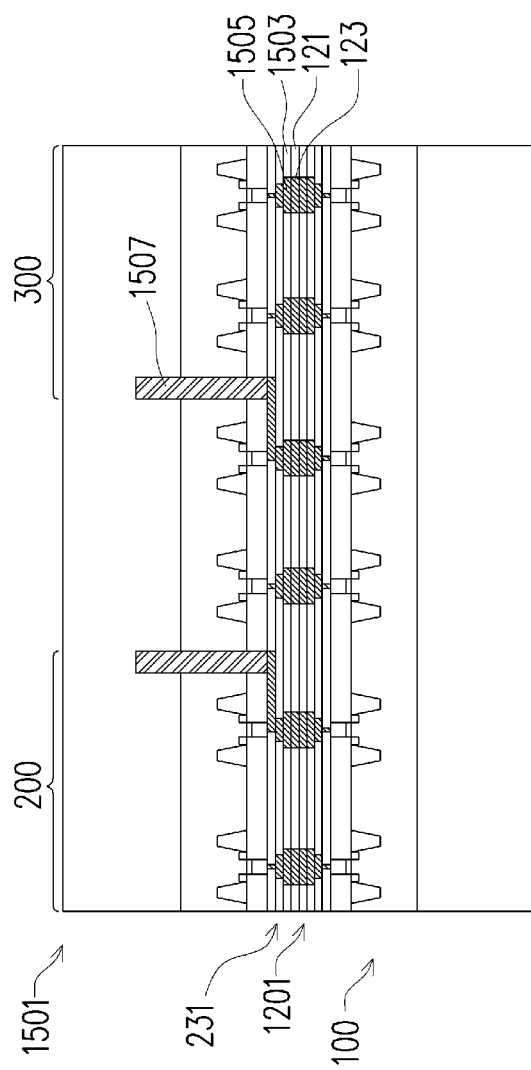

FIG. 17B illustrates that, once the second conductive wafer bond material 1505 has been formed, the second conductive wafer bond material 1505 and the second wafer bond layer 1503 may be bonded to the first conductive wafer bond material 123 and first wafer bond layer 121, respectively using, for example, a hybrid bond as described above with respect to FIG. 3. For example, the surfaces of the second wafer bond layer 1503 and the first wafer bond layer 121 may be activated and aligned together before being placed into physical contact with each other. Then, heat and pressure may be applied in order to strengthen the bonding and ensure that the second conductive wafer bond material 1505 is bonded to the first conductive wafer bond material 123. However, any suitable bonding process may be utilized.

Figure 17C:
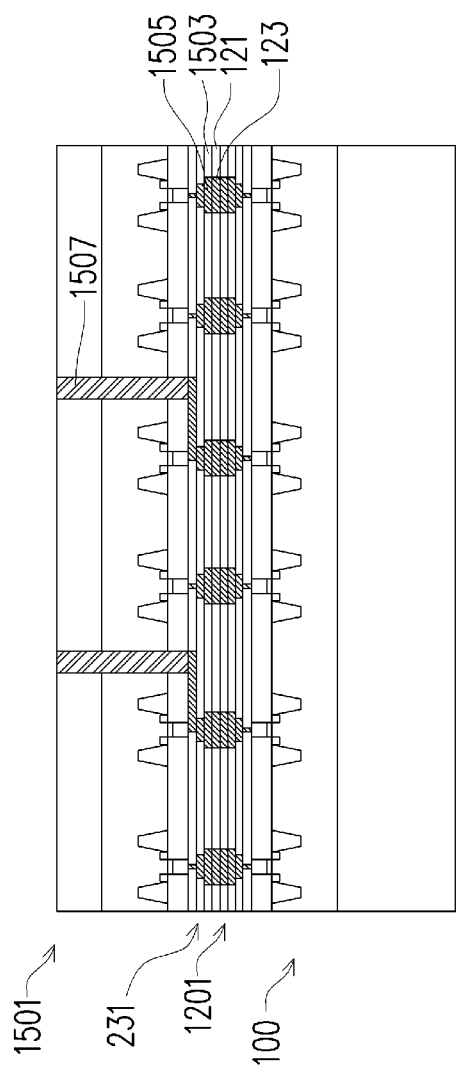

FIG. 17C illustrates a thinning of the second substrate of the second wafer 1501 in order to expose the second through substrate vias 1507. In an embodiment the second wafer 1501 may be thinned using a planarization process such as chemical mechanical planarization. However, any other suitable planarization process, such as grinding or even a series of one or more etches, may also be utilized.

Figure 17D:
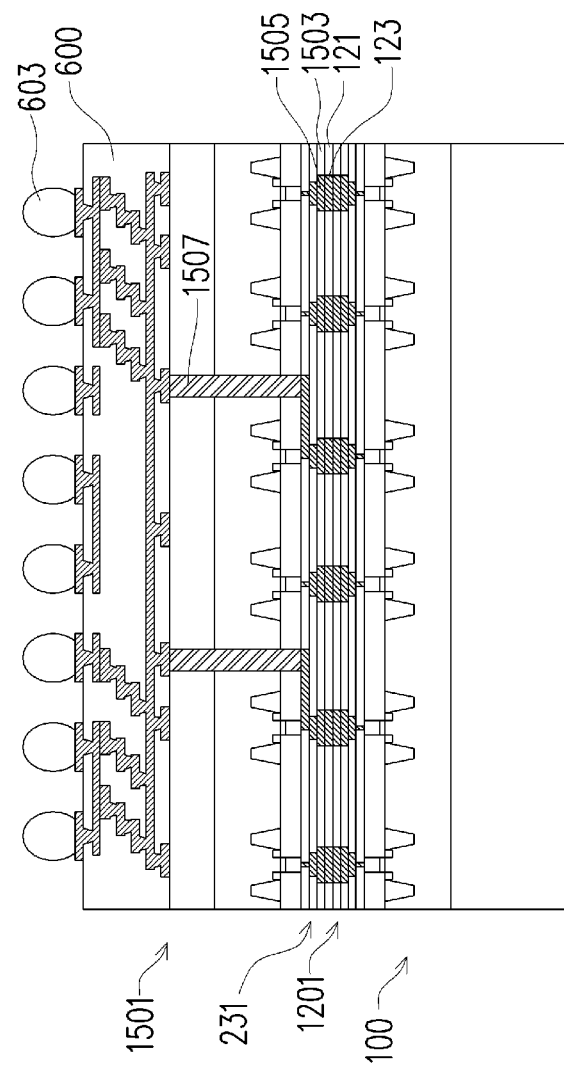

FIG. 17D illustrates that, once the second through substrate vias 1507 have been exposed, the first interconnect layer 600 may be formed over the backside of the second wafer 1501 and in electrical connection with the second through substrate vias 1507. In an embodiment the first interconnect layer 600 may be formed as described above with respect to FIG. 6. However, the first interconnect layer 600 may be formed using any suitable materials and processes.

FIG. 17D additionally illustrates the formation and/or placement of the first external connections 603 in connection with the first interconnect layer 600. In an embodiment the first external connections 603 may be formed as described above with respect to FIG. 6. However, any suitable material and method of manufacture may be utilized.

FIG. 17E illustrates another embodiment in which a homogenous, wafer-to-wafer bond is formed between the first semiconductor device 100 and the second wafer 1501. In this embodiment, however, instead of the first semiconductor device 100 being bonded to the first die interconnection structure 231 (as described above with respect to FIGS. 17A-17D), the first semiconductor device 100 is bonded to the middle die interconnection structure 219. For example, as illustrated in FIG. 17E, the middle die interconnection structure 219 (on the second wafer 1501) is bonded to the top wafer interconnection structure 1201 (on the first semiconductor device 100). For example, the first wafer bond layer 121 (and its associated first conductive wafer bond material 123) may be formed on the top wafer interconnection structure 1201 and the second wafer bond layer 1503 (and its associated second conductive wafer bond material 1505) may be formed on the middle die interconnection structure 219.

Once the first wafer bond layer 121 and the second wafer bond layer 1503 have been formed, the middle die interconnection structure 219 and the top wafer interconnection structure 1201 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 17E, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

FIG. 17F illustrates another embodiment in which a homogenous, wafer-to-wafer bond is formed between the first semiconductor device 100 and the second wafer 1501. In this embodiment, however, instead of the first semiconductor device 100 being bonded to the first die interconnection structure 231 (as described above with respect to FIGS. 17A-17D), the first semiconductor device 100 is bonded to the first die gate contact 213. For example, as illustrated in FIG. 17F, the first die gate contact 213 (on the second wafer 1501) is bonded to the top wafer interconnection structure 1201 (on the first semiconductor device 100). For example, the first wafer bond layer 121 (and its associated first conductive wafer bond material 123) may be formed on the top wafer interconnection structure 1201 and the second wafer bond layer 1503 (and its associated second conductive wafer bond material 1505) may be formed on the first die gate contact 213.

Once the first wafer bond layer 121 and the second wafer bond layer 1503 have been formed, the first die gate contact 213 and the top wafer interconnection structure 1201 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 17F, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

FIG. 17G illustrates another embodiment in which a homogenous, wafer-to-wafer bond is formed between the first semiconductor device 100 and the second wafer 1501. In this embodiment, however, instead of the first semiconductor device 100 being bonded to the first die interconnection structure 231 (as described above with respect to FIGS. 17A-17D), the first semiconductor device 100 is bonded to the first die gate stack 207. For example, as illustrated in FIG. 17G, the first die gate stack 207 (on the second wafer 1501) is bonded to the top wafer interconnection structure 1201 (on the first semiconductor device 100). For example, the first wafer bond layer 121 (and its associated first conductive wafer bond material 123) may be formed on the top wafer interconnection structure 1201 and the second wafer bond layer 1503 (and its associated second conductive wafer bond material 1505) may be formed on the first die gate stack 207.

Once the first wafer bond layer 121 and the second wafer bond layer 1503 have been formed, the first die gate stack 207 and the top wafer interconnection structure 1201 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 17G, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

Figure 18A:
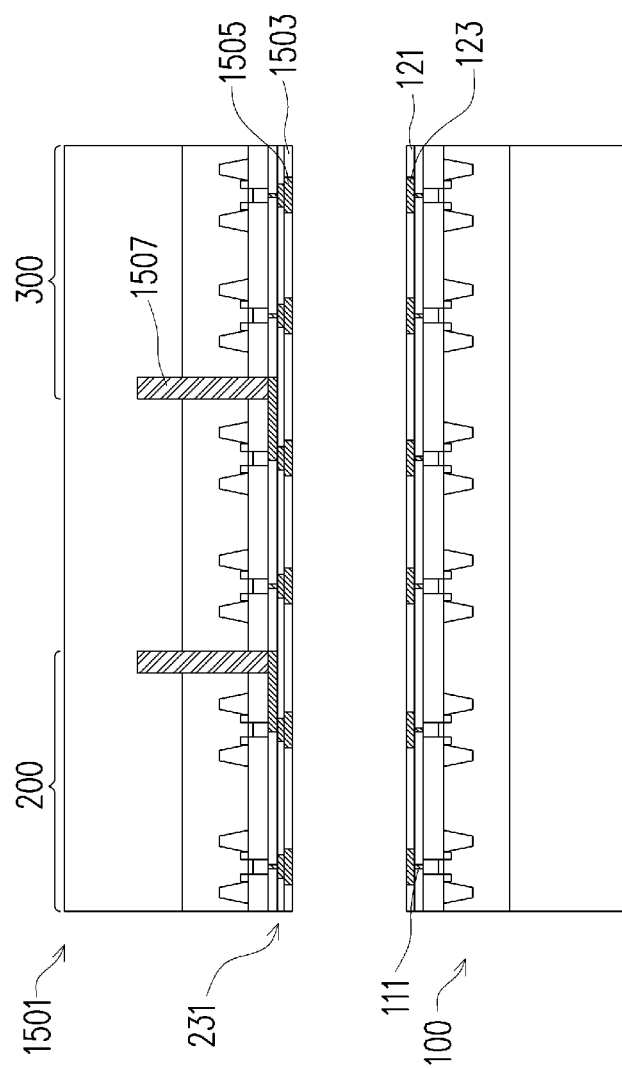

FIG. 18A illustrates another embodiment in which the first semiconductor device 100 is a wafer and is homogenously bonded to the second semiconductor device 200 and the third semiconductor device 300 while the second semiconductor device 200 and the third semiconductor device 300 are part of the second wafer 1501 before singulation. In this embodiment the second wafer bond layer 1503 may be formed on the first die interconnection structure 231 on the second wafer 1501. In an embodiment the second wafer bond layer 1503 may be formed from similar materials and in a similar fashion as the first wafer bond layer 121 as described above with respect to FIG. 1A. For example, the first wafer bond layer 121 may be a bonding material such as silicon oxide that is deposited using a deposition process such as CVD. However, any suitable material and method of manufacture may be utilized.

Once the second wafer bond layer 1503 has been formed, the second conductive wafer bond material 1505 may be formed within the second wafer bond layer 1503. In an embodiment the second conductive wafer bond material 1505 may be formed from similar material and in a similar fashion as the first conductive wafer bond material 123 (described above with respect to FIG. 1A). For example, the second conductive wafer bond material 1505 may be formed by initially patterning the second wafer bond layer 1503 to form openings, and then filling and/or overfilling the openings with a material such as copper before removing excess material outside of the openings with a planarization process such as chemical mechanical polishing. However, any suitable material and method of manufacture may be utilized.

Figure 18B:
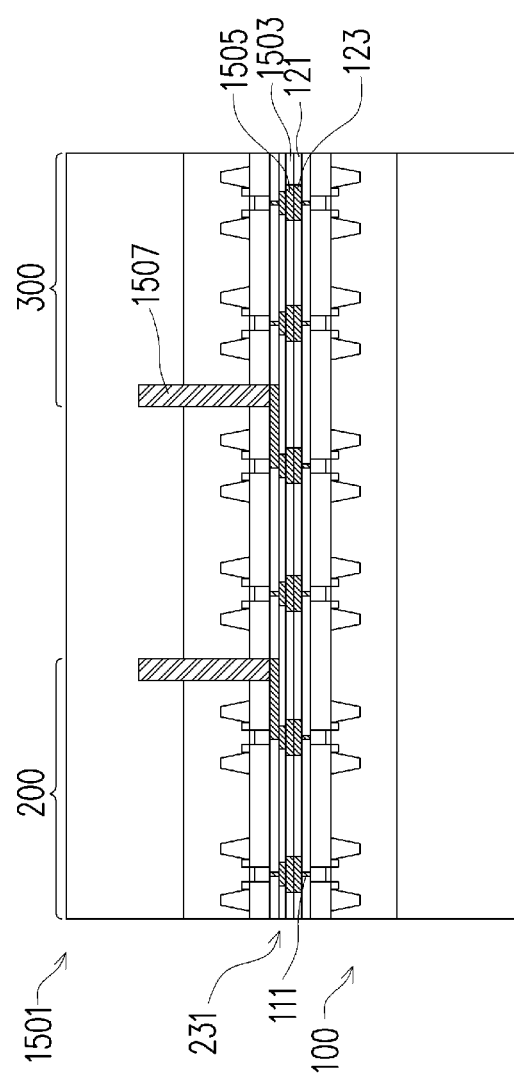

FIG. 18B illustrates that, once the second conductive wafer bond material 1505 has been formed, the second conductive wafer bond material 1505 and the second wafer bond layer 1503 may be bonded to the first conductive wafer bond material 123 and first wafer bond layer 121, respectively using, for example, a hybrid bond as described above with respect to FIG. 3. For example, the surfaces of the second wafer bond layer 1503 and the first wafer bond layer 121 may be activated and aligned together before being placed into physical contact with each other. Then, heat and pressure may be applied in order to strengthen the bonding and ensure that the second conductive wafer bond material 1505 is bonded to the first conductive wafer bond material 123. However, any suitable bonding process may be utilized.

Figure 18C:
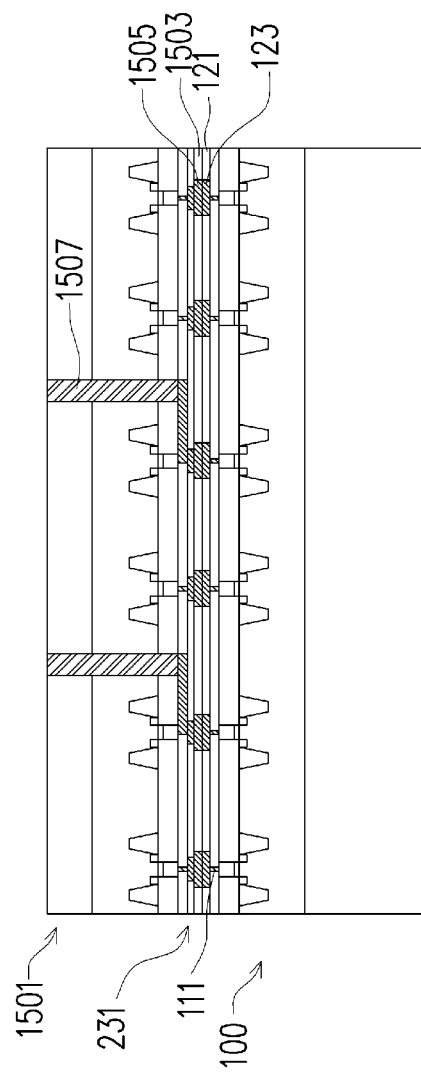

FIG. 18C illustrates a thinning of the second substrate of the second wafer 1501 in order to expose the second through substrate vias 1507. In an embodiment the second wafer 1501 may be thinned using a planarization process such as chemical mechanical planarization. However, any other suitable planarization process, such as grinding or even a series of one or more etches, may also be utilized.

Figure 18D:
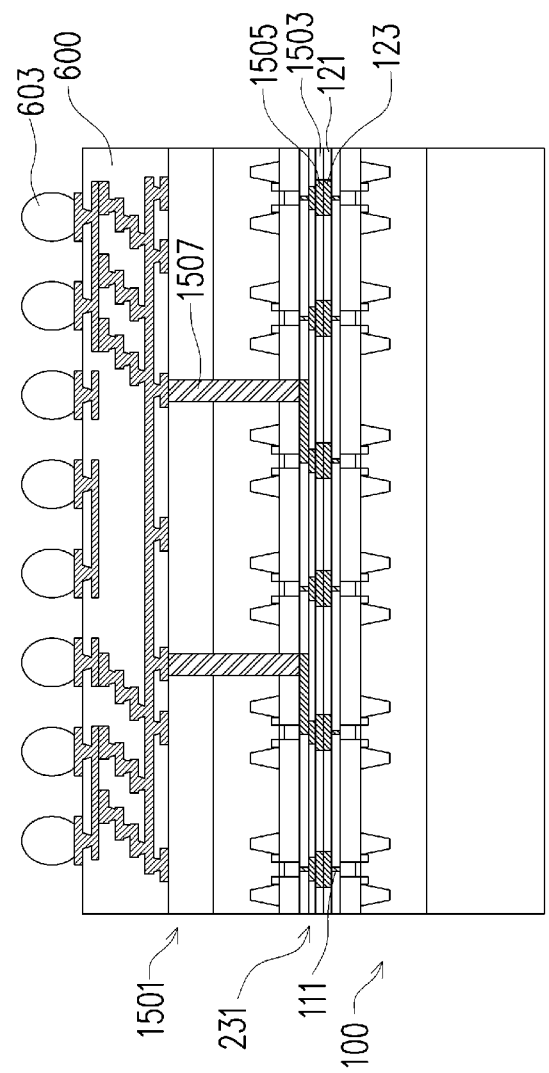

FIG. 18D illustrates that, once the second through substrate vias 1507 have been exposed, the first interconnect layer 600 may be formed over the backside of the second wafer 1501 and in electrical connection with the second through substrate vias 1507. In an embodiment the first interconnect layer 600 may be formed as described above with respect to FIG. 6. However, the first interconnect layer 600 may be formed using any suitable materials and processes.

FIG. 18D additionally illustrates the formation and/or placement of the first external connections 603 in connection with the first interconnect layer 600. In an embodiment the first external connections 603 may be formed as described above with respect to FIG. 6. However, any suitable material and method of manufacture may be utilized.

FIG. 18E illustrates another embodiment in which a homogenous, wafer-to-wafer bond is formed between the first semiconductor device 100 and the second wafer 1501. In this embodiment, however, instead of the first wafer gate contact 111 being bonded to the first die interconnection structure 231 (as described above with respect to FIGS. 18A-18D), the first wafer gate contact 111 is bonded to the top die interconnection structure 225. For example, as illustrated in FIG. 18E, the first wafer gate contact 111 (on the first semiconductor device 100) is bonded to the top die interconnection structure 225 (on the second wafer 1501). For example, the first wafer bond layer 121 (and its associated first conductive wafer bond material 123) may be formed on the first wafer gate contact 111 and the second wafer bond layer 1503 (and its associated second conductive wafer bond material 1505) may be formed on the top die interconnection structure 225.

Once the first wafer bond layer 121 and the second wafer bond layer 1503 have been formed, the first wafer gate contact 111 and the top die interconnection structure 225 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 18E, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

FIG. 18F illustrates another embodiment in which a homogenous, wafer-to-wafer bond is formed between the first semiconductor device 100 and the second wafer 1501. In this embodiment, however, instead of the first semiconductor device 100 being bonded to the first die interconnection structure 231 (as described above with respect to FIGS. 18A-18D), the first semiconductor device 100 is bonded to the middle die interconnection structure 219. For example, as illustrated in FIG. 18F, the middle die interconnection structure 219 (on the second wafer 1501) is bonded to the first wafer gate contact 111 (on the first semiconductor device 100). For example, the first wafer bond layer 121 (and its associated first conductive wafer bond material 123) may be formed on the first wafer gate contact 111 and the second wafer bond layer 1503 (and its associated second conductive wafer bond material 1505) may be formed on the middle die interconnection structure 219.

Once the first wafer bond layer 121 and the second wafer bond layer 1503 have been formed, the middle die interconnection structure 219 and the first wafer gate contact 111 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 18F, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

Figure 18G:
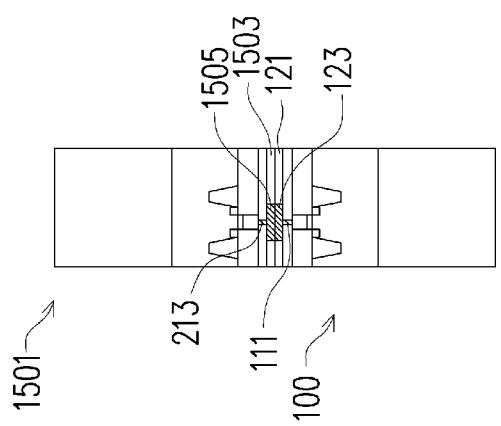

FIG. 18G illustrates another embodiment in which a homogenous, wafer-to-wafer bond is formed between the first semiconductor device 100 and the second wafer 1501. In this embodiment, however, instead of the first semiconductor device 100 being bonded to the first die interconnection structure 231 (as described above with respect to FIGS. 18A-18D), the first semiconductor device 100 is bonded to the first die gate contact 213. For example, as illustrated in FIG. 18G, the first die gate contact 213 (on the second wafer 1501) is bonded to the first wafer gate contact 111 (on the first semiconductor device 100). For example, the first wafer bond layer 121 (and its associated first conductive wafer bond material 123) may be formed on the first wafer gate contact 111 and the second wafer bond layer 1503 (and its associated second conductive wafer bond material 1505) may be formed on the first die gate contact 213.

Once the first wafer bond layer 121 and the second wafer bond layer 1503 have been formed, the first die gate contact 213 and the first wafer gate contact 111 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 18G, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

Figure 18H:
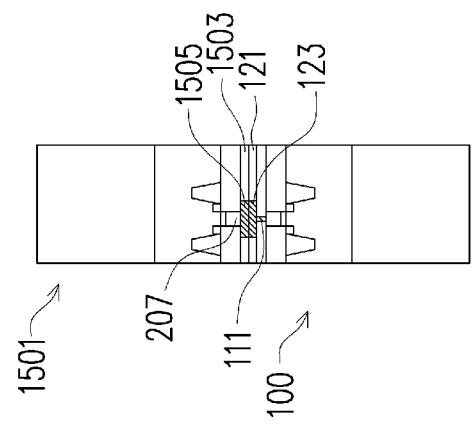

FIG. 18H illustrates another embodiment in which a homogenous, wafer-to-wafer bond is formed between the first semiconductor device 100 and the second wafer 1501. In this embodiment, however, instead of the first semiconductor device 100 being bonded to the first die interconnection structure 231 (as described above with respect to FIGS. 18A-18D), the first semiconductor device 100 is bonded to the first die gate stack 207. For example, as illustrated in FIG. 18H, the first die gate stack 207 (on the second wafer 1501) is bonded to the first wafer gate contact 111 (on the first semiconductor device 100). For example, the first wafer bond layer 121 (and its associated first conductive wafer bond material 123) may be formed on the first wafer gate contact 111 and the second wafer bond layer 1503 (and its associated second conductive wafer bond material 1505) may be formed on the first die gate stack 207.

Once the first wafer bond layer 121 and the second wafer bond layer 1503 have been formed, the first die gate stack 207 and the first wafer gate contact 111 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 18H, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

Figure 19A:
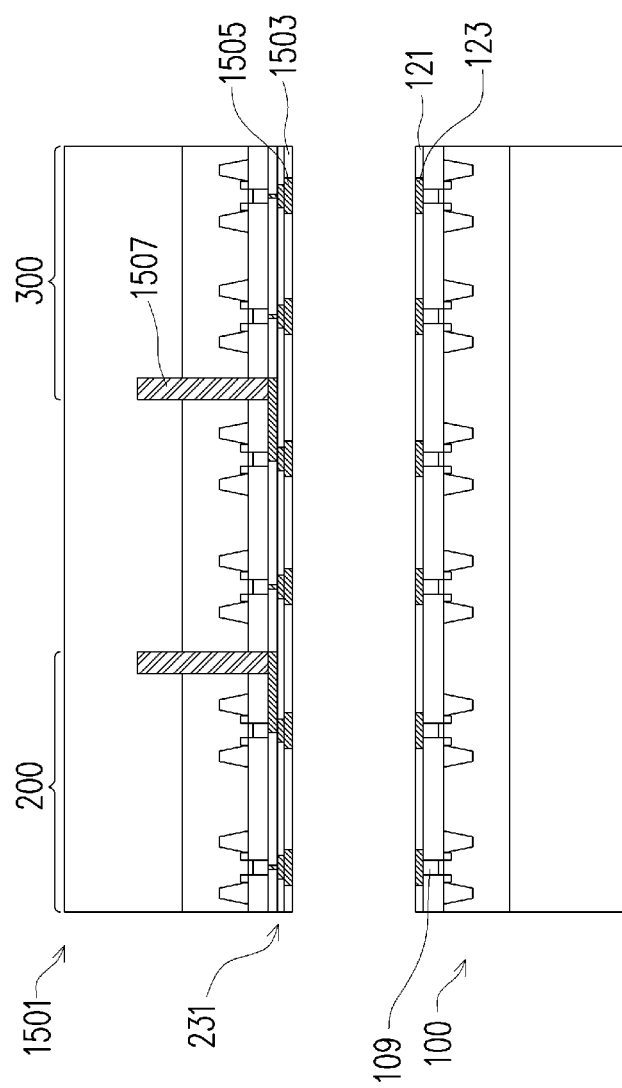

FIG. 19A illustrates another embodiment in which the first semiconductor device 100 is a wafer and is homogenously bonded to the second semiconductor device 200 and the third semiconductor device 300 while the second semiconductor device 200 and the third semiconductor device 300 are part of the second wafer 1501 before singulation. In this embodiment the second wafer bond layer 1503 may be formed on the first die interconnection structure 231 on the second wafer 1501. In an embodiment the second wafer bond layer 1503 may be formed from similar materials and in a similar fashion as the first wafer bond layer 121 as described above with respect to FIG. 1A. For example, the first wafer bond layer 121 may be a bonding material such as silicon oxide that is deposited using a deposition process such as CVD. However, any suitable material and method of manufacture may be utilized.

Once the second wafer bond layer 1503 has been formed, the second conductive wafer bond material 1505 may be formed within the second wafer bond layer 1503. In an embodiment the second conductive wafer bond material 1505 may be formed from similar material and in a similar fashion as the first conductive wafer bond material 123 (described above with respect to FIG. 1A). For example, the second conductive wafer bond material 1505 may be formed by initially patterning the second wafer bond layer 1503 to form openings, and then filling and/or overfilling the openings with a material such as copper before removing excess material outside of the openings with a planarization process such as chemical mechanical polishing. However, any suitable material and method of manufacture may be utilized.

Figure 19B:
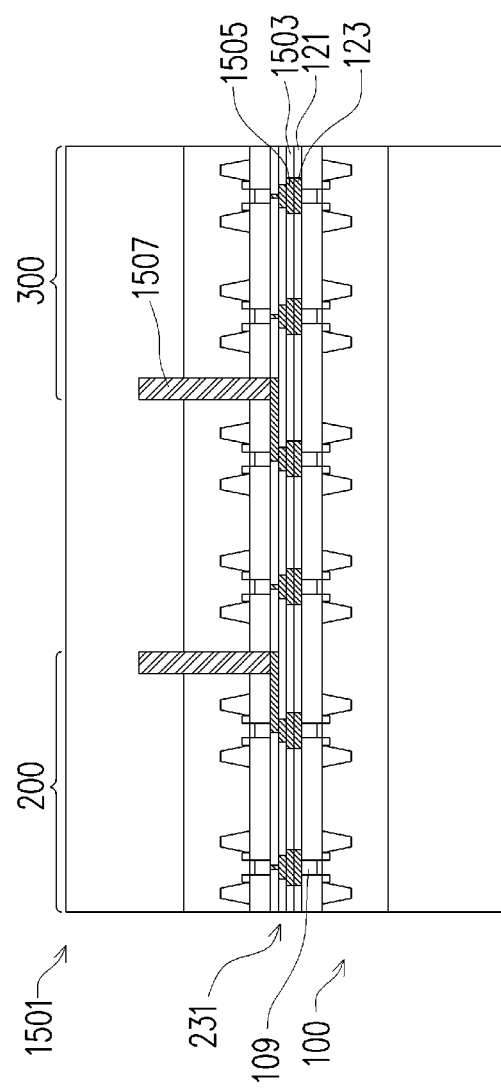

FIG. 19B illustrates that, once the second conductive wafer bond material 1505 has been formed, the second conductive wafer bond material 1505 and the second wafer bond layer 1503 may be bonded to the first conductive wafer bond material 123 and first wafer bond layer 121, respectively using, for example, a hybrid bond as described above with respect to FIG. 3. For example, the surfaces of the second wafer bond layer 1503 and the first wafer bond layer 121 may be activated and aligned together before being placed into physical contact with each other. Then, heat and pressure may be applied in order to strengthen the bonding and ensure that the second conductive wafer bond material 1505 is bonded to the first conductive wafer bond material 123. However, any suitable bonding process may be utilized.

Figure 19C:
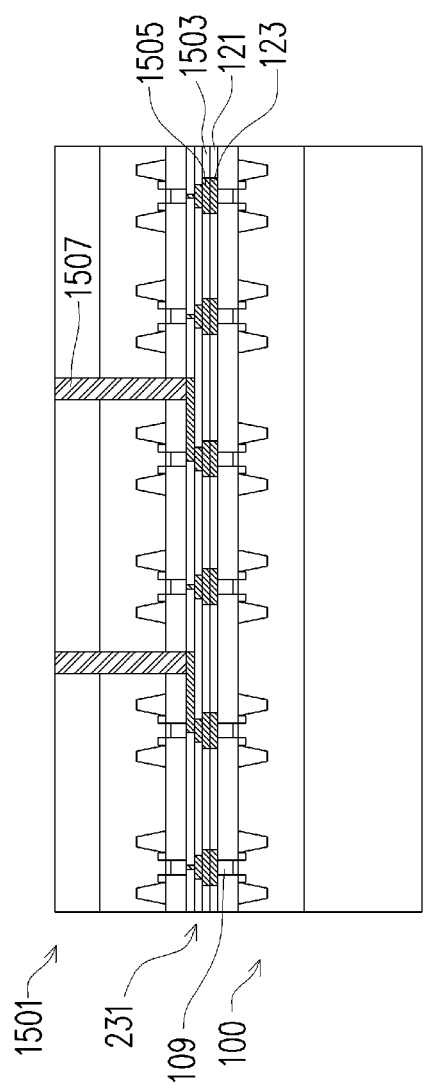

FIG. 19C illustrates a thinning of the second substrate of the second wafer 1501 in order to expose the second through substrate vias 1507. In an embodiment the second wafer 1501 may be thinned using a planarization process such as chemical mechanical planarization. However, any other suitable planarization process, such as grinding or even a series of one or more etches, may also be utilized.

Figure 19D:
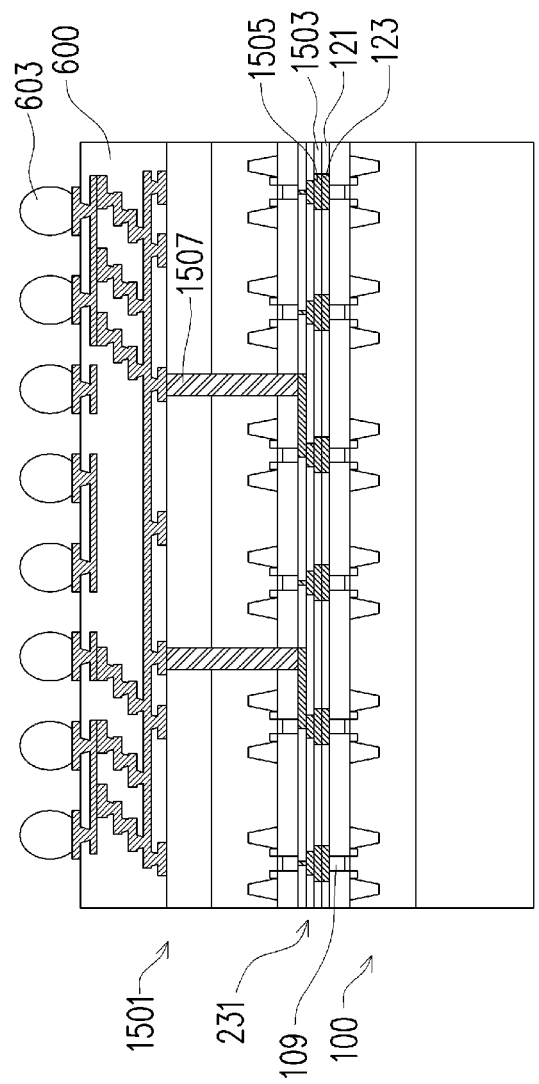

FIG. 19D illustrates that, once the second through substrate vias 1507 have been exposed, the first interconnect layer 600 may be formed over the backside of the second wafer 1501 and in electrical connection with the second through substrate vias 1507. In an embodiment the first interconnect layer 600 may be formed as described above with respect to FIG. 6. However, the first interconnect layer 600 may be formed using any suitable materials and processes.

FIG. 19D additionally illustrates the formation and/or placement of the first external connections 603 in connection with the first interconnect layer 600. In an embodiment the first external connections 603 may be formed as described above with respect to FIG. 6. However, any suitable material and method of manufacture may be utilized.

Figure 19F:
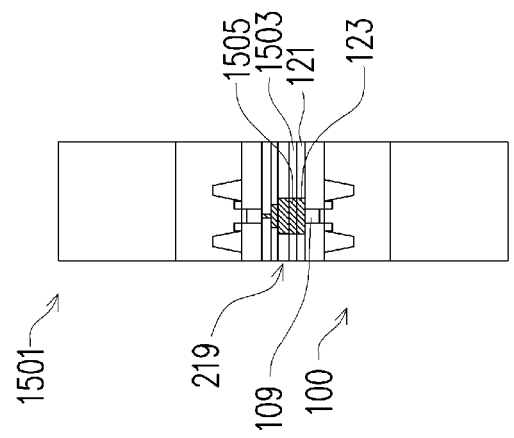
Figure 19E:
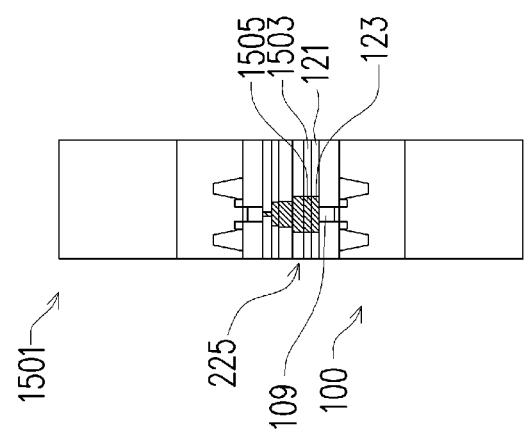

FIG. 19E illustrates another embodiment in which a homogenous, wafer-to-wafer bond is formed between the first semiconductor device 100 and the second wafer 1501. In this embodiment, however, instead of the first wafer gate stack 109 being bonded to the first die interconnection structure 231 (as described above with respect to FIGS. 19A-19D), the first wafer gate stack 109 is bonded to the top die interconnection structure 225. For example, as illustrated in FIG. 19E, the first wafer gate stack 109 (on the first semiconductor device 100) is bonded to the top die interconnection structure 225 (on the second wafer 1501). For example, the first wafer bond layer 121 (and its associated first conductive wafer bond material 123) may be formed on the first wafer gate stack 109 and the second wafer bond layer 1503 (and its associated second conductive wafer bond material 1505) may be formed on the top die interconnection structure 225.

Once the first wafer bond layer 121 and the second wafer bond layer 1503 have been formed, the first wafer gate stack 109 and the top die interconnection structure 225 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 19E, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

FIG. 19F illustrates another embodiment in which a homogenous, wafer-to-wafer bond is formed between the first semiconductor device 100 and the second wafer 1501. In this embodiment, however, instead of the first semiconductor device 100 being bonded to the first die interconnection structure 231 (as described above with respect to FIGS.

19A-19D), the first semiconductor device 100 is bonded to the middle die interconnection structure 219. For example, as illustrated in FIG. 19F, the middle die interconnection structure 219 (on the second wafer 1501) is bonded to the first wafer gate stack 109 (on the first semiconductor device 100). For example, the first wafer bond layer 121 (and its associated first conductive wafer bond material 123) may be formed on the first wafer gate stack 109 and the second wafer bond layer 1503 (and its associated second conductive wafer bond material 1505) may be formed on the middle die interconnection structure 219.

Once the first wafer bond layer 121 and the second wafer bond layer 1503 have been formed, the middle die interconnection structure 219 and the first wafer gate stack 109 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 19F, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

FIG. 19G illustrates another embodiment in which a homogenous, wafer-to-wafer bond is formed between the first semiconductor device 100 and the second wafer 1501. In this embodiment, however, instead of the first semiconductor device 100 being bonded to the first die interconnection structure 231 (as described above with respect to FIGS. 19A-19D), the first semiconductor device 100 is bonded to the first die gate contact 213. For example, as illustrated in FIG. 19G, the first die gate contact 213 (on the second wafer 1501) is bonded to the first wafer gate stack 109 (on the first semiconductor device 100). For example, the first wafer bond layer 121 (and its associated first conductive wafer bond material 123) may be formed on the first wafer gate stack 109 and the second wafer bond layer 1503 (and its associated second conductive wafer bond material 1505) may be formed on the first die gate contact 213.

Once the first wafer bond layer 121 and the second wafer bond layer 1503 have been formed, the first die gate contact 213 and the first wafer gate stack 109 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 19G, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

FIG. 19H illustrates another embodiment in which a homogenous, wafer-to-wafer bond is formed between the first semiconductor device 100 and the second wafer 1501. In this embodiment, however, instead of the first semiconductor device 100 being bonded to the first die interconnection structure 231 (as described above with respect to FIGS. 19A-19D), the first semiconductor device 100 is bonded to the first die gate stack 207. For example, as illustrated in FIG. 19H, the first die gate stack 207 (on the second wafer 1501) is bonded to the first wafer gate stack 109 (on the first semiconductor device 100). For example, the first wafer bond layer 121 (and its associated first conductive wafer bond material 123) may be formed on the first wafer gate stack 109 and the second wafer bond layer 1503 (and its associated second conductive wafer bond material 1505) may be formed on the first die gate stack 207.

Once the first wafer bond layer 121 and the second wafer bond layer 1503 have been formed, the first die gate stack 207 and the first wafer gate stack 109 are bonded together with the first wafer bond layer 121 and the second wafer bond layer 1503 using, e.g., a hybrid bond. In an embodiment the first wafer bond layer 121 and the second wafer bond layer 1503 may both be activated, aligned with each other, and placed into physical contact. Heat and pressure may then be applied as described above in order to strengthen the bond and ensure that the first conductive wafer bond material 123 and the second conductive wafer bond material 1505 are bonded as well. However, any suitable bonding process may be utilized.

Additionally, while not explicitly illustrated in FIG. 19H, once the first semiconductor device 100 and the second wafer 1501 have been bonded together, additional processing may be performed. For example, the second wafer 1501 may be thinned in order to expose the second through substrate vias 1507, the first interconnect layer 600 may be formed in connection with the second through substrate vias 1507, and the first external connections 603 may be formed in connection with the first interconnect layer 600.

By bonding the wafers and dies as described in the above embodiments, further integration of the chips can be achieved at the device level, the metal gate level, or the metallization layers. As such, there is no need to wait for finished and tested good chips in order to integrate the devices. Such options allow for a shorter routing paths that lead to quicker electrically signals, and greater integration flexibility, especially in embodiments that are used for chip on wafer (CoW) technologies.

Figure 20A:
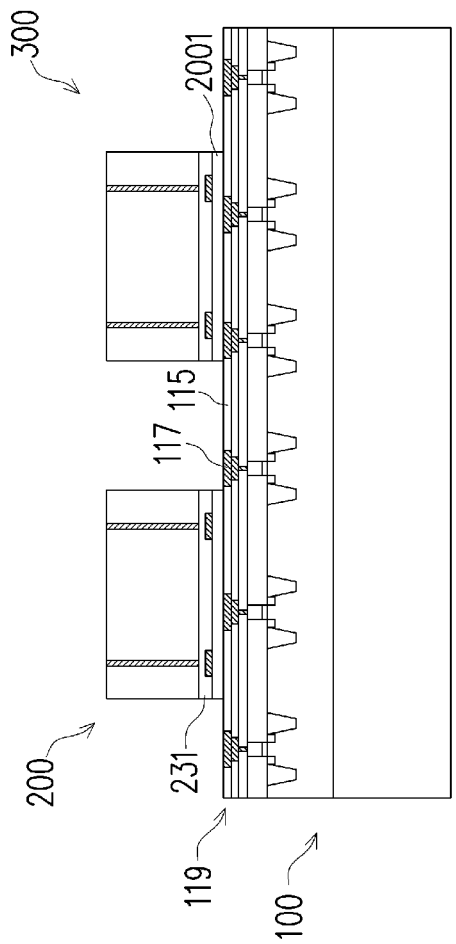
FIG. 20A-20B illustrate a fusion bonding process in accordance with some embodiments.

FIG. 20 illustrates another embodiment in which the second semiconductor device 200 and the third semiconductor device 300 are bonded to the first semiconductor device 100 using a fusion bonding process. In this embodiment the first semiconductor device 100 may be formed to have the first wafer interconnection structure 119, but not the middle wafer interconnection structures 1101 or the top wafer interconnection structures 1201. However, in other embodiments the second semiconductor device 200 and the third semiconductor device 300 may be bonded to the middle wafer interconnection structures 1101 or the top wafer interconnection structures 1201.

Additionally, the second semiconductor device 200 and the third semiconductor device 300 may be formed with the first die interconnection structure 231. Additionally, however, in order to bond with a fusion bonding process, a third bonding layer 2001 may be formed over the first die interconnection structure 231. In an embodiment the third bonding layer 2001 may be formed of similar materials and using similar processes as the first wafer bonding layer 121 (described above with respect to FIG. 1). For example the third bonding layer 2001 may be formed of an oxide using a chemical vapor deposition process. However, any suitable material and method of deposition may be utilized.

Once the third bonding layer 2001 has been formed, the third bonding layer 2001 may be bonded to the first wafer interconnection structure 119 using, e.g., a fusion bonding process instead of a hybrid bonding process. For example, both the third bonding layer 2001 and the second wafer dielectric layer 115 may be activated as described above with respect to FIG. 3. Once activated, the third bonding layer 2001 and the second wafer dielectric layer 115 are placed into physical contact with each other to initiate the bonding process, with the third bonding layer 2001 covering one or more of the first wafer metal lines 117 within the first wafer interconnection structure 119.

Once the fusion bonding process has been initiated, heat may be applied to the third bonding layer 2001 and the first wafer metallization 119 in order to help strengthen the bond. In an embodiment the third bonding layer 2001 and the first wafer interconnection structure 119 may be heated to a temperature of between about 300° C. and about 400° C., such as about 350° C. However, any suitable temperature may be utilized.

Figure 20B:
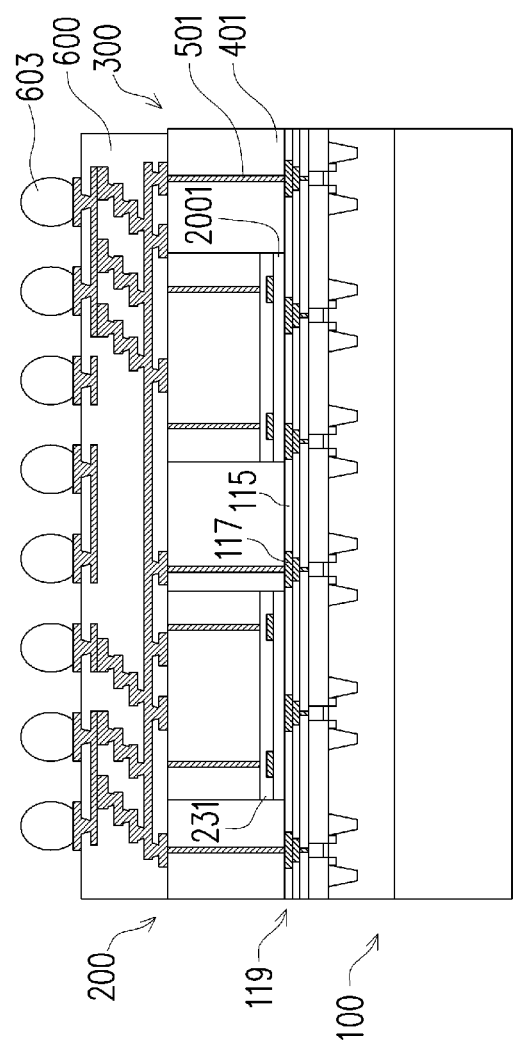

FIG. 20B illustrates that, once the second semiconductor device 200 and the third semiconductor device 300 have been fusion bonded, the fill material 401 may be deposited and planarized, the first through fill vias 501 may be formed, the first interconnect layer 600 may be formed, and the first external connections 603 may be formed or placed. In this embodiment, the first interconnect layer 600 and the first through fill vias 501 are utilized to connect the second semiconductor device 200 and the third semiconductor device 300 to both the first external connections 603 as well as the first semiconductor device 100.

In an embodiment, a method of manufacturing a semiconductor device includes: forming a first metallization layer over a first semiconductor substrate utilizing either a first damascene or a first dual damascene process; applying a first bonding layer in physical contact with the first metallization layer; forming a second metallization layer over a second semiconductor substrate utilizing either a second damascene or a second dual damascene process; and bonding the second metallization layer to the first bonding layer. In an embodiment the first metallization layer is in physical contact with a first gate contact. In an embodiment the first metallization layer is adjacent to a third metallization layer that is in physical contact with a first gate contact. In an embodiment the first metallization layer is separated from the first semiconductor substrate by at least two metallization layers different from the first metallization layer. In an embodiment the second metallization layer is in physical contact with a second gate contact. In an embodiment the second metallization layer is adjacent to a third metallization layer that is in physical contact with a second gate contact. In an embodiment the second metallization layer is separated from the second semiconductor substrate by at least two metallization layers different from the second metallization layer.

In another embodiment, a method of manufacturing a semiconductor device includes: depositing a first bonding dielectric layer in physical contact with one of either a gate electrode or a gate electrode contact; embedding a first conductive bonding material through the first bonding dielectric layer and in physical contact with the one of either the gate electrode or the gate electrode contact; and bonding a conductive material of a first semiconductor die directly to the first conductive bonding material. In an embodiment, the depositing the first bonding dielectric layer deposits the first bonding dielectric layer in physical contact with the gate electrode. In an embodiment, the depositing the first bonding dielectric layer deposits the first bonding dielectric layer in physical contact with the gate electrode contact. In an embodiment, the method further includes depositing a fill material adjacent to the first semiconductor die after the bonding the conductive material. In an embodiment the method further includes forming through fill vias to extend from a first side of the fill material to a second side of the fill material. In an embodiment the method further includes: depositing a first interconnect dielectric layer over the first semiconductor die and the fill material; and embedding a first interconnect conductive material into the first interconnect dielectric layer using one of either a damascene process or a dual damascene process. In an embodiment the method further includes: bonding a second semiconductor die to the first semiconductor die on an opposite side of the first semiconductor die from the first bonding dielectric layer; depositing a second fill material adjacent to the second semiconductor die; and forming second through fill vias to extend from a first side of the second fill material to a second side of the second fill material.

In yet another embodiment a method of manufacturing a semiconductor device includes: depositing a first bonding dielectric layer over a first semiconductor wafer and in physical contact with one of a first gate stack, a first gate electrode contact, a first metallization layer in physical contact with the first gate electrode contact, or a second metallization layer adjacent to the first metallization layer; embedding a first bonding conductor into the first bonding dielectric layer; depositing a second bonding dielectric layer over a second semiconductor wafer different from the first semiconductor wafer and in physical contact with one of a second gate stack, a second gate electrode contact, a third metallization layer in physical contact with the second gate electrode contact, or a fourth metallization layer adjacent to the second metallization layer; embedding a second bonding conductor into the second bonding dielectric layer; activating the first bonding dielectric layer and the second bonding dielectric layer; and contacting the first bonding dielectric layer and the second bonding dielectric layer. In an embodiment the depositing the first bonding dielectric layer is deposited in physical contact with the first gate stack. In an embodiment the depositing the first bonding dielectric layer is deposited in physical contact with the first gate electrode contact. In an embodiment the depositing the first bonding dielectric layer is deposited in physical contact with the first metallization layer. In an embodiment the depositing the first bonding dielectric layer is deposited in physical contact with the second metallization layer. In an embodiment the method further includes thinning the second semiconductor wafer to expose through substrate vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first interconnection structure adjacent to a first semiconductor substrate, wherein the first interconnection structure is in electrical contact with a first gate contact through at least a second interconnection structure, wherein the second interconnection structure is adjacent to a second semiconductor substrate, and wherein the second interconnect structure is bonded to a first bonding layer;
a first dielectric layer over the first interconnection structure;
an encapsulant encapsulating the second interconnection structure; and
a third interconnection structure located on an opposite side of the encapsulant from the first interconnection structure, wherein the third interconnection structure is in electrical connection with both the first interconnection structure and the second interconnection structure.

2. The semiconductor device of claim 1, further comprising a fourth interconnection structure adjacent to a third semiconductor substrate, the fourth interconnection structure bonded to the first bonding layer.

3. The semiconductor device of claim 2, wherein the encapsulant encapsulates the fourth interconnection structure.

4. The semiconductor device of claim 1, further comprising a through via extending through the encapsulant.

5. The semiconductor device of claim 1, further comprising a through via extending through the second semiconductor substrate.

6. The semiconductor device of claim 5, wherein the through via is electrically connected to the third interconnection structure.

7. The semiconductor device of claim 1, wherein the encapsulant has a height of between about 500 nm and about 1000 nm.

8. A semiconductor device comprising:
a first dielectric layer over a first semiconductor substrate;
a first metallization layer in physical contact with a gate electrode or a gate contact adjacent a second semiconductor substrate;
a second metallization layer on an opposite side of the first metallization layer from the second semiconductor substrate;
a second dielectric layer on an opposite side of the second metallization layer from the first metallization layer;
an encapsulant surrounding the second semiconductor substrate, the second metallization layer, and the second dielectric layer; and
an interconnection structure on an opposite side of the encapsulant from the first dielectric layer, the interconnection structure electrically connected to the second metallization layer.

9. The semiconductor device of claim 8, further comprising through vias extending from a first side of the encapsulant to a second side of the encapsulant.

10. The semiconductor device of claim 9, wherein the through vias electrically connect the interconnection structure with a conductive element within the first dielectric layer.

11. The semiconductor device of claim 8, further comprising a third semiconductor substrate separated from the second semiconductor substrate, wherein the encapsulant surrounds the third semiconductor substrate.

12. The semiconductor device of claim 8, further comprising through vias extending through the second semiconductor substrate.

13. The semiconductor device of claim 12, wherein the through vias are in electric connection with the interconnection structure.

14. The semiconductor device of claim 8, wherein the first dielectric layer is bonded to the second dielectric layer.

15. A semiconductor device comprising:
a bonded dielectric layer over a semiconductor substrate;
a first metallization layer located between the bonded dielectric layer and the semiconductor substrate, wherein the first metallization layer is connected to the semiconductor substrate through a second metallization layer;
an encapsulant located on an opposite side of the bonded dielectric layer from the first metallization layer;
a through via extending through the encapsulant from a first side of the encapsulant to a second side of the encapsulant;
a semiconductor die embedded within the encapsulant; and
a second through via extending through a semiconductor substrate of the semiconductor die.

16. The semiconductor device of claim 15, further comprising an interconnection structure on an opposite side of the encapsulant from the bonded dielectric layer.

17. The semiconductor device of claim 16, further comprising external connections located on an opposite side of the interconnection structure from the encapsulant.

18. The semiconductor device of claim 15, wherein the encapsulant has a height of between about 500 nm and about 1000 nm.

19. The semiconductor device of claim 15, further comprising a second semiconductor die embedded within the encapsulant.

20. The semiconductor device of claim 19, further comprising a third through via extending through a second semiconductor substrate of the second semiconductor die.

\* \* \* \* \*